United States Patent
Cui et al.

(10) Patent No.: US 11,515,326 B2
(45) Date of Patent: Nov. 29, 2022

(54) THREE-DIMENSIONAL MEMORY DEVICE INCLUDING LATERALLY-UNDULATING MEMORY MATERIAL LAYERS AND METHODS FOR FORMING THE SAME

(71) Applicant: SANDISK TECHNOLOGIES LLC, Addison, TX (US)

(72) Inventors: Zhixin Cui, Nagoya (JP); Tatsuya Hinoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/192,668

(22) Filed: Mar. 4, 2021

(65) Prior Publication Data
US 2022/0285388 A1    Sep. 8, 2022

(51) Int. Cl.
| H01L 27/11582 | (2017.01) |
| H01L 27/11519 | (2017.01) |
| H01L 27/11556 | (2017.01) |
| H01L 27/1157 | (2017.01) |
| H01L 27/11524 | (2017.01) |
| H01L 27/11565 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC .......................................... H01L 27/115–11597
See application file for complete search history.

(56) References Cited

U.S. PATENT DOCUMENTS

| 8,658,499 B2 | 2/2014 | Makala et al. |
| 9,252,151 B2 | 2/2016 | Chien et al. |
| 9,356,031 B2 | 5/2016 | Lee et al. |
| 9,397,093 B2 | 7/2016 | Makala et al. |
| 9,419,012 B1 | 8/2016 | Shimabukuro et al. |
| 9,553,146 B2 | 1/2017 | Zhang et al. |
| 9,576,975 B2 | 2/2017 | Zhang et al. |

(Continued)

OTHER PUBLICATIONS

Notification of Transmittal of the International Search Report and the Written Opinion of the International Searching Authority for International Patent Application No. PCTUS2021/035618, dated Aug. 30, 2021, 12 pages.

(Continued)

*Primary Examiner* — Allen L Parker
*Assistant Examiner* — Gustavo G Ramallo
(74) *Attorney, Agent, or Firm* — The Marbury Law Group PLLC

(57) ABSTRACT

A memory device includes an alternating stack of insulating layers and electrically conductive layers located over a substrate, a memory opening vertically extending through the alternating stack, and a memory opening fill structure located in the memory opening and including a vertical semiconductor channel and a memory material layer. A vertical stack of insulating material portions can be provided at levels of the insulating layers to provide a laterally-undulating profile to the memory material layer. Alternatively, a combination of inner insulating spacers and outer insulating spacers can be employed to provide a laterally-undulating profile to the memory material layer.

12 Claims, 48 Drawing Sheets

(56) References Cited

U.S. PATENT DOCUMENTS

| | | | |
|---|---|---|---|
| 9,613,977 | B2 | 4/2017 | Sharangpani et al. |
| 9,659,955 | B1 | 5/2017 | Sharangpani et al. |
| 9,659,956 | B1 | 5/2017 | Pachamuthu et al. |
| 9,691,884 | B2 | 6/2017 | Makala et al. |
| 9,716,105 | B1 | 7/2017 | Tsutsumi |
| 9,875,929 | B1 | 1/2018 | Shukla et al. |
| 10,181,442 | B1* | 1/2019 | Watanabe ......... H01L 27/11565 |
| 10,283,513 | B1 | 5/2019 | Zhou et al. |
| 10,373,969 | B2 | 8/2019 | Zhang et al. |
| 10,438,964 | B2 | 10/2019 | Makala et al. |
| 10,516,025 | B1 | 12/2019 | Nishikawa et al. |
| 10,763,271 | B2 | 9/2020 | Rabkin et al. |
| 10,804,282 | B2 | 10/2020 | Baraskar et al. |
| 11,257,841 | B2* | 2/2022 | Kang ................. H01L 29/7926 |
| 2009/0321813 | A1 | 12/2009 | Kidoh et al. |
| 2014/0225181 | A1 | 8/2014 | Makala et al. |
| 2015/0111352 | A1* | 4/2015 | Lee ................... H01L 29/66666 438/268 |
| 2016/0043093 | A1 | 2/2016 | Lee et al. |
| 2016/0379989 | A1 | 12/2016 | Sharangpani et al. |
| 2017/0125436 | A1 | 5/2017 | Sharangpani et al. |
| 2018/0040627 | A1* | 2/2018 | Kanakamedala ............................ H01L 27/11573 |
| 2018/0374866 | A1 | 12/2018 | Makala et al. |
| 2019/0139973 | A1 | 5/2019 | Zhou et al. |
| 2019/0214395 | A1 | 7/2019 | Zhang et al. |
| 2019/0386108 | A1 | 12/2019 | Nishikawa et al. |
| 2020/0006364 | A1 | 1/2020 | Rabkin et al. |
| 2020/0006374 | A1 | 1/2020 | Rabkin et al. |
| 2020/0006375 | A1 | 1/2020 | Zhou et al. |
| 2020/0020524 | A1* | 1/2020 | Chang ............... H01L 27/10897 |
| 2020/0020715 | A1 | 1/2020 | Nakamura et al. |
| 2020/0091176 | A1* | 3/2020 | Yun .................... H01L 29/7926 |
| 2022/0085055 | A1* | 3/2022 | Geng ................ H01L 27/11582 |

OTHER PUBLICATIONS

Endoh et al., "Novel Ultra High Density Memory with a Stacked-Surrounding Gate Transistor (S-SGT) Structured Cell," IEDM Proc. (2001) pp. 33-36.

Mameli, A. et al., "Area-Selective Atomic Layer Deposition of $SiO_2$ Using Acetylacetone as a Chemoselective Inhibitor in an ABC-Type Cycle," ACS Nano, vol. 11, No. 9, pp. 9303-9311, (2017).

U.S. Appl. No. 16/582,262, filed Sep. 25, 2019, SanDisk Technologies LLC.

U.S. Appl. No. 16/794,536, filed Feb. 19, 2020, SanDisk Technologies LLC.

U.S. Appl. No. 16/794,563, filed Feb. 19, 2020, SanDisk Technologies LLC.

U.S. Appl. No. 16/849,600, filed Apr. 15, 2020, SanDisk Technologies LLC.

U.S. Appl. No. 16/849,664, filed Apr. 15, 2020, SanDisk Technologies LLC.

U.S. Appl. No. 17/001,003, filed Aug. 24, 2020, SanDisk Technologies LLC.

U.S. Appl. No. 17/090,420, filed Nov. 5, 2020, SanDisk Technologies LLC.

U.S. Appl. No. 17/169,987, filed Feb. 8, 2021, SanDisk Technologies LLC.

U.S. Appl. No. 17/189,153, filed Mar. 1, 2021, SanDisk Technologies LLC.

U.S. Appl. No. 16/801,456, filed Feb. 26, 2020, SanDisk Technologies LLC.

U.S. Appl. No. 16/877,328, filed May 18, 2020, SanDisk Technologies LLC.

U.S. Appl. No. 16/859,164, filed Apr. 27, 2020, SanDisk Technologies LLC.

U.S. Appl. No. 16/859,196, filed Apr. 27, 2020, SanDisk Technologies LLC.

U.S. Appl. No. 16/695,775, filed Nov. 26, 2019, SanDisk Technologies LLC.

U.S. Appl. No. 16/142,447, filed Sep. 26, 2018, SanDisk Technologies LLC.

U.S. Appl. No. 16/423,500, filed May 28, 2019, SanDisk Technologies LLC.

Kim, J. Y. et al., "Origin of low dielectric constant of carbon-incorporated silicon oxide film deposited by plasma enhanced chemical vapor deposition," Journal of Applied Physics, vol. 90, No. 5, pp. 2469-2473 (2001).

* cited by examiner

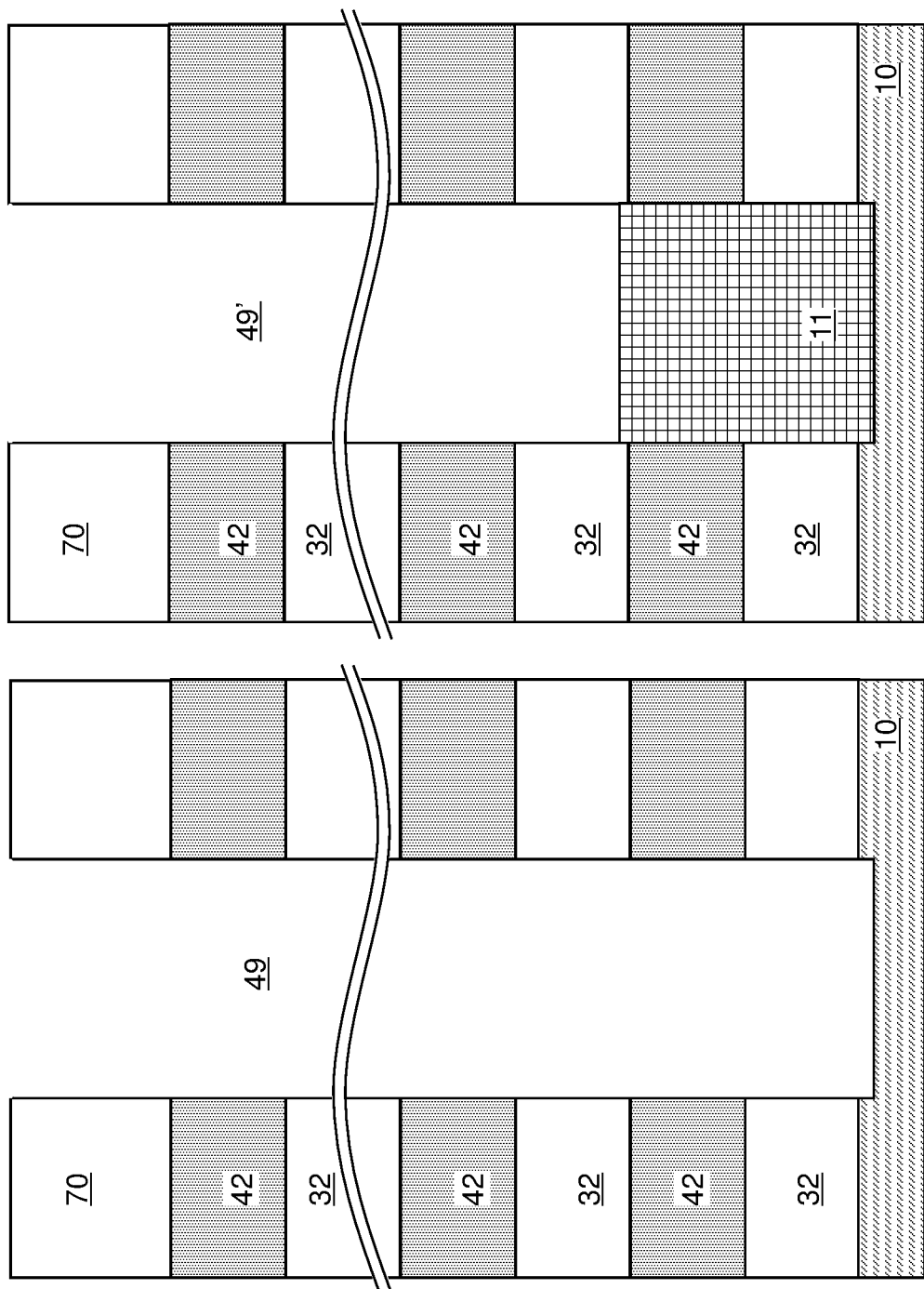

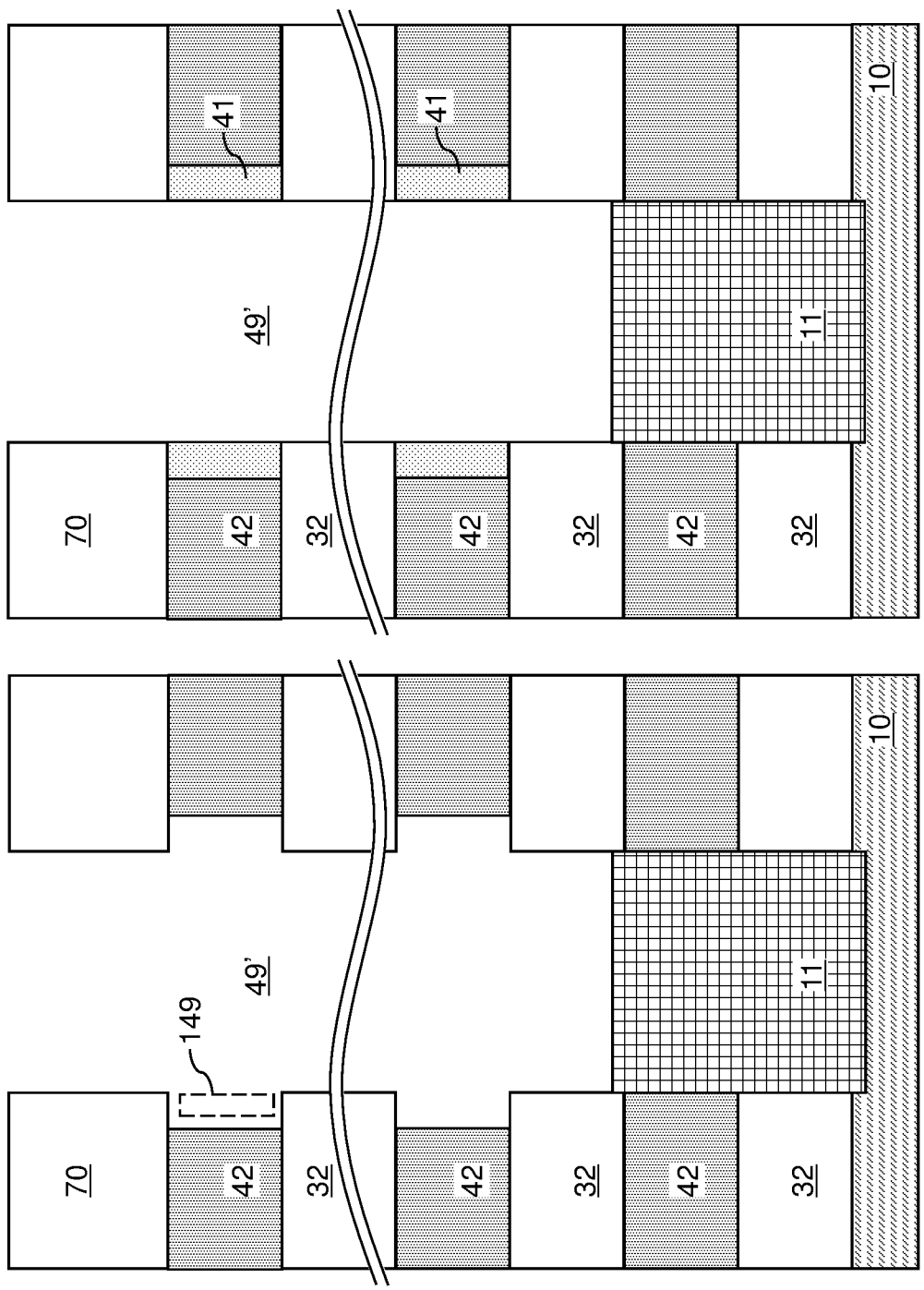

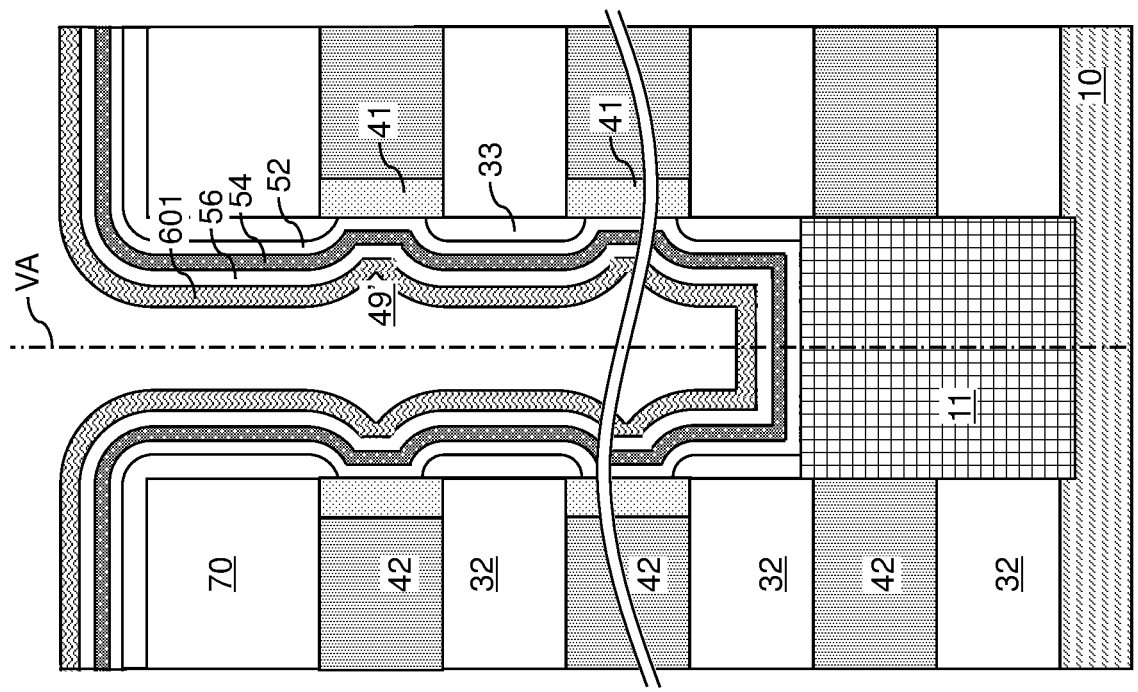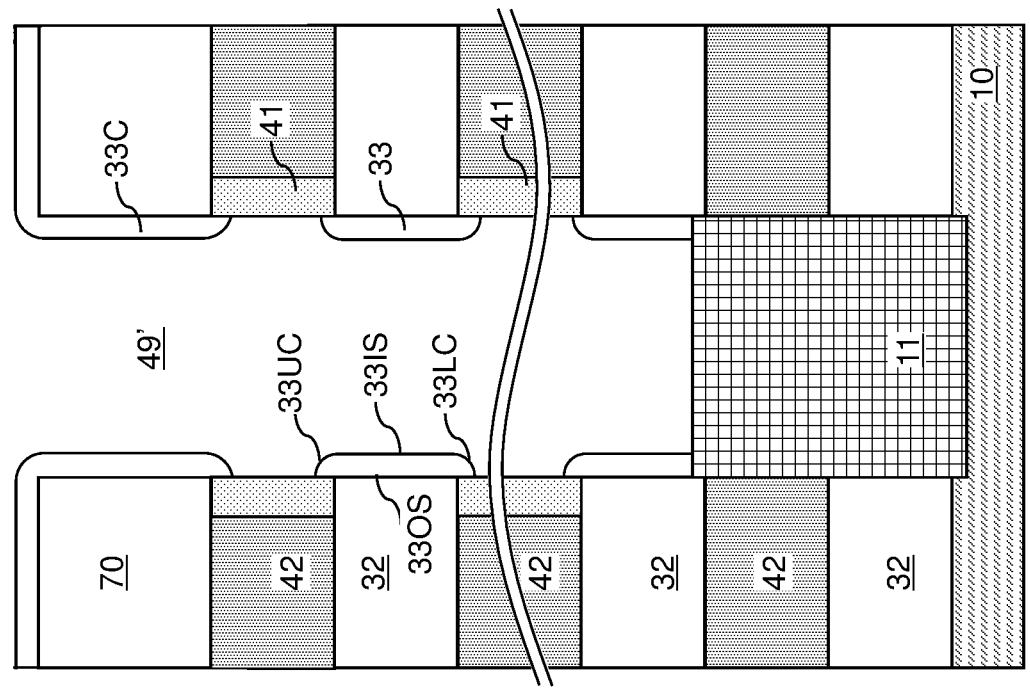
FIG. 5F
FIG. 5E

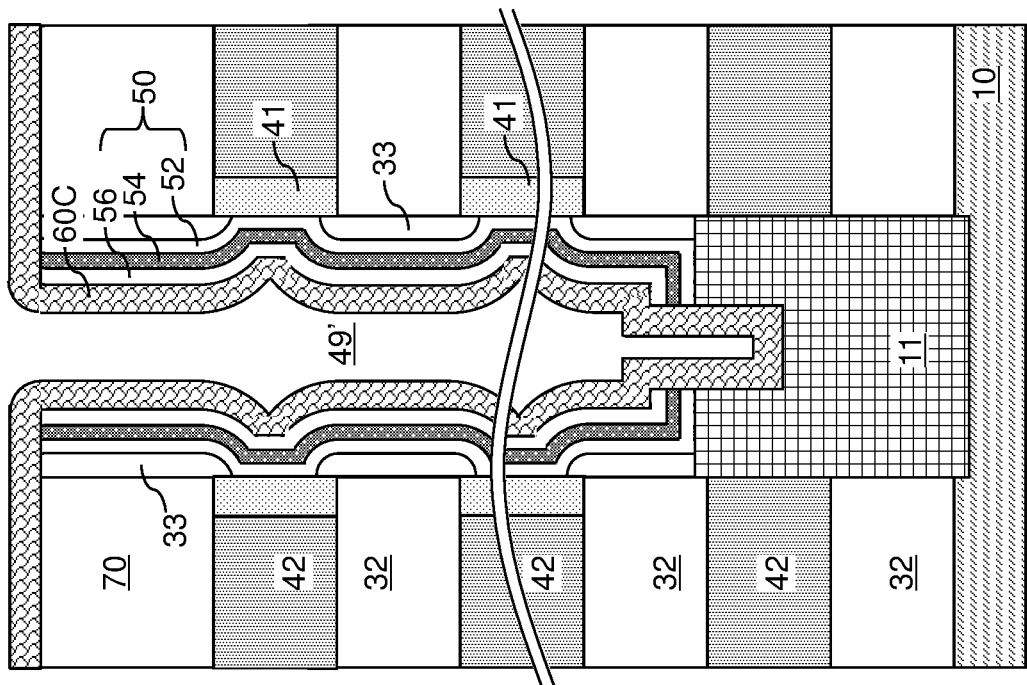
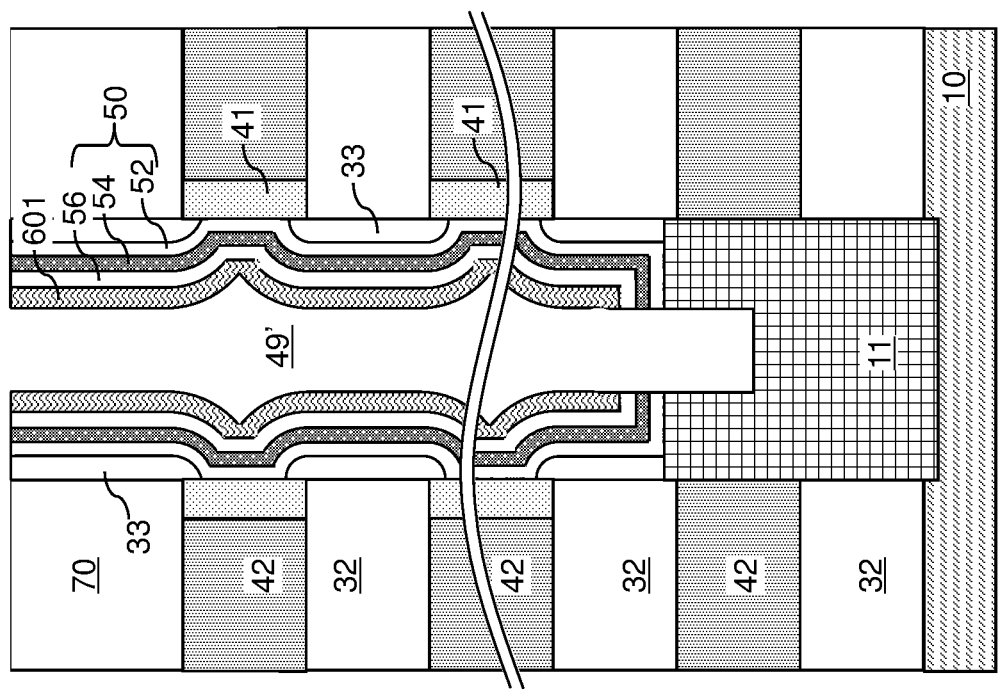
FIG. 5H
FIG. 5G

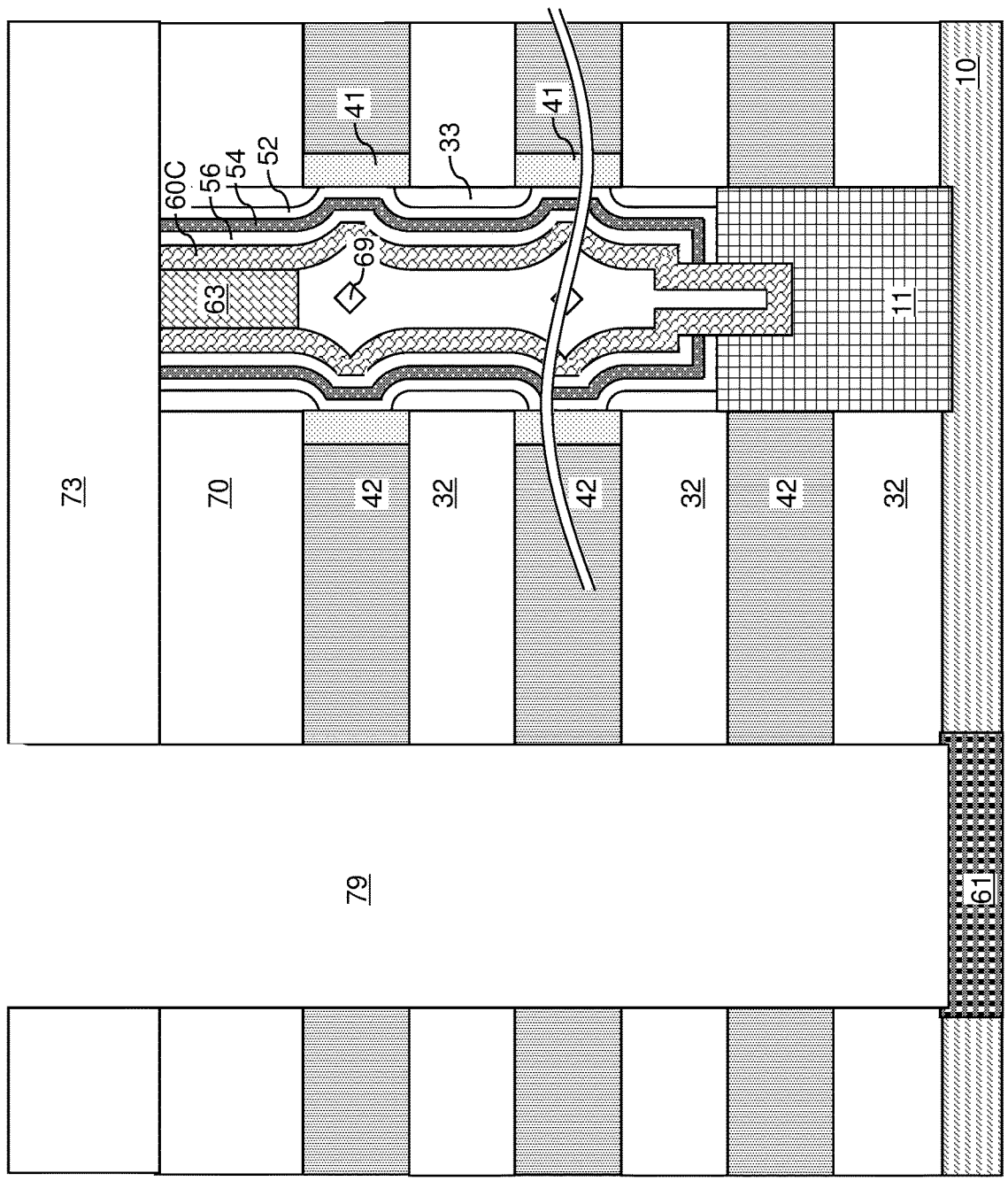

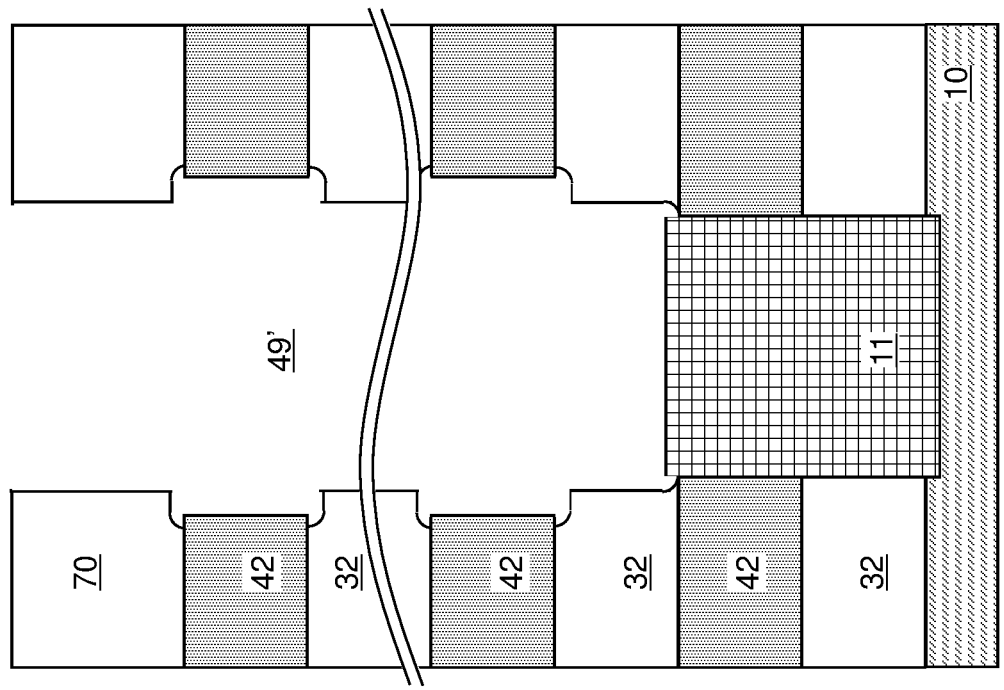
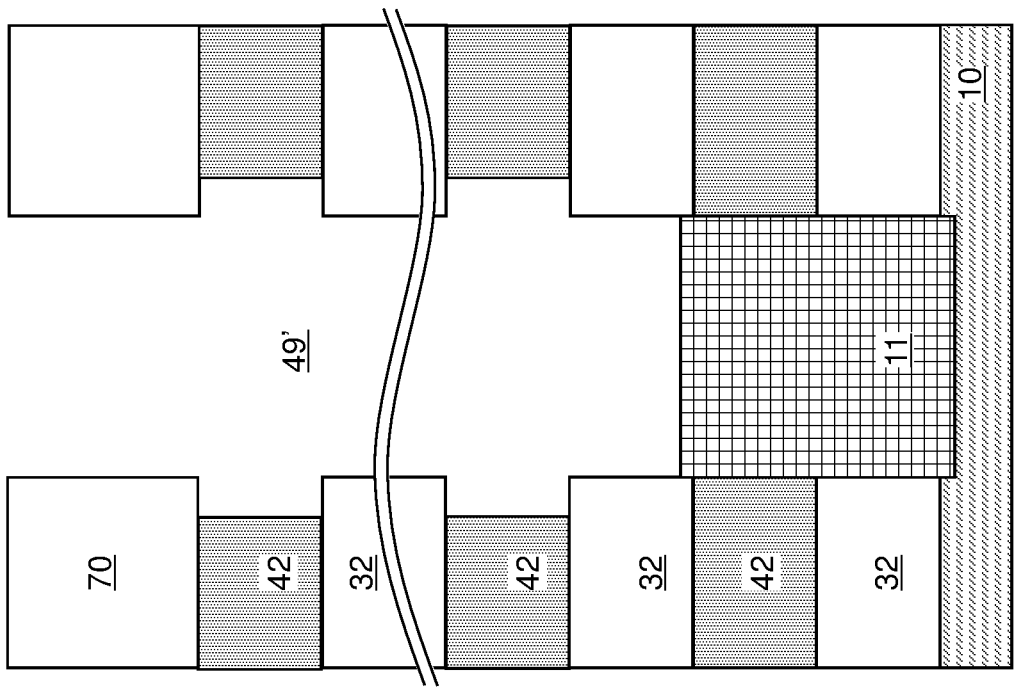

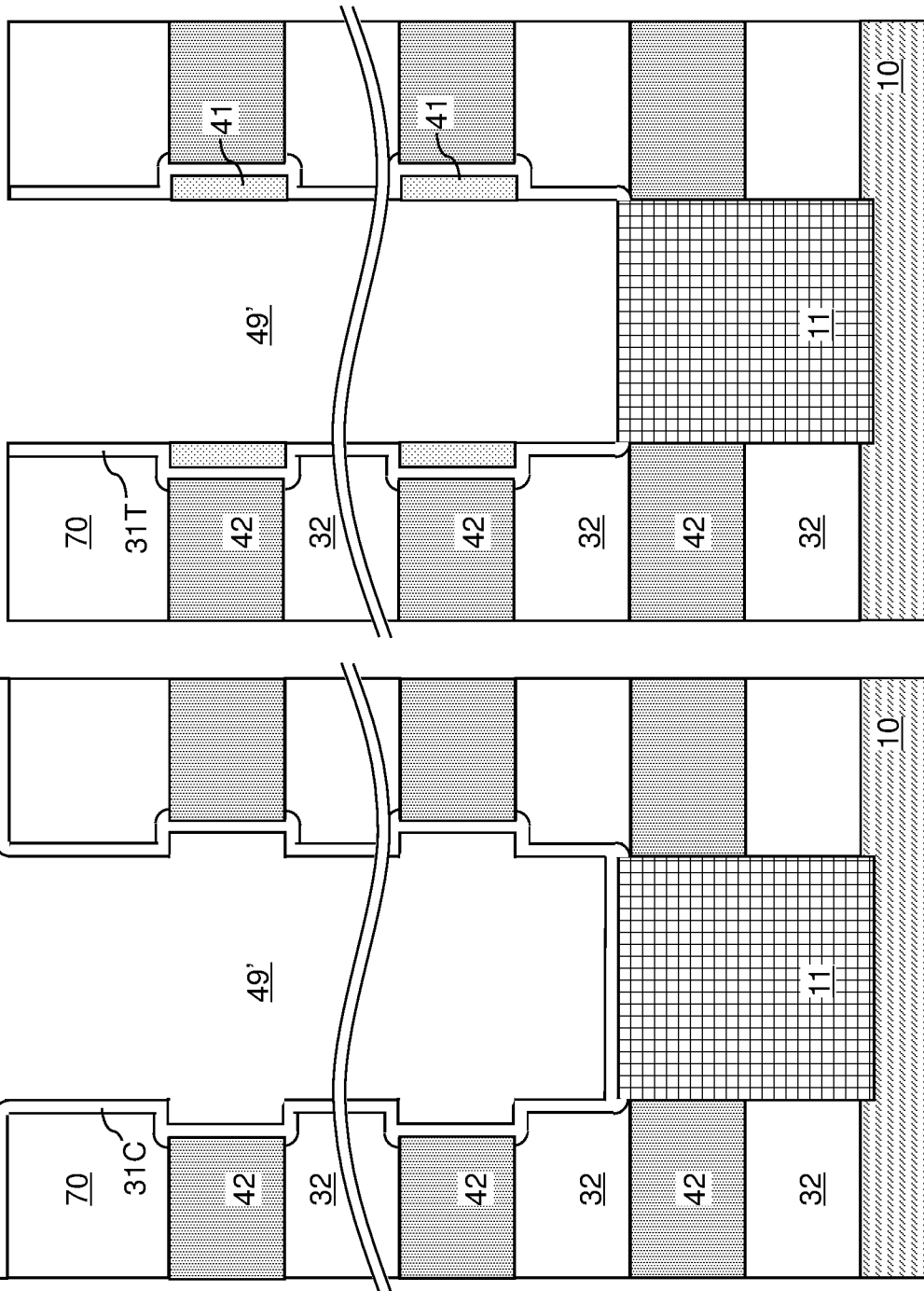

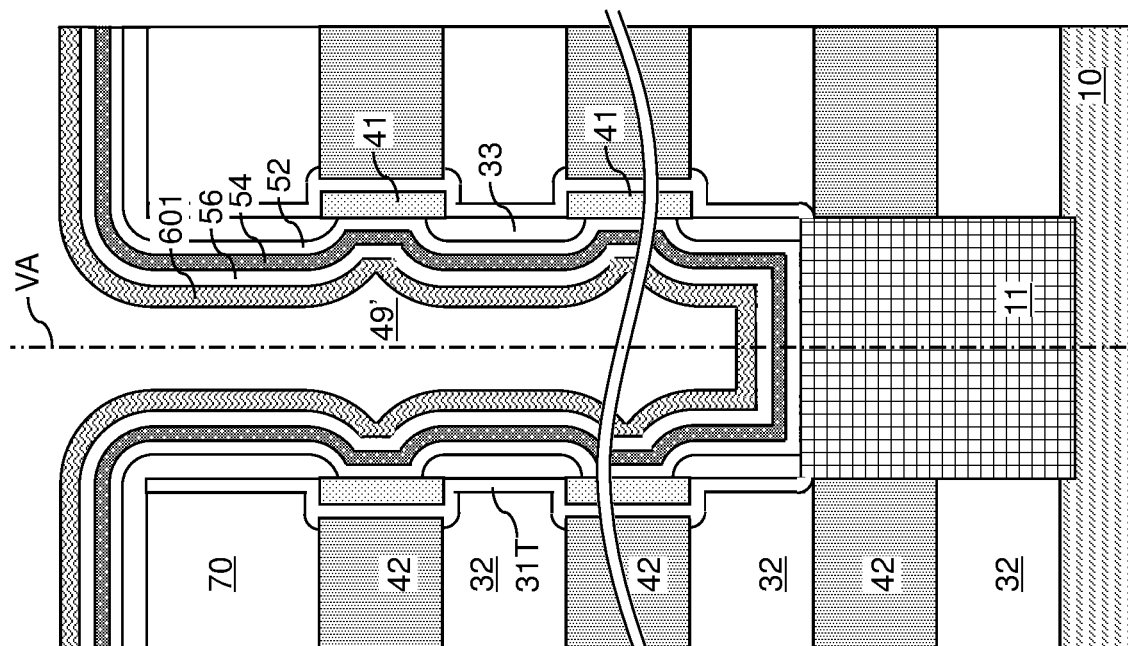
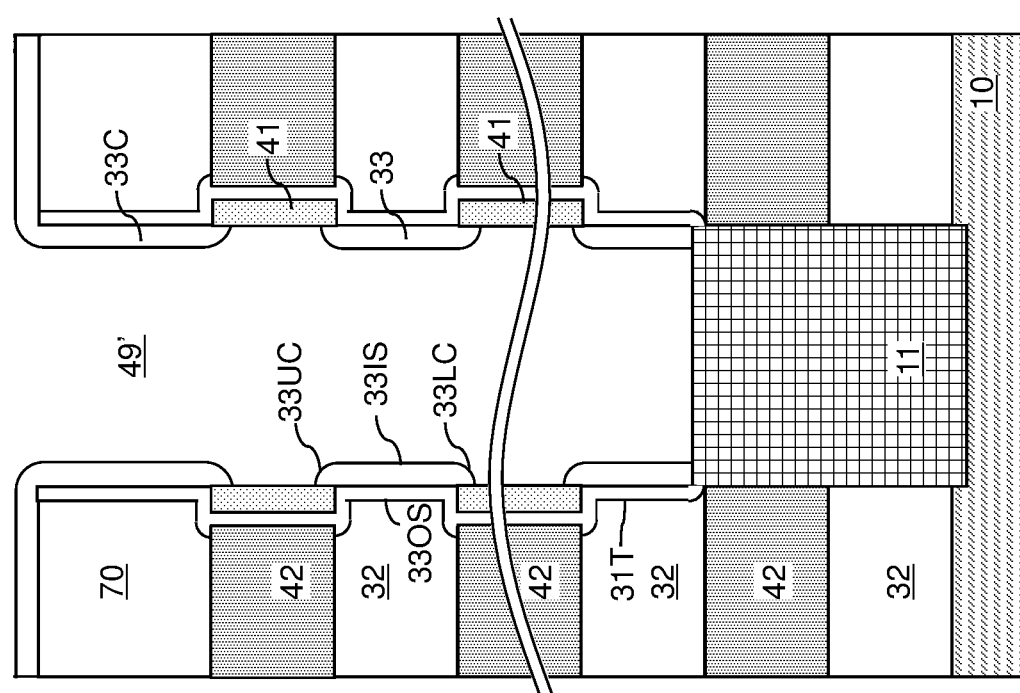
FIG. 13F
FIG. 13E

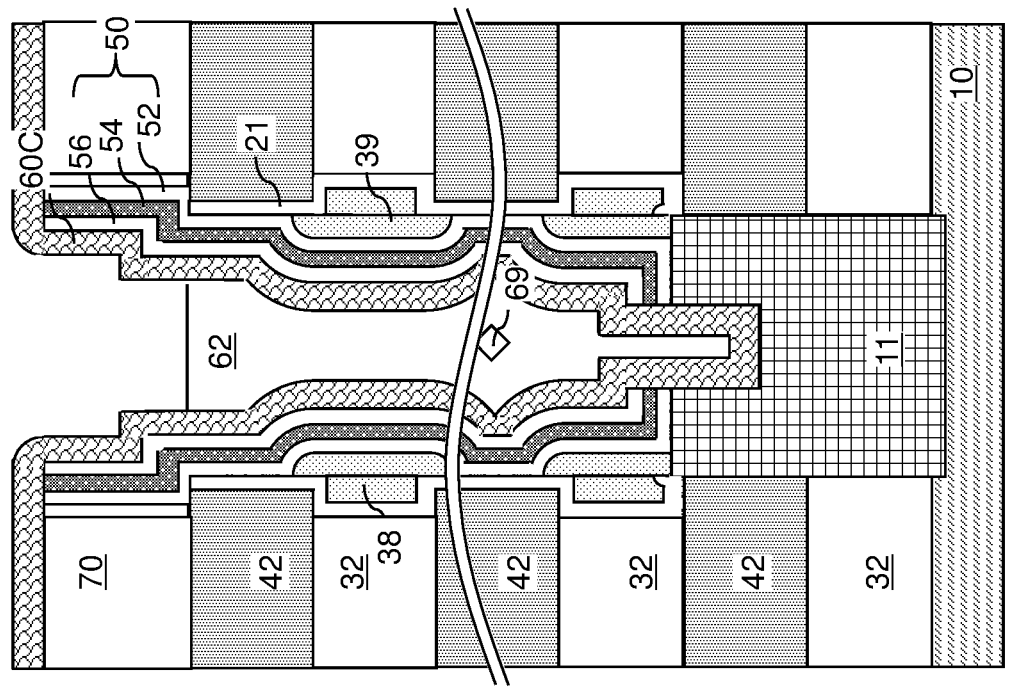
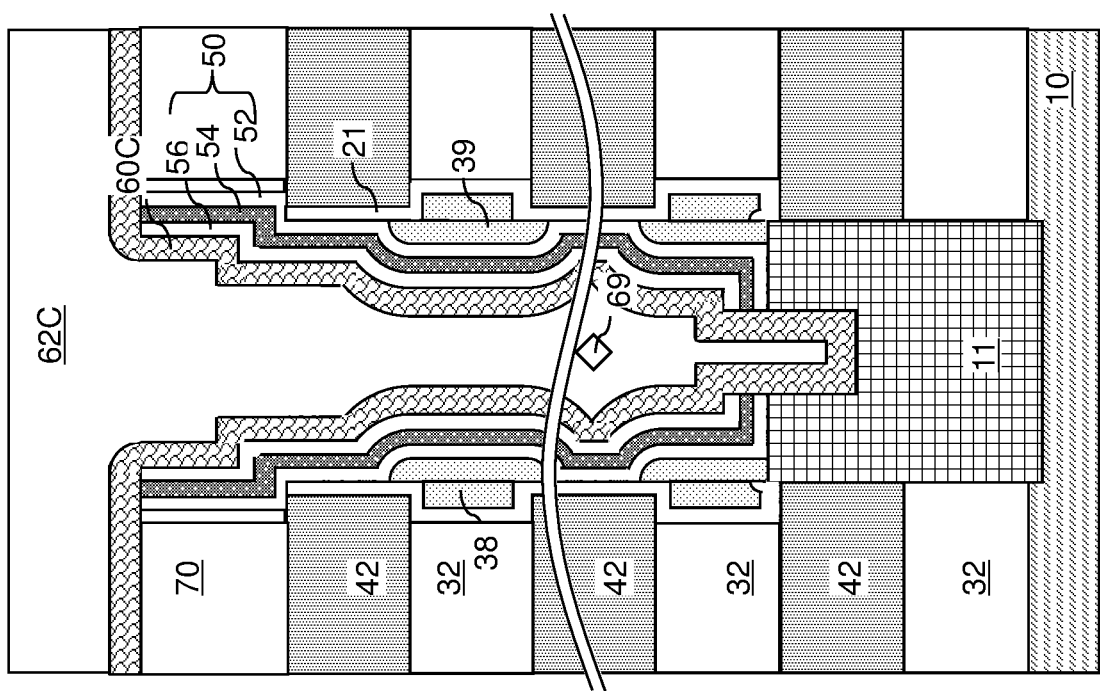

THREE-DIMENSIONAL MEMORY DEVICE INCLUDING LATERALLY-UNDULATING MEMORY MATERIAL LAYERS AND METHODS FOR FORMING THE SAME

FIELD

The present disclosure relates generally to the field of semiconductor devices, and particularly to a three-dimensional memory device including laterally undulating memory material layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers; a memory opening vertically extending through the alternating stack; and a memory opening fill structure located in the memory opening and comprising a vertical semiconductor channel, a memory material layer having a laterally-undulating vertical cross-sectional profile and laterally surrounding the vertical semiconductor channel, and a vertical stack of insulating material portions, wherein each insulating material portion within the vertical stack of insulating material portions which protrude from the insulating layers into the memory opening.

According to another aspect of the present disclosure, a method of forming a semiconductor structure is provided, which comprises: forming an alternating stack of sacrificial material layers and sacrificial material layers over a substrate; forming a memory opening through the alternating stack; forming lateral recesses at levels of the sacrificial material layers around the memory opening by laterally recessing the sacrificial material layers selective to the insulating layers around the memory opening; forming a vertical stack of dielectric metal oxide portions in the lateral recesses; forming a vertical stack of insulating material portions by selectively growing an insulating material at levels of sidewalls of the insulating layers within the memory opening while suppressing growth of the insulating material from physically exposed surfaces of the vertical stack of dielectric metal oxide portions; forming a memory opening fill structure in the memory opening, wherein the memory opening fill structure comprises the vertical stack of dielectric metal oxide portions, the vertical stack of insulating material portions, a memory material layer and a vertical semiconductor channel that are sequentially formed over the vertical stack of insulating material portions; and replacing the sacrificial material layers with electrically conductive layers.

According to yet another aspect of the present disclosure, a memory device comprises: an alternating stack of insulating layers and electrically conductive layers; a memory opening vertically extending through the alternating stack; and memory opening fill structures located in the memory opening and comprising a vertical semiconductor channel, a memory material layer laterally surrounding the vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers.

According to still another aspect of the present disclosure, a method of forming a memory device comprises: forming an alternating stack of insulating layers and sacrificial material layers over a substrate; forming memory openings through the vertical repetition; forming lateral recesses at levels of the insulating layers around the memory opening by laterally recessing the insulating layers selective to the sacrificial material layers around the memory opening; forming a silicon oxide liner on physically exposed surfaces of the alternating stack around the memory opening; forming a vertical stack of outer insulating spacers by depositing an outer insulating spacer material in unfilled volumes of the lateral recesses; forming a vertical stack of inner insulating spacers by selectively growing an inner insulating spacer material from physically exposed surfaces of the vertical stack of outer insulating spacers while suppressing growth of the inner insulating spacer material from physically exposed surfaces of the silicon oxide liner; forming a memory opening fill structure in the memory opening, wherein the memory opening fill structure comprises the silicon oxide liner, the vertical stack of outer insulating spacers, the vertical stack of inner insulating spacers, a memory material layer and a vertical semiconductor channel that are sequentially formed over the vertical stack of inner insulating spacers; and replacing the sacrificial material layers with electrically conductive layers.

BRIEF DESCRIPTION OF THE DRAWINGS

FIGS. 5A-5K are sequential schematic vertical cross-sectional views of a memory opening within the first exemplary structure during formation of a memory opening fill structure according to the first embodiment of the present disclosure.

FIG. 7C is a magnified view of a region of the first exemplary structure of FIG. 7A.

FIGS. 13A-13K are sequential schematic vertical cross-sectional views of a memory opening within a second exemplary structure during formation of a memory opening fill structure according to a second embodiment of the present disclosure.

FIGS. 19A-19M are sequential schematic vertical cross-sectional views of a memory opening within a third exemplary structure during formation of a memory opening fill structure according to a third embodiment of the present disclosure.

DETAILED DESCRIPTION

Figure 1:
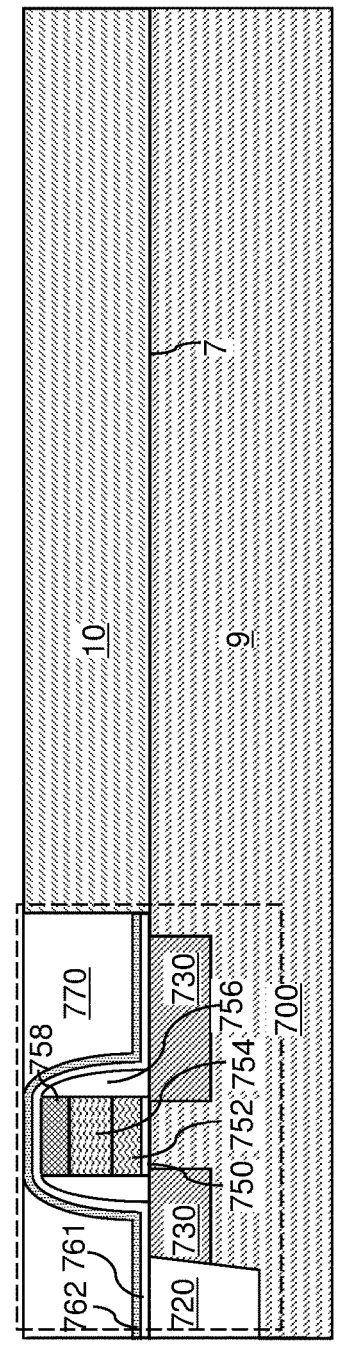
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device including laterally undulating memory material layers and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to the first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from $1.0$ S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
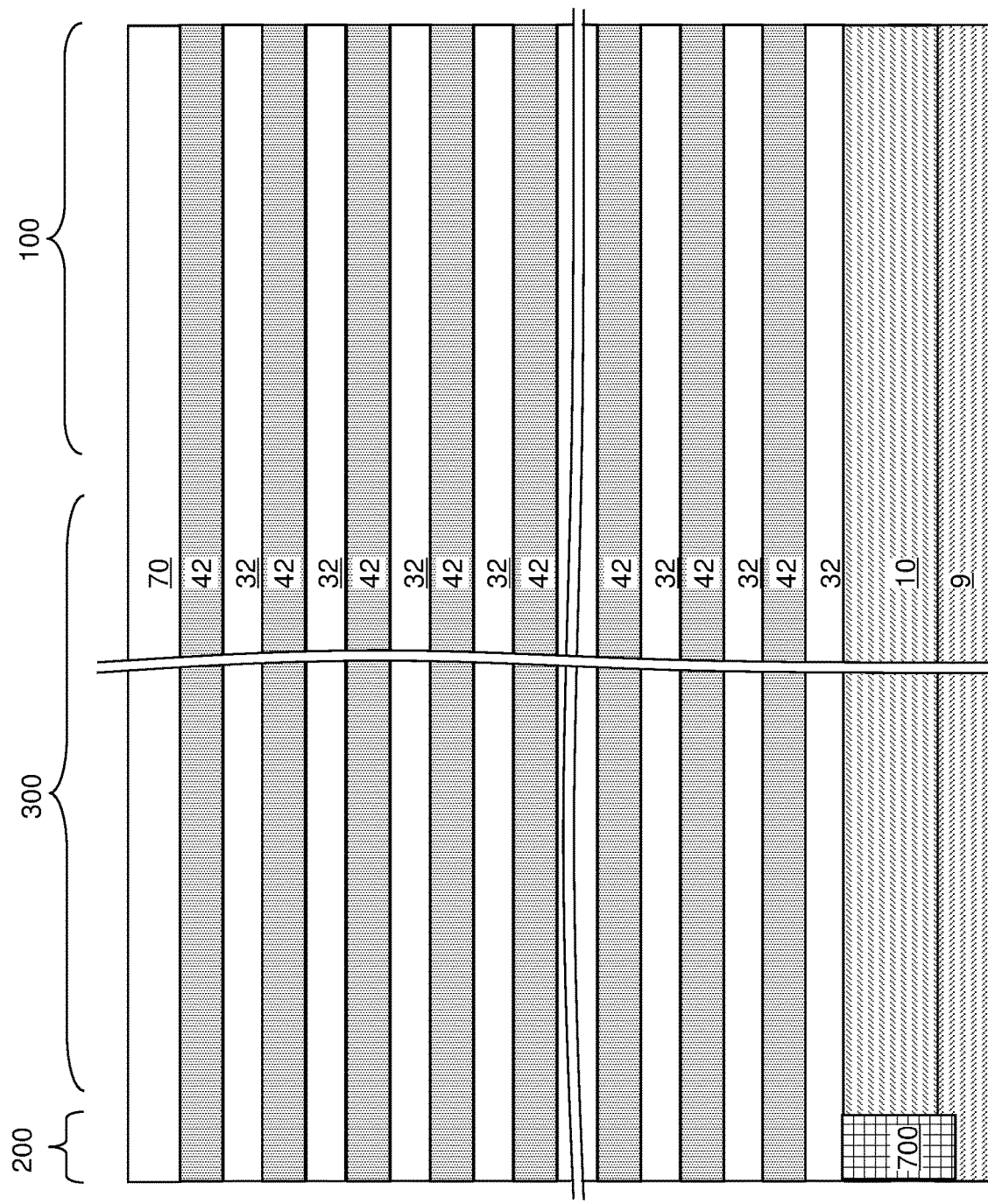
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
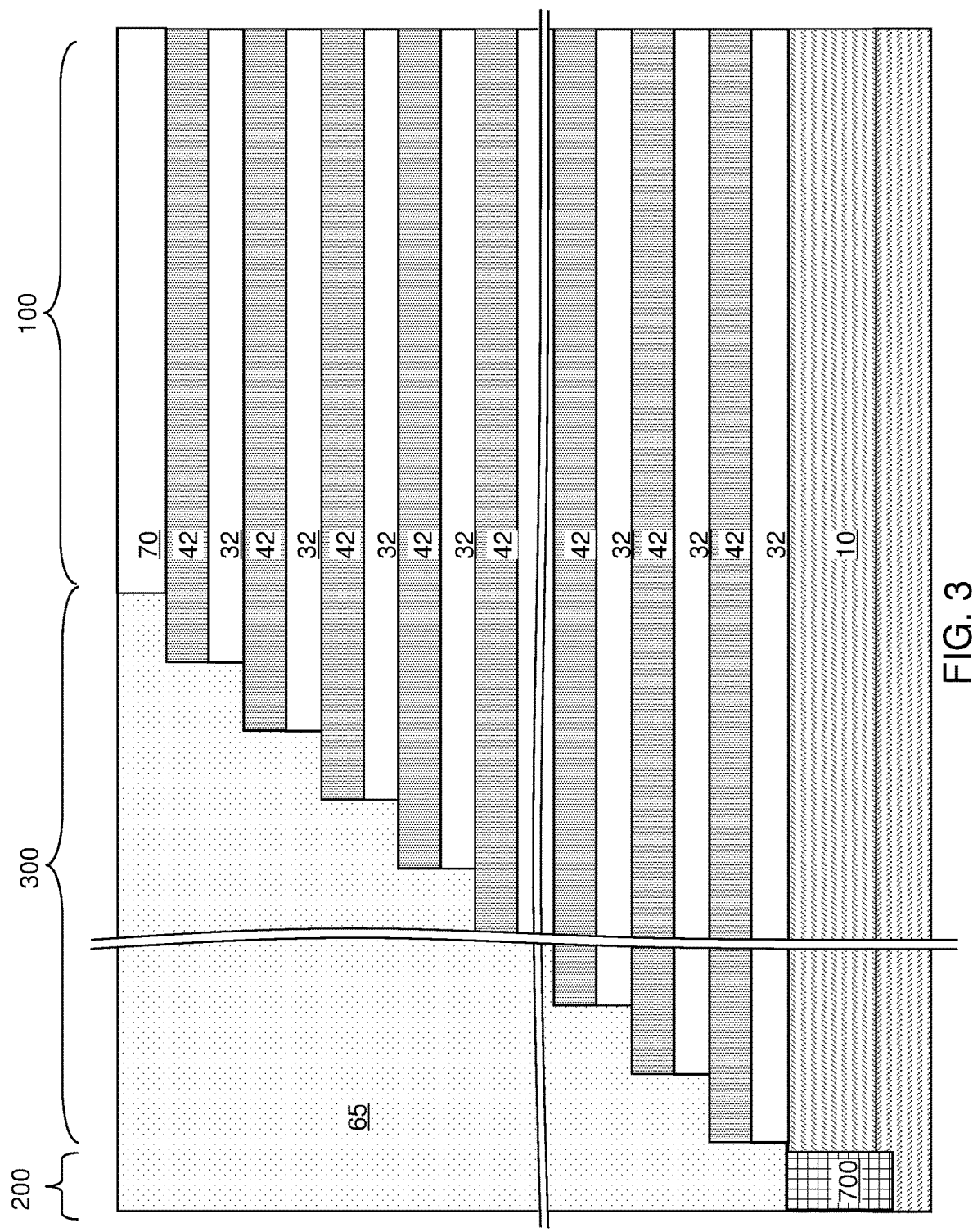
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and by filling the drain-select-level isolation trenches with a dielectric material such as silicon oxide. Excess portions of the dielectric material can be removed from above the top surface of the insulating cap layer 70.

Figure 4A:
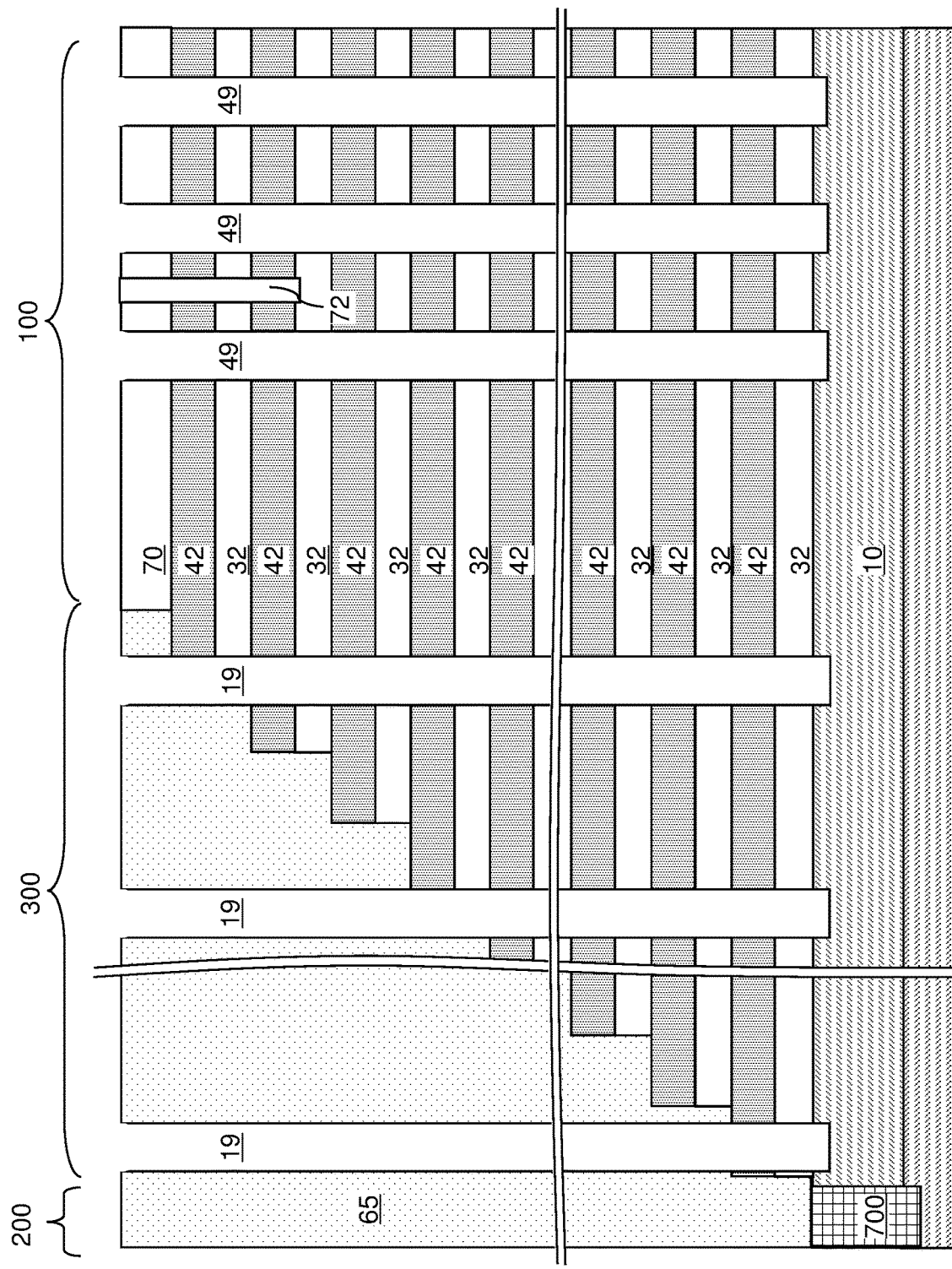
FIG. 4A is a schematic vertical cross-sectional view of the first exemplary structure after formation of memory openings and support openings according to the first embodiment of the present disclosure.
Figure 4B:
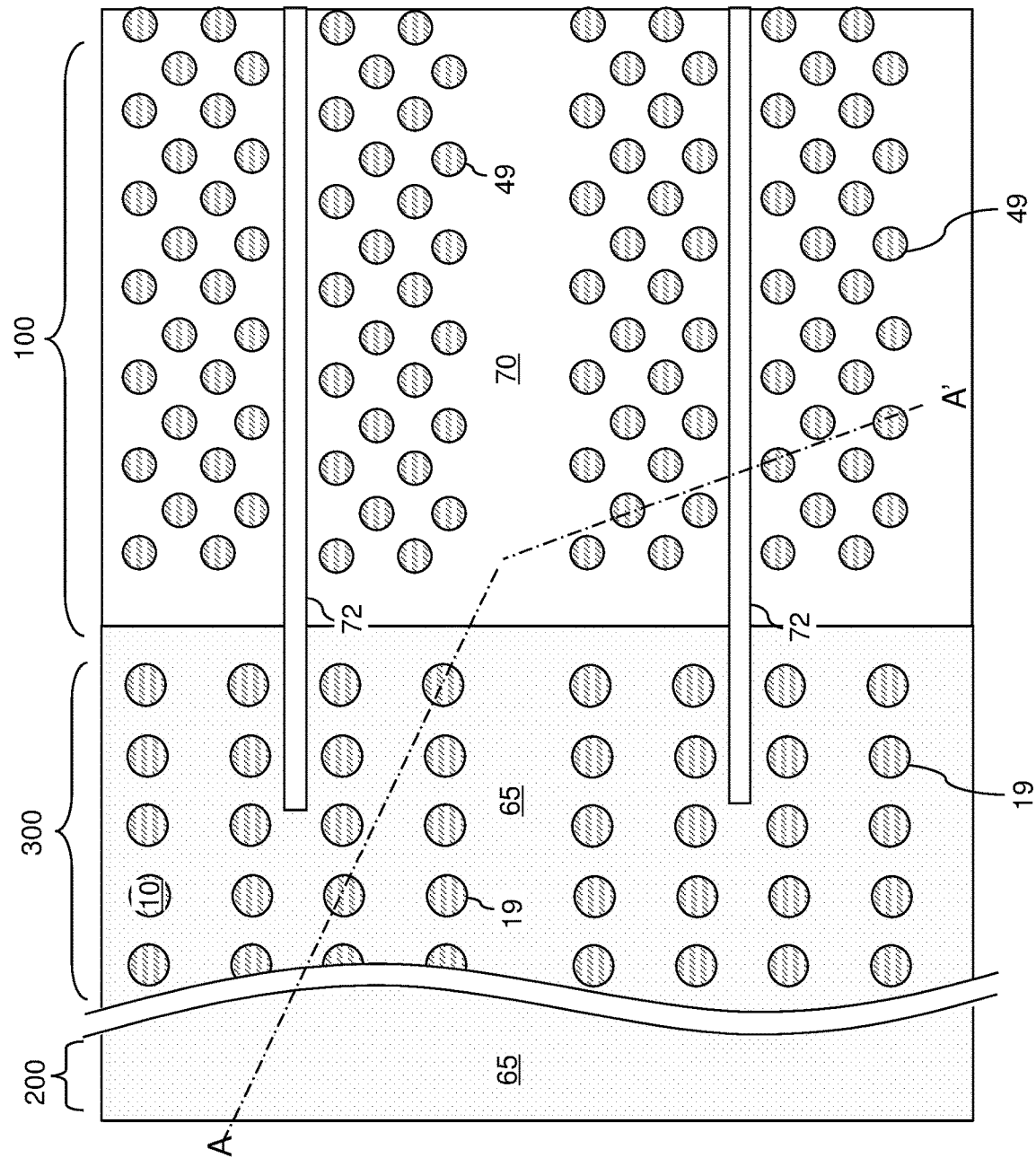
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5K illustrate structural changes during formation of a memory opening fill structure 58 in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, lateral recesses 149 can be formed at levels of the sacrificial material layers 42 around each memory opening 49 by laterally recessing the physically exposed sidewalls of the sacrificial material layers 42 selective to the insulating layers 32. Each lateral recess 149 can have a volume of a respective toroid having a rectangular vertical cross-sectional shape. As used herein, a toroid refers to a three-dimensional shape formed by a 360 degree revolution of a two-dimensional shape located within a vertical plane around a vertical axis that is laterally offset from the two-dimensional shape, or any shape derived therefrom by lateral stretching or lateral compression along a horizontal direction. An isotropic etch process that etches the material of the sacrificial material layers 42 selective to the material of the insulating layers 32 can be performed. In an illustrative example, if the sacrificial material layers 42 comprise silicon nitride and if the insulating layers 32 comprise silicon oxide, the isotropic etch process can comprise a wet etch process employing hot phosphoric acid. The lateral recess distance of the isotropic etch process can be in a range from 2 nm to 50 nm, such as from 5 nm to 20 nm, although lesser and greater lateral recess distances may also be employed.

Referring to FIG. 5D, a dielectric metal oxide layer can be conformally deposited in the laterally recesses and at peripheral portions of each memory opening 49. Non-limiting examples of the dielectric metal oxide material that can be employed for the dielectric metal oxide layer include aluminum oxide ($Al_2O_3$), hafnium oxide ($HfO_2$), lanthanum oxide ($LaO_2$), yttrium oxide ($Y_2O_3$), tantalum oxide ($Ta_2O_5$), nitrogen-doped compounds thereof, alloys thereof, and stacks thereof. In one embodiment, the dielectric metal oxide layer can comprise, and/or can consist essentially of, amorphous aluminum oxide. The dielectric metal oxide layer can be deposited by a conformal deposition process such as a chemical vapor deposition (CVD) process, an atomic layer deposition (ALD) process, a pulsed laser deposition (PLD) process, a liquid source misted chemical deposition process, or a combination thereof. The thickness of the dielectric metal oxide layer can be greater than the lateral recess distance of the isotropic etch process of FIG. 5C.

An anisotropic etch process can be performed to remove portions of the dielectric metal oxide layer located outside the volumes of the lateral recesses. Each remaining portion of the dielectric metal oxide layer located within a respective lateral recess constitutes a dielectric metal oxide portion 41, which may be a toroidal dielectric metal oxide portion having a rectangular vertical cross-sectional shape. The lateral width, as measured between an inner sidewall and an outer sidewall, of each dielectric metal oxide portion 41 may be the same as the lateral recess distance, and thus, may be in a range from 2 nm to 50 nm, such as from 5 nm to 20 nm, although lesser and greater lateral widths may also be employed. A vertical stack of dielectric metal oxide portions 41 can be formed in the lateral recesses 149 around each memory opening. The vertical stack of dielectric metal oxide portions 41 may comprise sacrificial structures that are subsequently removed, or may be incorporated into a final device structure in various embodiments. The inner sidewalls of the dielectric metal oxide portions 41 can be vertically coincident with sidewalls of the insulating layers 32, i.e., can be located within a same cylindrical vertical plane as the sidewalls of the insulating layers 32.

Referring to FIG. 5E, an insulating material can be grown from physically exposed sidewalls of the insulating layers 32 within the memory opening 49 while suppressing growth of the insulating material from physically exposed surfaces of the vertical stack of dielectric metal oxide portions 41. A selective growth process is a growth process that grows a material from one type of surfaces while preventing growth from another type of surfaces. For example, the insulating layers 32 and the insulating cap layer 70 may comprise, and/or consist essentially of, a silicon oxide material (such as undoped silicate glass or a doped silicate glass) and the dielectric metal oxide portions 41 may comprise, and/or consist essentially of, a dielectric metal oxide material, such as amorphous aluminum oxide. In this case, an area-selective deposition (ASD) process can be performed to grow silicon oxide only from physically exposed surfaces of the insulating layers 32 and the insulating cap layer 70, while suppressing growth of silicon oxide from the dielectric metal oxide surfaces of the dielectric metal oxide portions 41. The area-selective deposition process can form a vertical stack of insulating material portions 33 on physically exposed surfaces of the insulating layers and a continuous insulating material layer 33C on the physically exposed surfaces of the insulating cap layer 70.

An exemplary silicon oxide area-selective deposition process is described in "*Area-Selective Atomic Layer Deposition of $SiO_2$ Using Acetylacetone as a Chemoselective Inhibitor in an ABC-Type Cycle*," A. Mameli et al., ACS Nano 2017, 11, 9, 9303-9311, incorporated herein by reference in its entirety. For example, an area-selective atomic layer deposition (ALD) process can employ chemoselective inhibitor molecules in a three-step (ABC-type) ALD cycle. A process for area-selective ALD of $SiO_2$ may be employed, which sequentially utilizes the acetylacetone inhibitor (step A), the bis(diethylamino)silane precursor (step B), and $O_2$ plasma reactant (step C) pulses. Mameli et al. demonstrated that this process allows for selective deposition of $SiO_2$ on $GeO_2$, $SiN_x$, $SiO_2$, and $WO_3$, in the presence of $Al_2O_3$, $TiO_2$, and $HfO_2$ surfaces. The selectivity of the area-selective deposition process is provided by the chemoselective adsorption of the inhibitor. The selectivity between different oxide starting surfaces and the compatibility with plasma-assisted or ozone-based ALD are distinct features of this approach.

In one embodiment, the insulating layers 32 and the vertical stack of insulating material portions 33 may comprise, and/or may consist essentially of, a same insulating material, such as silicon oxide. The lateral thickness of each insulating material portion 33, as measured between an inner sidewall and an outer sidewall, is less than one half of the thickness of each sacrificial material layer 42 to prevent merging of neighboring insulating material portions 33. In one embodiment, the lateral thickness of each insulating material portion 33 may be in a range from 5% to 45%, such as from 10% to 35% and/or from 15% to 25%, of the thickness of each sacrificial material layer 42. For example, the lateral thickness of each insulating material portion 33 may be in a range from 2 nm to 22 nm, such as from 4 nm to 15 nm, although lesser and greater thicknesses may also be employed. Each insulating material portion 33 may comprise a straight outer sidewall 33OS and a contoured inner sidewall that includes a straight inner sidewall segment 33IS, an upper convex annular surface segment 33UC that adjoins a top periphery of the straight outer sidewall and a top periphery of the straight inner sidewall segment, and a lower convex annular surface segment 33LC that adjoins a bottom periphery of the straight outer sidewall and a bottom periphery of the straight inner sidewall segment.

Referring to FIG. 5F, a stack of layers including an optional blocking dielectric layer 52, a memory material layer 54, an optional dielectric material liner 56, and an optional sacrificial cover material layer 601 can be sequentially deposited in the memory openings 49 by a respective conformal deposition process. Each of the blocking dielectric layer 52, the memory material layer 54, the dielectric material liner 56, and the sacrificial cover material layer 601 can be formed with a respective contour in a vertical cross-sectional profile such that the contour of each layer replicates the contour of the inner surface of the previously deposited layer, or in the case of the optional blocking dielectric layer 52, the contour of the physically exposed surfaces of a combination of a vertical stack of dielectric metal oxide portion 41 and a vertical stack of insulating material portions 33. Thus, each of the blocking dielectric layer 52, the memory material layer 54, the dielectric material liner 56, and the sacrificial cover material layer 601 can have a respective laterally-undulating vertical cross-sectional profile that protrudes outward from a vertical axis passing through the geometrical center of the memory opening 49 at levels of the sacrificial material layers 42.

The optional blocking dielectric layer 52 can include a single dielectric material layer or a stack of a plurality of dielectric material layers. The blocking dielectric layer 52 can be formed employing a conformal deposition process on the vertical stack of insulating material portions 33 and on the physically exposed surfaces of the vertical stack of dielectric metal oxide portions 41. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a polarization direction, or any other memory material that can store date by altering electrical resistivity properties.

The memory material layer 54 can have a laterally-undulating vertical cross-sectional profile providing outward lateral protrusions at levels of the sacrificial material layers 42 from a vertical axis VA passing through a geometrical center of a volume of the memory opening 49. The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The optional dielectric material liner 56 includes a dielectric material. The dielectric material liner 56 can be formed on the memory material layer 54 employing a conformal deposition process, and can have a respective laterally-undulating vertical cross-sectional profile. In one embodiment in which the memory material layer 54 is a charge storage material, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5G, the optional sacrificial cover material layer 601, the dielectric material liner 56, the memory material layer 54, the blocking dielectric layer 52, and a horizontally-extending portion of the continuous insulating material layer 33C overlying the insulating cap layer 70 are sequentially anisotropically etched employing at least one anisotropic etch process. The portions of the sacrificial cover material layer 601, the dielectric material liner 56, the memory material layer 54, the blocking dielectric layer 52, and the continuous insulating material layer 33C located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, the blocking dielectric layer 52, and the continuous insulating material layer 33C can be etched by a respective anisotropic etch process employing a respective etch chemistry, which may, or may not, be the same for the various material layers.

Each remaining portion of the sacrificial cover material layer 601 can have a tubular configuration. Each remaining portion of the continuous insulating material layer 33C constitutes a topmost insulating material portion 33, which may have a cylindrical configuration. The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5H, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Figure 5I:
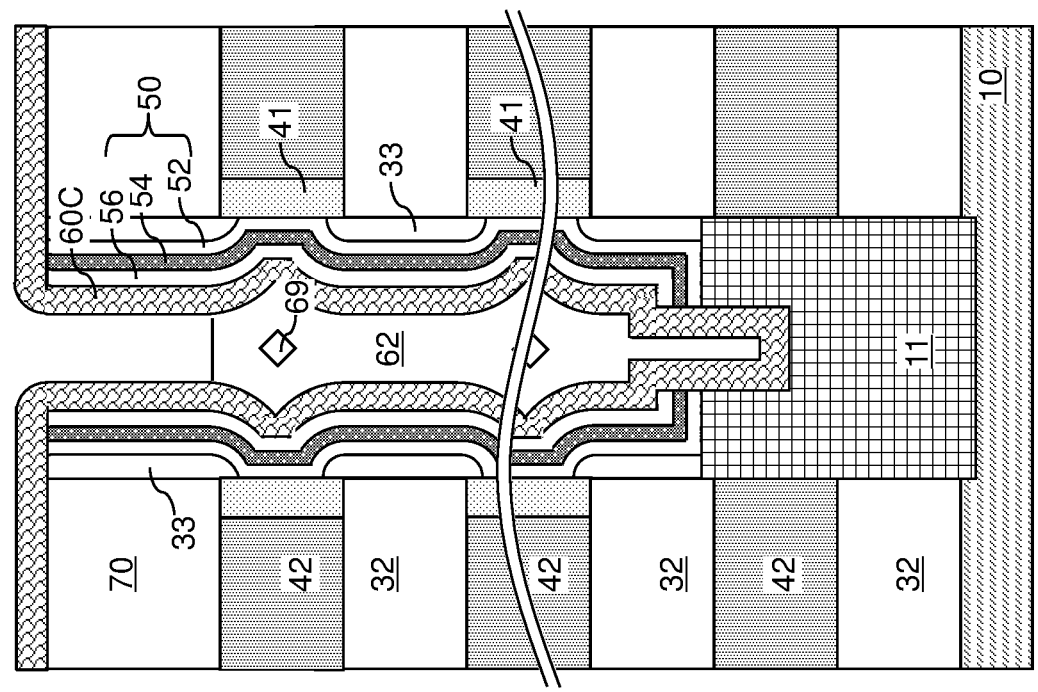

Referring to FIG. 5I, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating. In some embodiments, encapsulated cavities (i.e., airgaps) 69 that are free of any solid phase material therein and entirely encapsulated within the material of the dielectric core layer 62C may be formed at levels of the sacrificial material layers 42 within each memory opening.

Figure 5J:
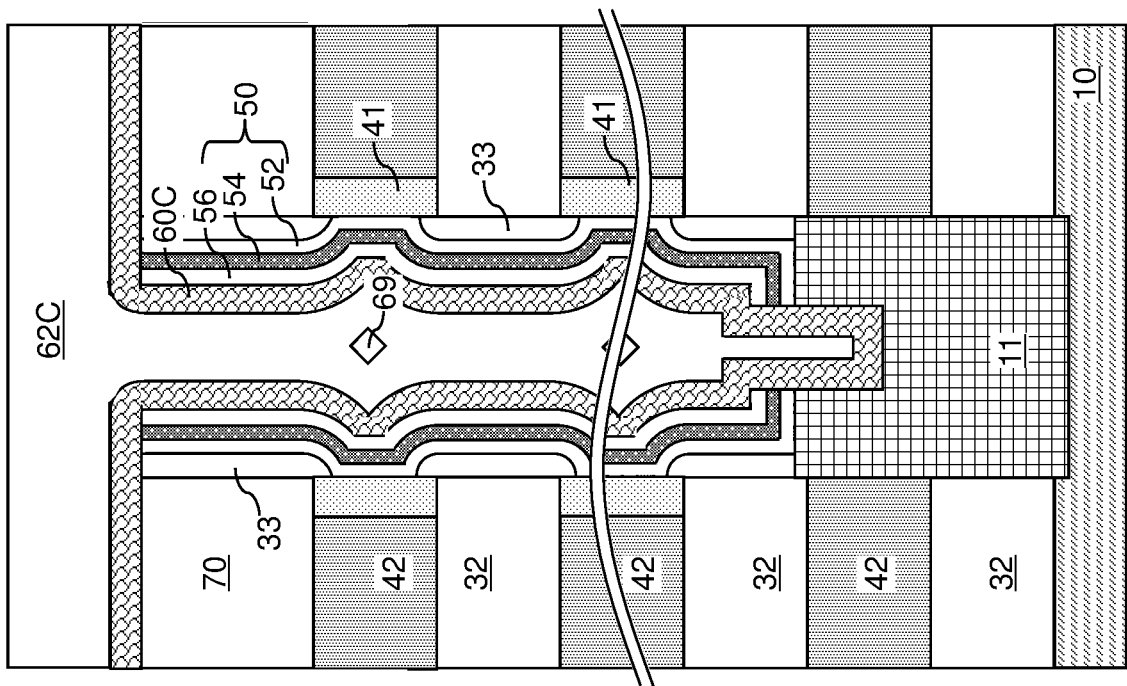

Referring to FIG. 5J, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Figure 5K:
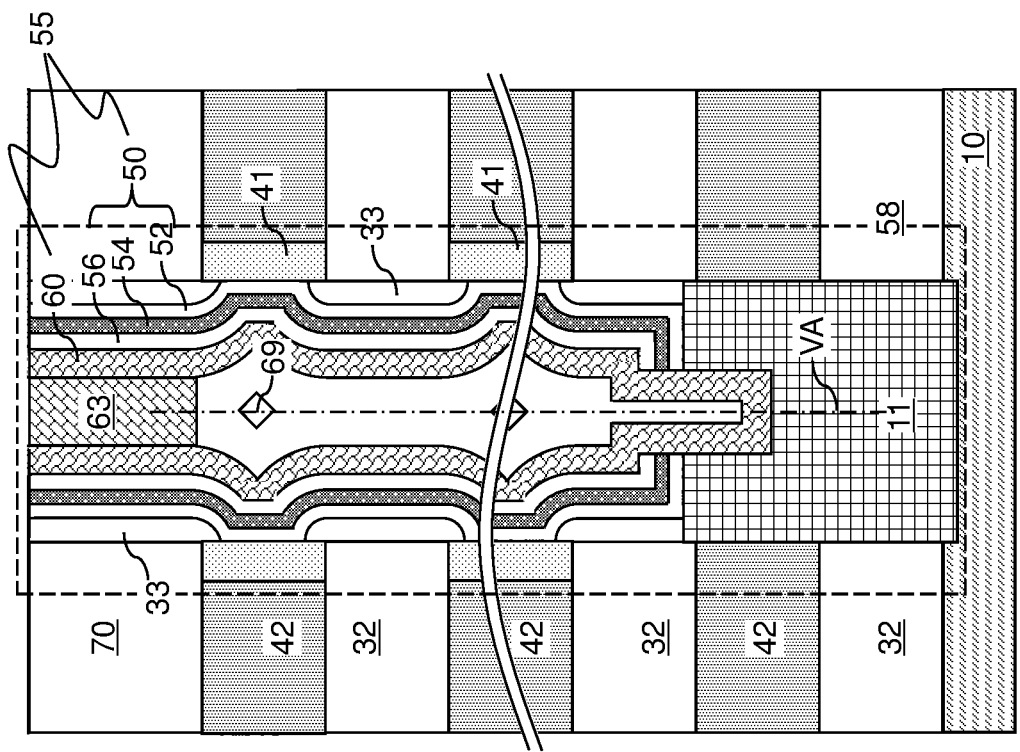

Referring to FIG. 5K, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60. The vertical semiconductor channel 60 is formed directly on the dielectric material liner 56 and has a respective laterally-undulating vertical cross-sectional profile.

The dielectric material liner 56 is surrounded by the memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. The dielectric material liner 56 may comprise a tunneling dielectric layer if the memory material layer 54 is configured to store charge. Furthermore, if the ferroelectric memory material layer 54 is used, then the tunneling dielectric layer 56 may be omitted. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises a vertical stack of dielectric metal oxide portions 41, a vertical stack of insulating material portions 33, and a memory material layer 54 and a vertical semiconductor channel 60 that are sequentially formed over the vertical stack of insulating material portions 33. A dielectric material liner 56 may laterally surround the vertical semiconductor channel 60. The memory material layer 54 can have a laterally-undulating (i.e., wavy) vertical cross-sectional profile and can laterally surround the dielectric material liner 56. Each insulating material portion 33 within the vertical stack of insulating material portions 33 comprises a respective vertical cylindrical outer sidewall 33OS contacting a respective one of the insulating layers 32, and a respective inner sidewall (which contains segment 33IS) including at least one annular concave surface segment (33UC, 33LC) adjoined to a top edge or a bottom edge of the respective vertical cylindrical outer sidewall 33OS, as shown in FIG. 5E.

In one embodiment shown in FIG. 5E, the respective inner sidewall includes an inner cylindrical sidewall segment adjoined to the at least one annular concave surface segment (33UC, 33LC). In one embodiment, for each insulating material portion 33 except a topmost one and a bottommost one within the vertical stack of insulating material portions 33, the respective inner sidewall comprises: a respective upper annular concave surface 33UC segment adjoined to the top edge of the respective vertical cylindrical outer sidewall 33OS and adjoined to a top edge of the inner cylindrical sidewall segment 33IS; and a respective lower annular concave surface segment 33LC adjoined to the bottom edge of the respective vertical cylindrical outer sidewall 33OS and adjoined to a bottom edge of the inner cylindrical sidewall segment 33IS.

The insulating layers 32 and the vertical stack of insulating material portions 33 comprise a same insulating material. In one embodiment, the same insulating material comprises silicon oxide. The material compositions of the insulating layers 32 and the vertical stack of insulating material portions 33 may be the same or different. For example, each of the insulating layers 32 and the vertical stack of insulating material portions 33 may independently comprise, and/or consist essentially of, undoped silicate glass or a doped silicate glass (such as borosilicate glass, phosphosilicate glass, borophosphosilicate glass, fluorosilicate glass, and/or organosilicate glass). In one embodiment, the insulating layers 32 may comprise, and/or consist essentially of, a first silicon oxide material, and the vertical stack of insulating material portions 33 may comprise, and/or consist essentially of, a second silicon oxide material that may be the same as, or different from, the first silicon oxide material.

In one embodiment, portions of the memory material layer 54 located at levels of the sacrificial material layers 42 laterally protrude outward relative to portions of the memory material layer 54 located at levels of the insulating layers 32 from a vertical axis VA passing through a geometrical center of the memory opening fill structure 58, i.e., the center of gravity of a hypothetical object filling the entire volume of the memory opening fill structure 58 and having a uniform density throughout.

In one embodiment, the memory opening fill structure 58 comprises a blocking dielectric layer 52 contacting an entirety of the inner sidewalls of the vertical stack of insulating material portions 33 and contacting an entirety of an outer sidewall of the memory material layer 54.

Figure 6:
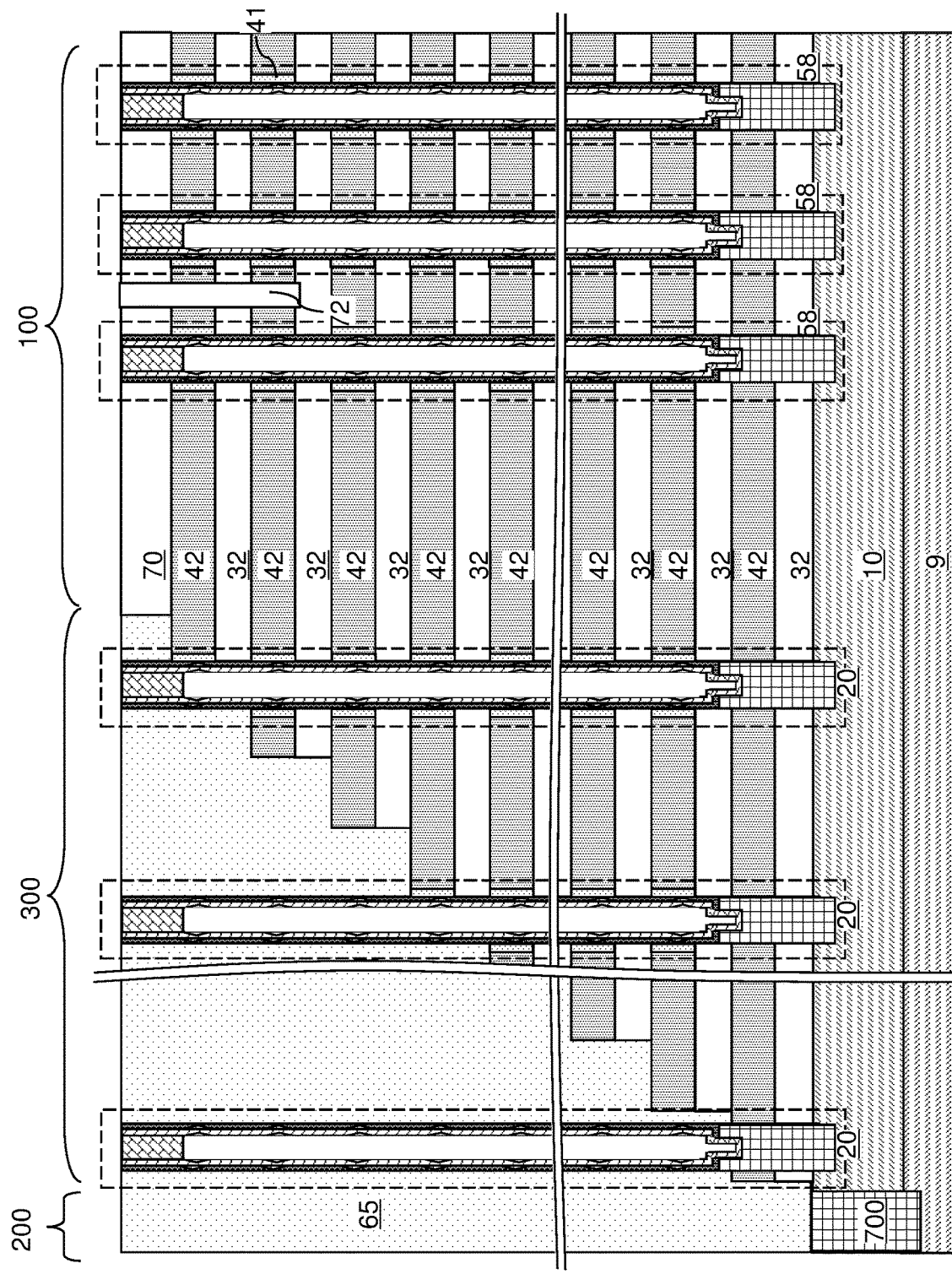
FIG. 6 is a schematic vertical cross-sectional view of the first exemplary structure after formation of memory stack structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60 and a vertical stack of charge storage regions laterally surrounding the dielectric material liner 56 (comprising the memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
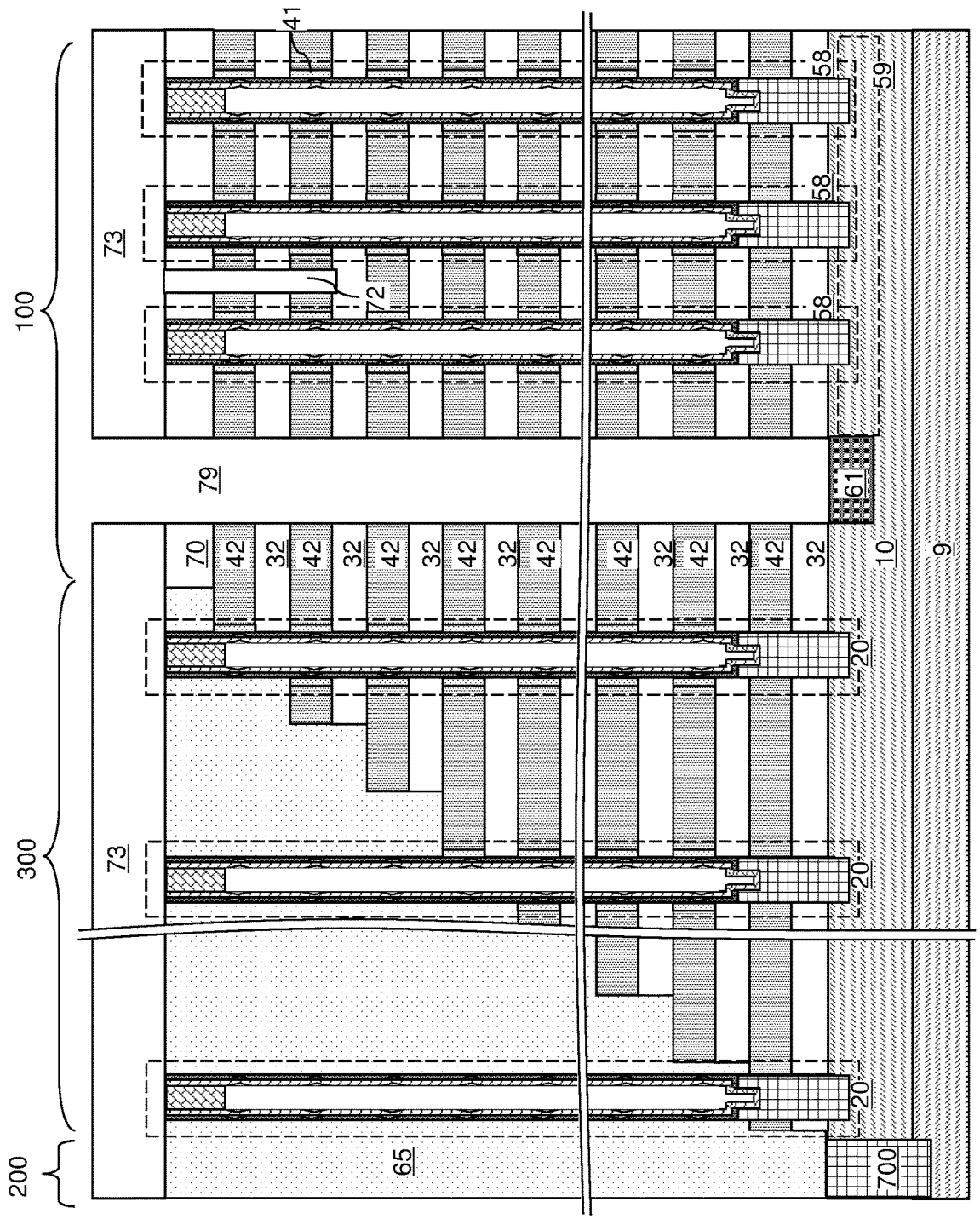
FIG. 7A is a schematic vertical cross-sectional view of the first exemplary structure after formation of backside trenches according to the first embodiment of the present disclosure.
Figure 7B:
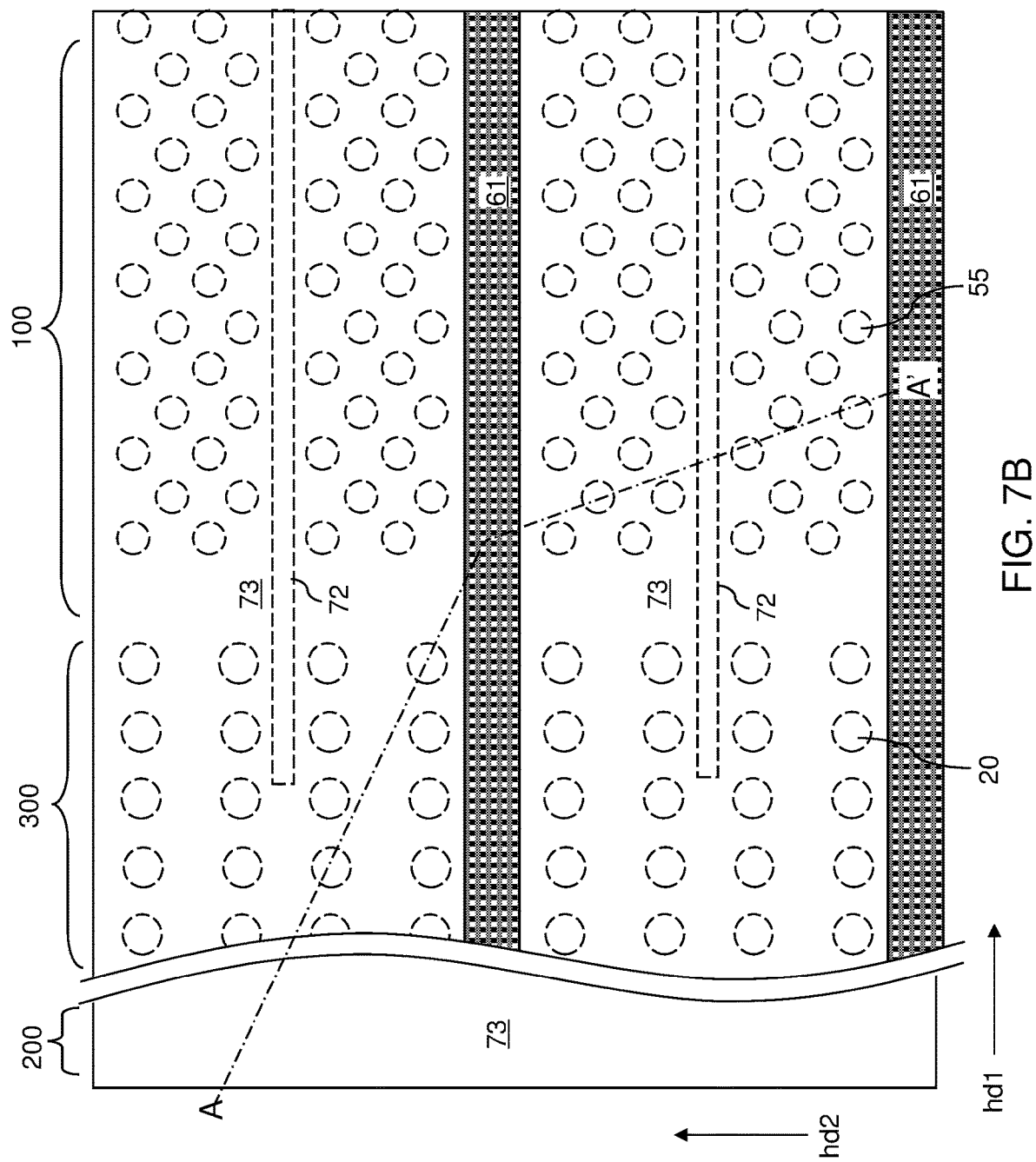
FIG. 7B is a partial see-through top-down view of the first exemplary structure of FIG. 7A. The vertical plane A-A' is the plane of the schematic vertical cross-sectional view of FIG. 7A.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8A:
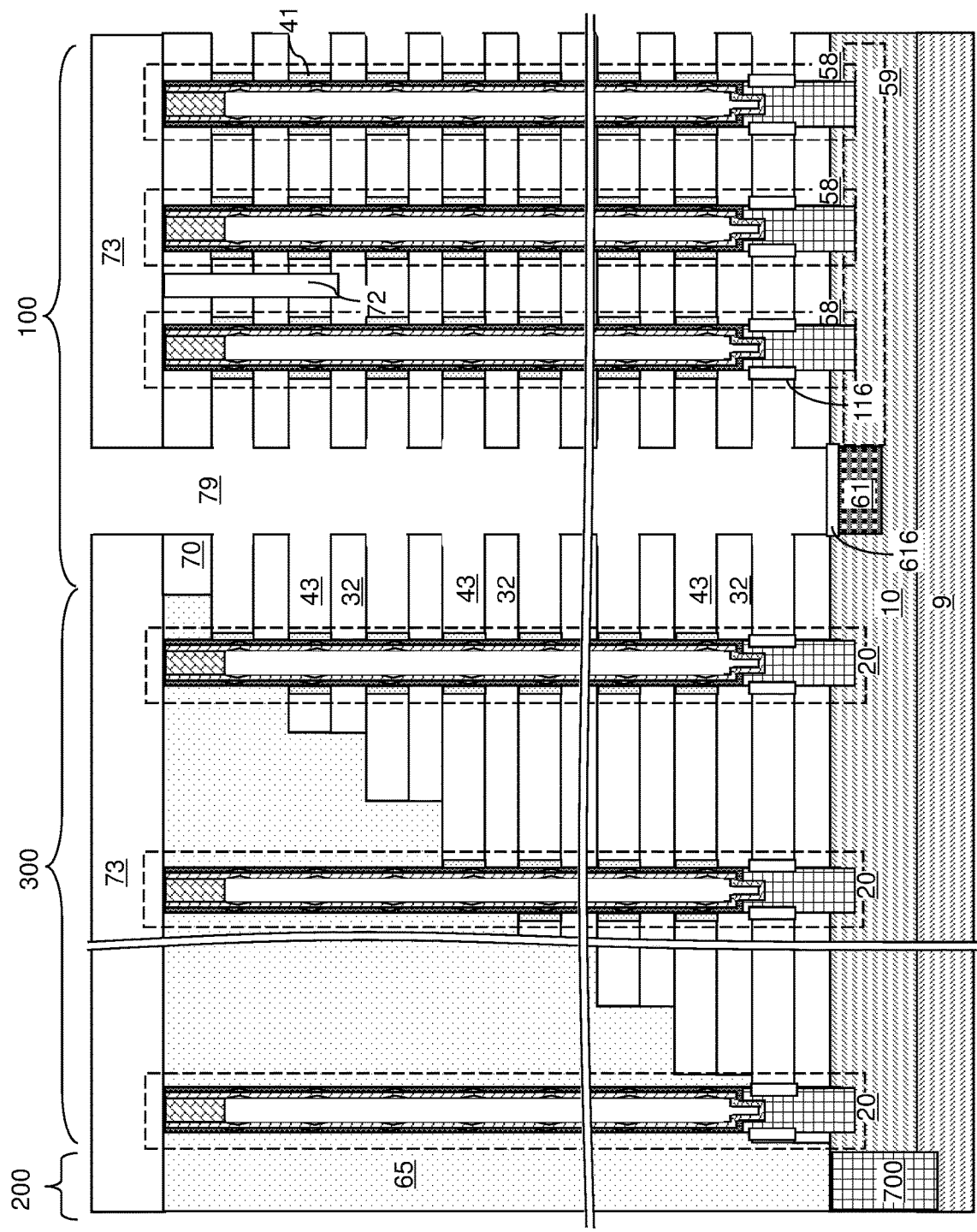
FIG. 8A is a schematic vertical cross-sectional view of the first exemplary structure after formation of backside recesses according to the first embodiment of the present disclosure.
Figure 8B:
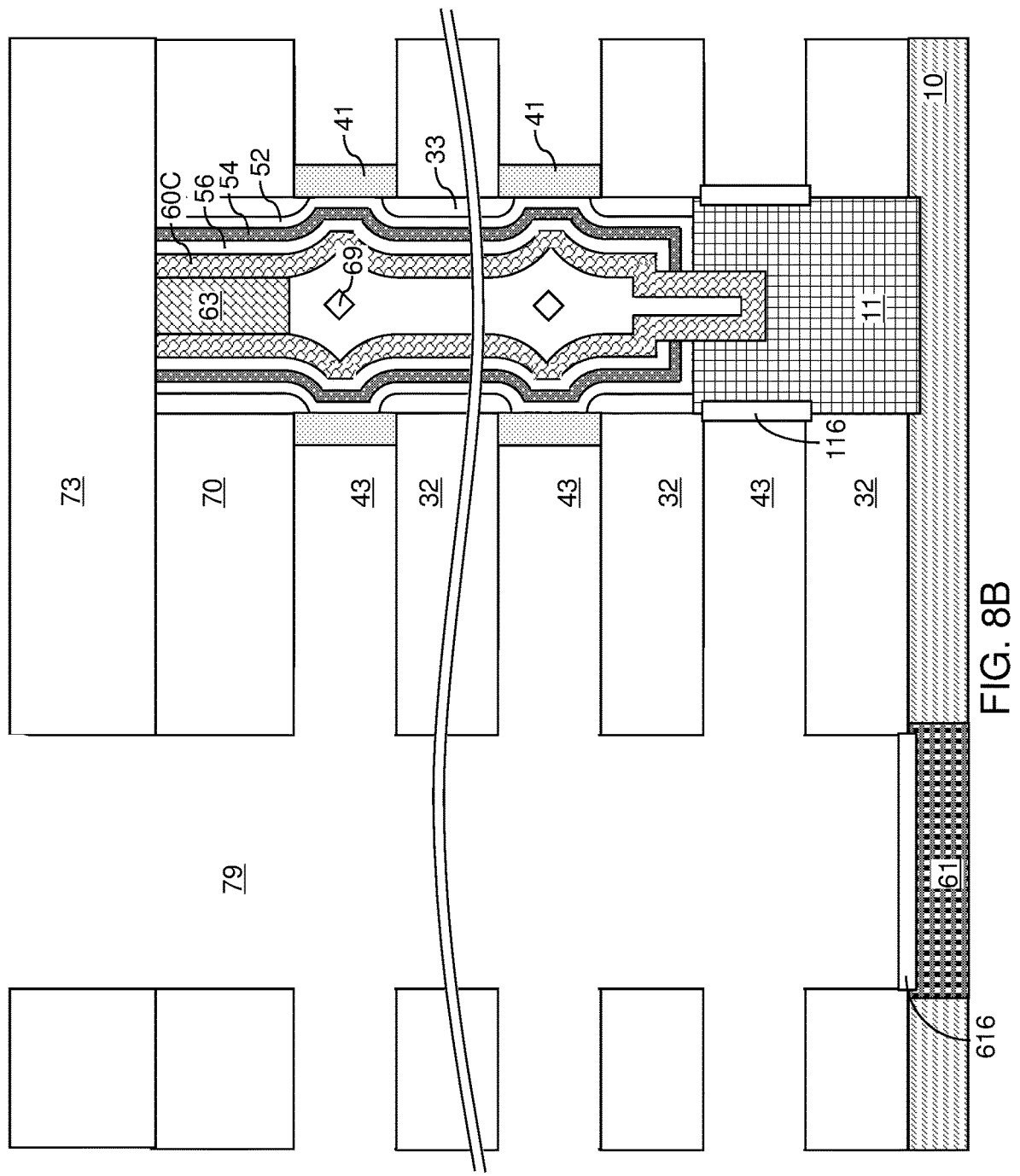
FIG. 8B is a magnified view of a region of the first exemplary structure of FIG. 8A.

Referring to FIGS. 8A and 8B, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the vertical stacks of dielectric metal oxide portions 41. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9A:
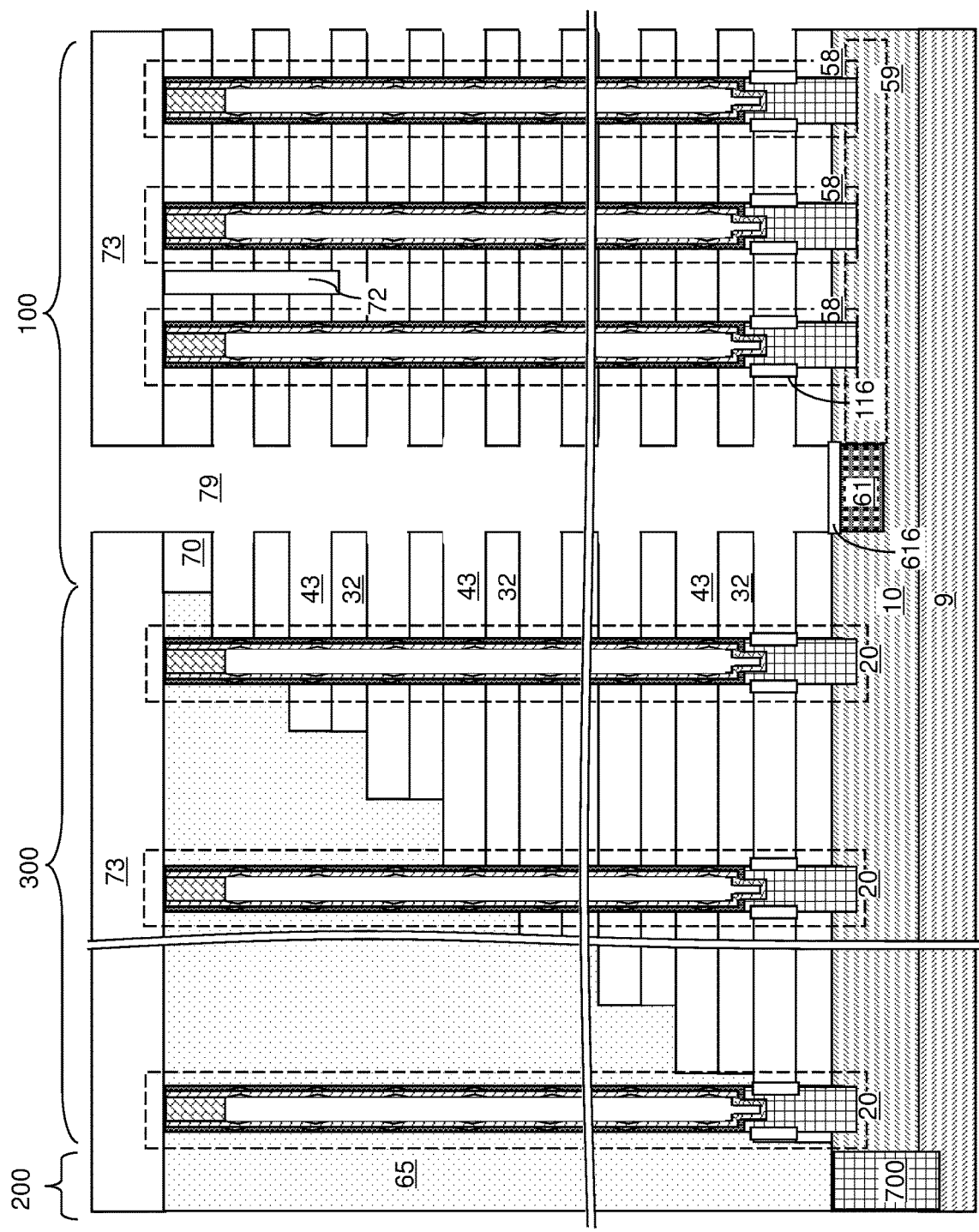
FIG. 9A is a schematic vertical cross-sectional view of the first exemplary structure after removal of dielectric metal oxide portions according to the first embodiment of the present disclosure.
Figure 9B:
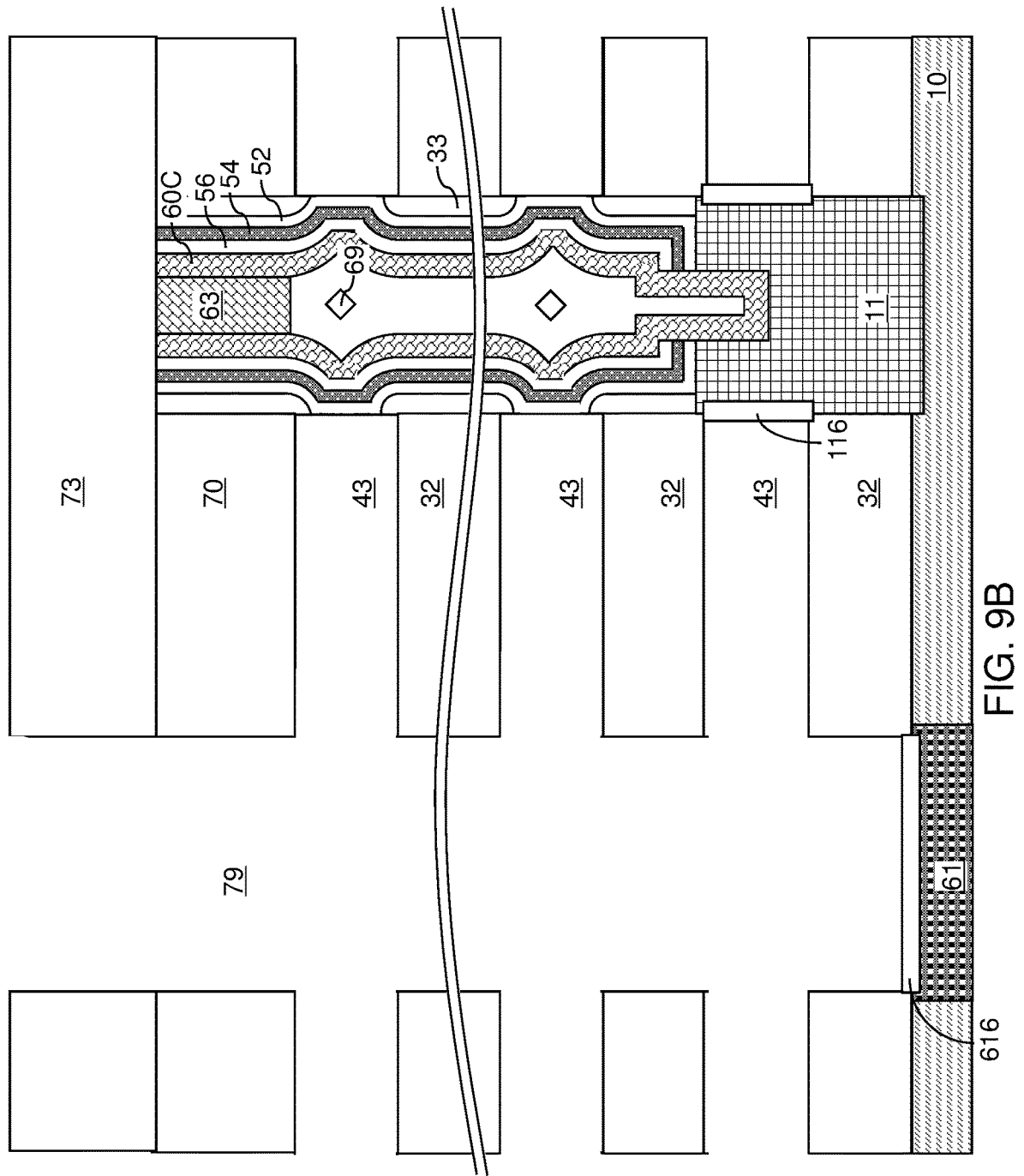
FIG. 9B is a magnified view of a region of the first exemplary structure of FIG. 9A.

Referring to FIGS. 9A and 9B, a selective isotropic etch process can be performed to remove the dielectric metal oxide portions 41 selective to materials of the insulating layers 32, the insulating material portions 33, and the blocking dielectric layers 52. Generally, the oxidation process for forming the tubular dielectric spacers 116 and the planar dielectric portions 616 may be performed prior to, or after, the selective isotropic etch process that removes the dielectric metal oxide portions 41. Cylindrical surface segments of the outer sidewall of each blocking dielectric layer 52 can be physically exposed at each level of the backside recesses 43. Further, upper cylindrical segments and lower cylindrical segments of the outer sidewall 33OS of the insulating material portions 33 can be physically exposed to the backside recesses 43.

Figure 10A:
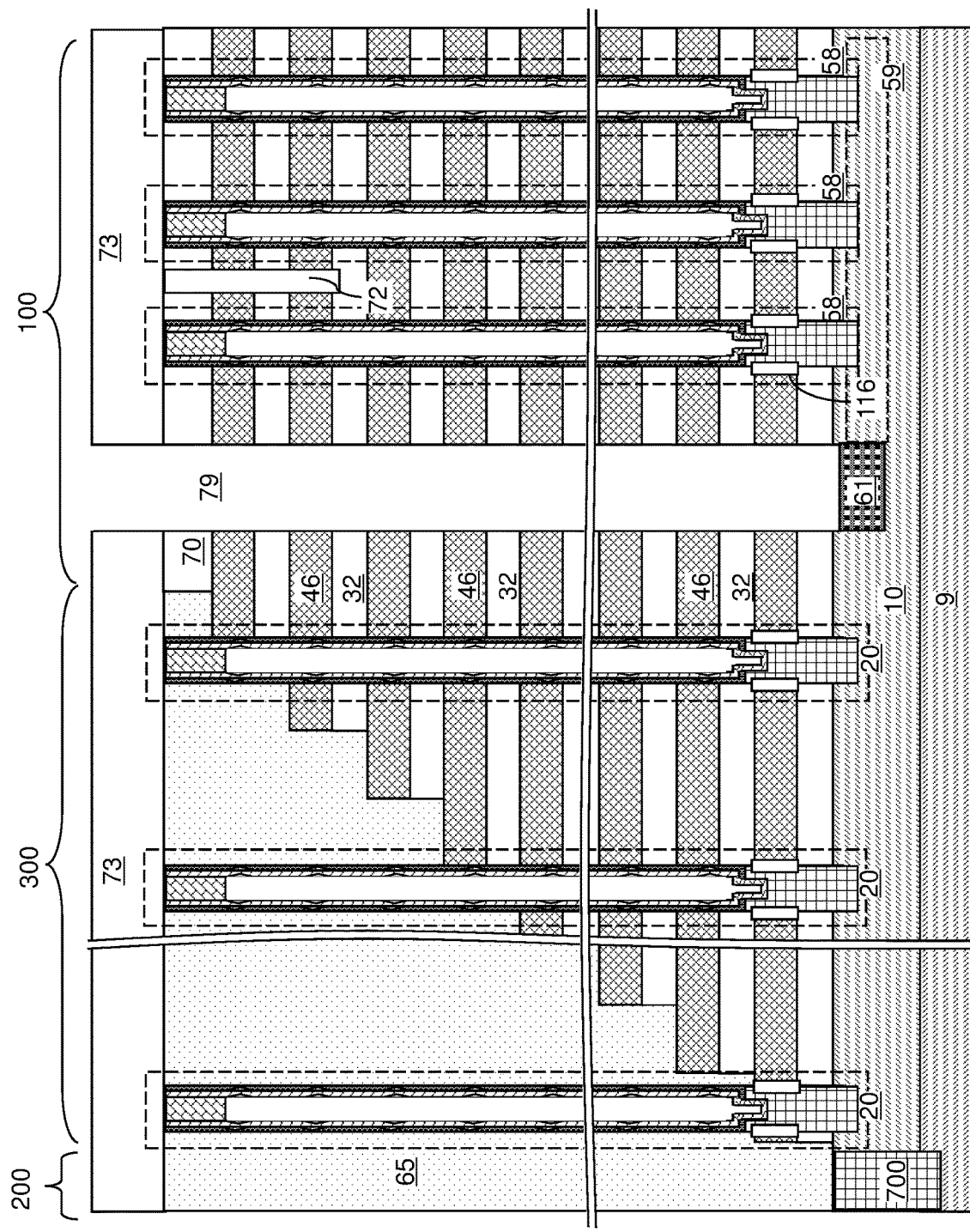
FIG. 10A is a schematic vertical cross-sectional view of the first exemplary structure after formation of electrically conductive layers in the backside recesses according to the first embodiment of the present disclosure.
Figure 10B:
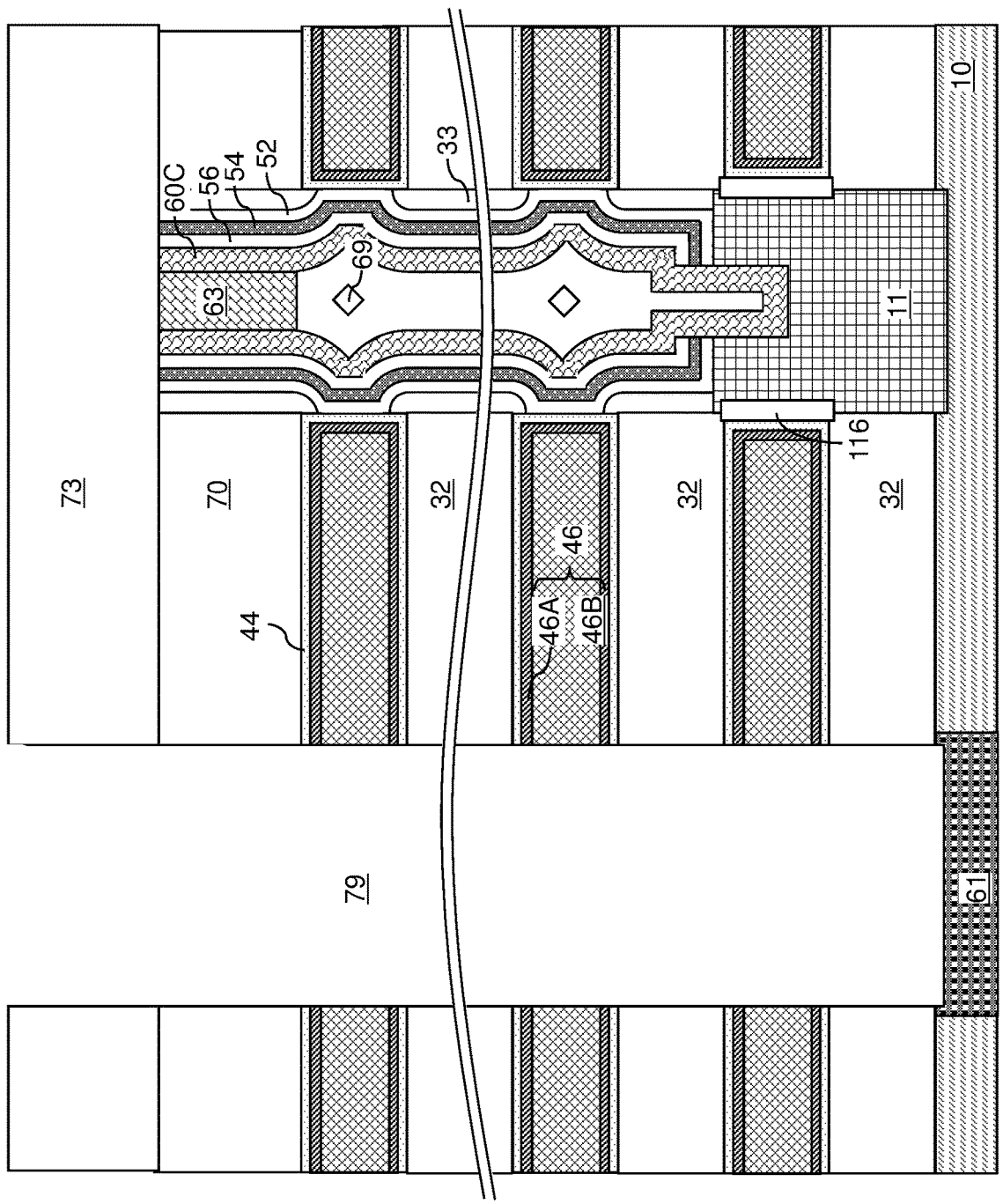
FIG. 10B is a magnified view of a region of the first exemplary structure of FIG. 10A.

Referring to FIGS. 10A and 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

At least one metallic material can be deposited in the remaining volumes of the backside recesses 43. For example, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material can be deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer (which is a temporary structure and is not illustrated) can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of insulating material layers such as a vertically neighboring pair of insulating layers 32.

Each sacrificial material layer 42 can be replaced with an electrically conductive layer 46. A backside cavity is present in each backside trench 79 that is not filled with the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The planar dielectric portions 616 can be removed during removal of the continuous electrically conductive material layer. A backside cavity 79' is present within each backside trench 79.

Figure 11:
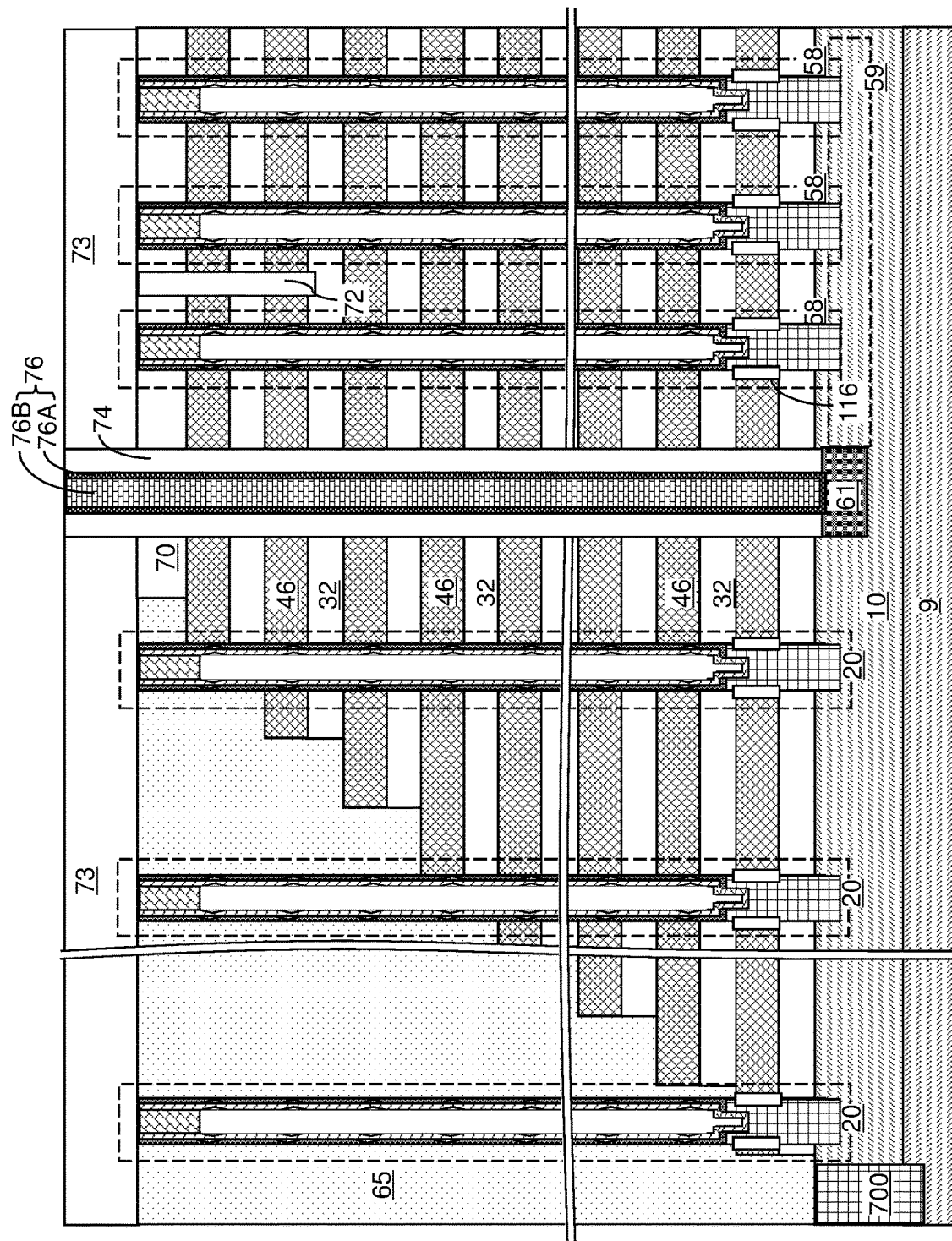
FIG. 11 is a schematic vertical cross-sectional view of the first exemplary structure after formation of an insulating spacer and a backside contact structure in each backside trench according to the first embodiment of the present disclosure.

Referring to FIG. 11, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 12A:
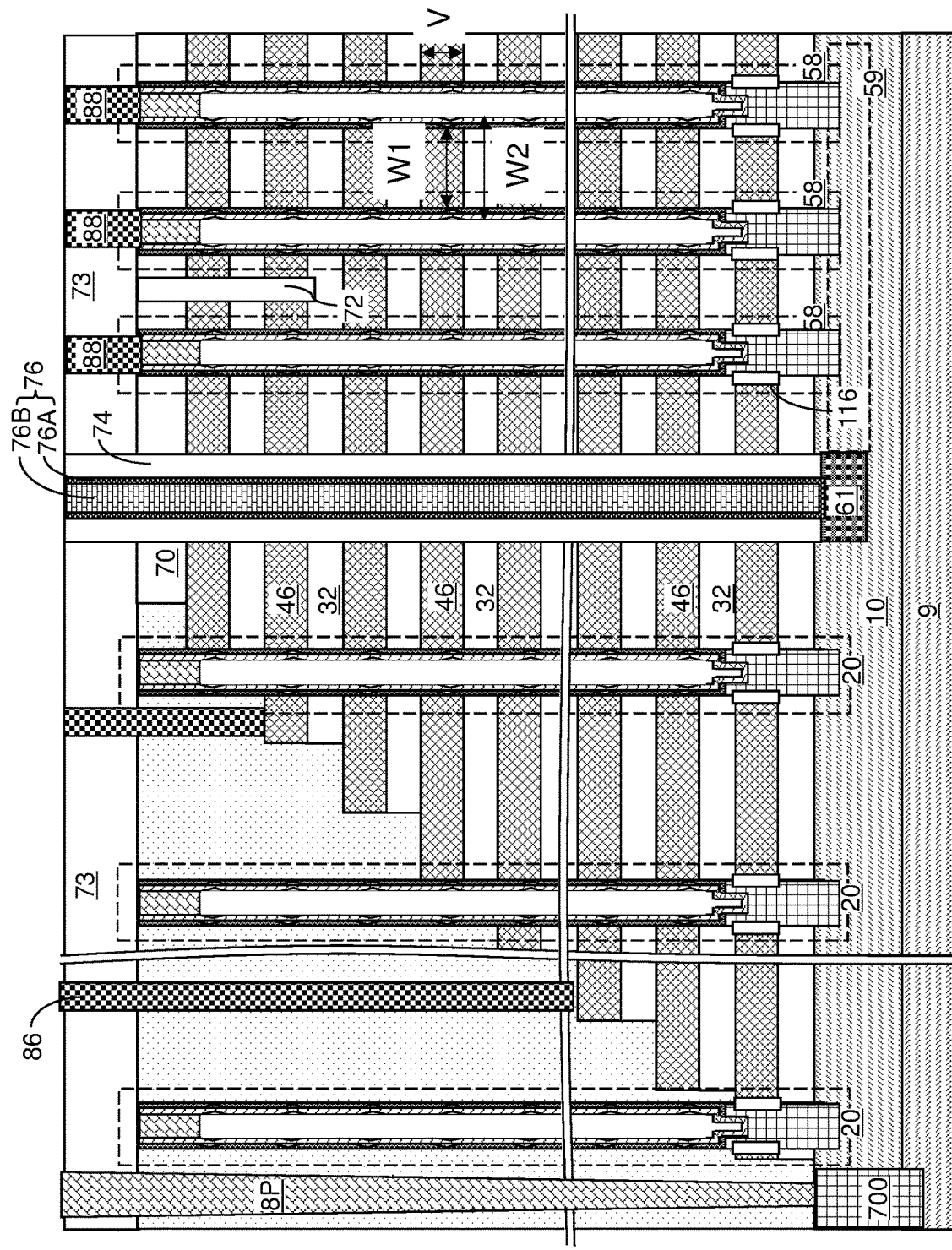
FIG. 12A is a schematic vertical cross-sectional view of the first exemplary structure after formation of additional contact via structures according to the first embodiment of the present disclosure.
Figure 12B:
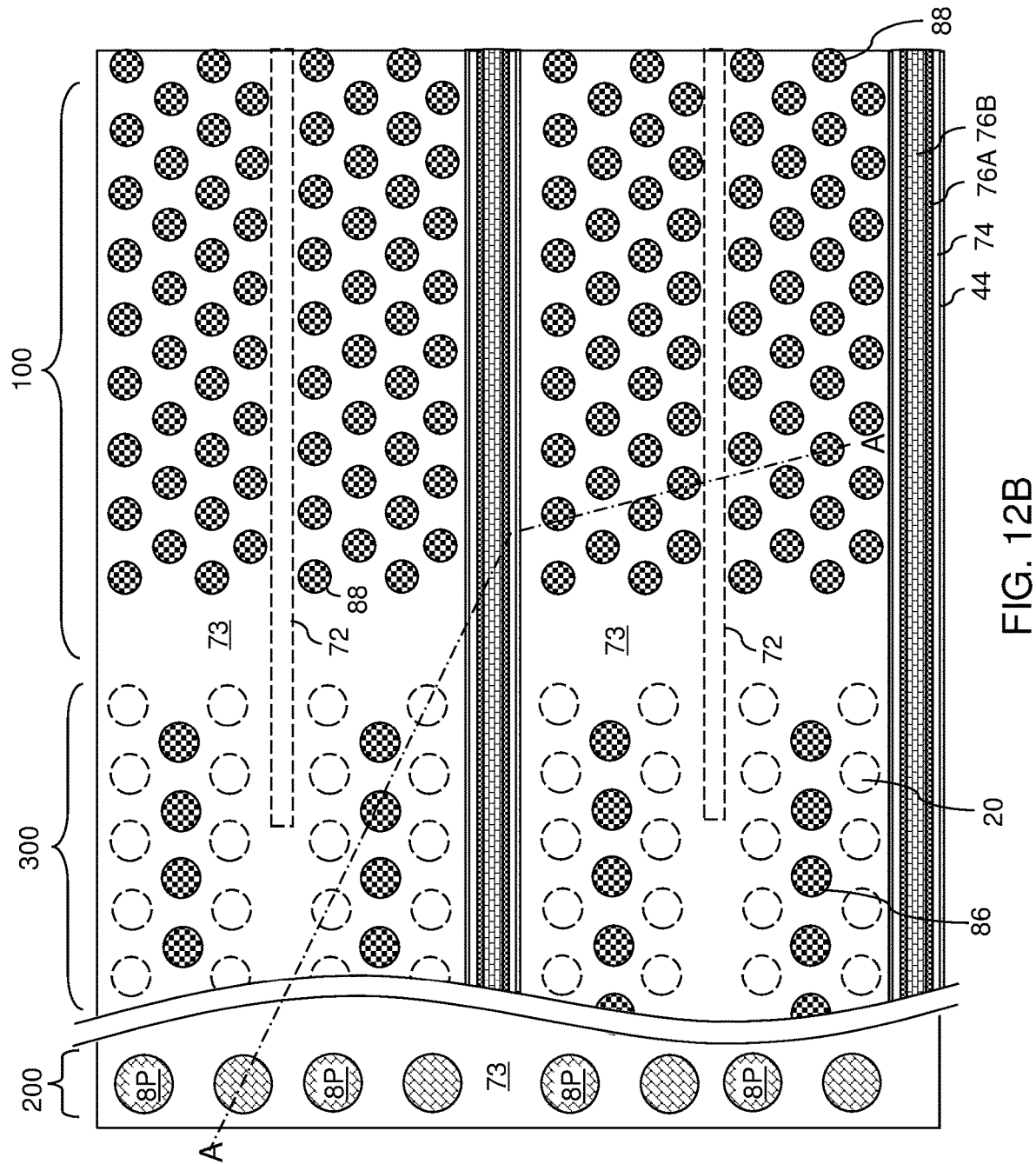
FIG. 12B is a top-down view of the first exemplary structure of FIG. 12A. The vertical plane A-A' is the plane of the schematic vertical cross-sectional view of FIG. 12A.
Figure 12C:
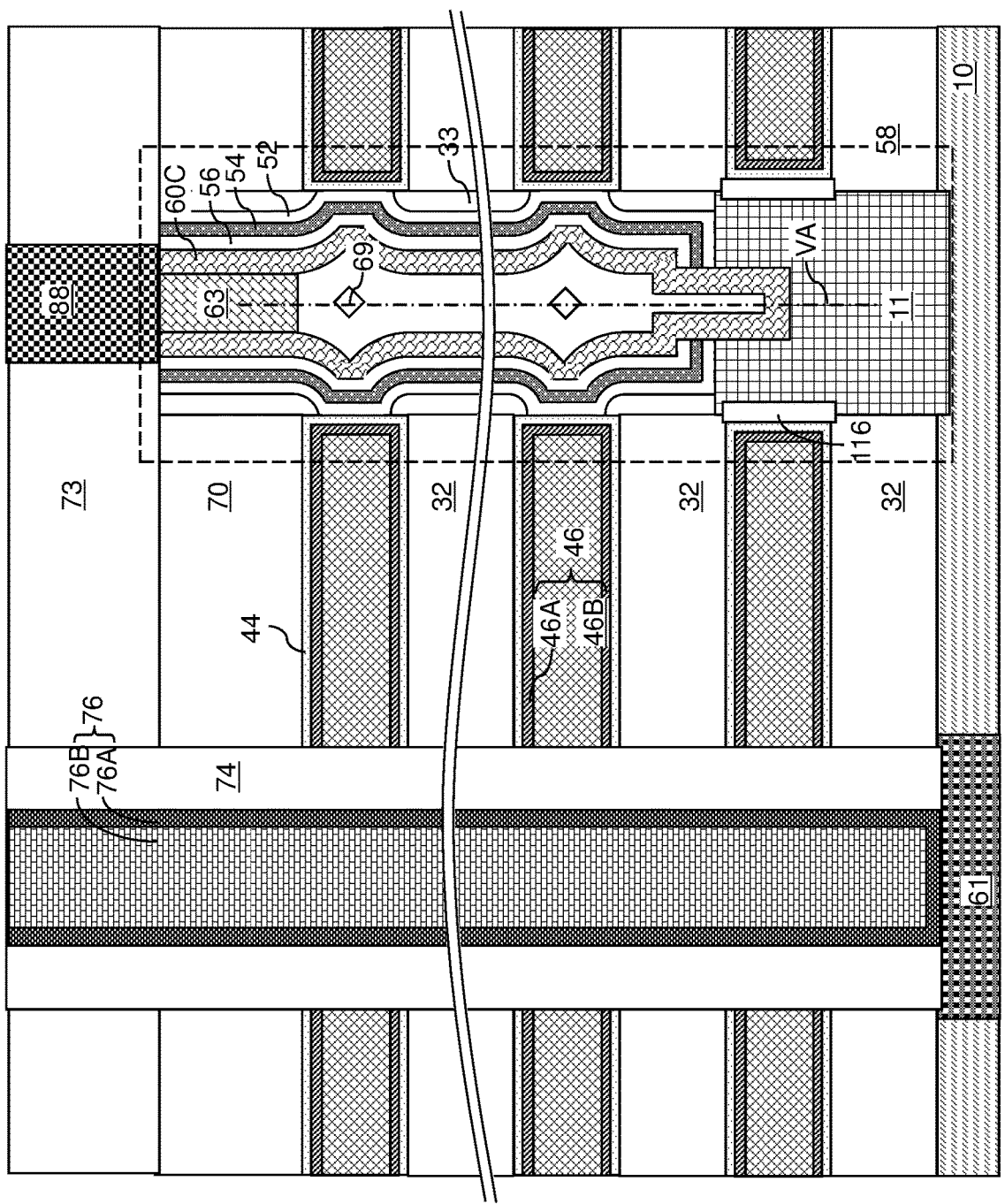
FIG. 12C is a magnified view of a region of the first exemplary structure of FIG. 12A.

Referring to FIGS. 12A and 12B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

As shown in FIG. 12A, the lateral width "W1" of each electrically conductive layer 46 (e.g., word line) between adjacent memory opening fill structures 58 is greater than the vertical height "V" of the same electrically conductive layer 46. The sum of lateral width "W2" of each insulating layer 32 and protrusion (i.e., insulating material portion 33) between adjacent memory opening fill structures 58 is greater than the lateral width W1. Thus, a larger volume is filled by the electrically conductive layers between memory opening fill structures 58 by forming insulating material portions 33 that protrude from the insulating layers 32. This reduces the word line resistance. The wiggled profile of the memory material layer 54 reduces neighboring word line interference without requiring a large recess of the word lines (and thus loss of electrically conductive material and resulting higher resistance) away from the memory opening fill structures 58.

In one embodiment, portions of the memory material layer 54 located at levels of the sacrificial material layers 42 laterally protrude outward relative to portions of the memory material layer 54 located at levels of the insulating layers 32 from a vertical axis VA passing through a geometrical center of the memory opening fill structure 58, i.e., the center of gravity of a hypothetical object filling the entire volume of the memory opening fill structure 58 and having a uniform density throughout.

Referring collectively to FIGS. 1-12B, each memory opening fill structure 58 may comprise a blocking dielectric layer 52 contacting an entirety of the inner sidewalls of the vertical stack of insulating material portions 33 and contacting an entirety of an outer sidewall of the memory material layer 54. In one embodiment, each of the electrically conductive layers 46 can be vertically spaced the memory opening fill structure 58 and from an overlying one and/or an underlying one of the insulating layers 32 by a respective backside blocking dielectric layer 44. In one embodiment, one of the backside blocking dielectric layers 44 contacts an upper portion of a cylindrical outer sidewall of one of the insulating material portions 33, a cylindrical segment of an outer sidewall of the blocking dielectric layer 52, and a lower portion of a cylindrical outer sidewall of another of the insulating material portions 33. In one embodiment, the respective vertical cylindrical outer sidewall of each insulating material portion 33 contacts a cylindrical sidewall of the respective one of the insulating layers 32 and a segment of a cylindrical sidewall of a respective one of the backside blocking dielectric layers 44.

According to a second embodiment of the present disclosure, a second exemplary structure can be provided, which can be the same as the first exemplary structure up to the processing steps of FIG. 5C. Subsequently, modifications are made to the sequence of processing steps for forming memory opening fill structures 58 and the support pillar structures 20.

FIGS. 13A-13K are sequential schematic vertical cross-sectional views of a memory opening within the second exemplary structure during formation of a memory opening fill structure according to the second embodiment of the present disclosure.

Referring to FIG. 13A, a memory opening within the second exemplary structure is illustrated according to the second embodiment of the present disclosure, which can have the same structure as the memory opening illustrated in FIG. 5C. The lateral recess distance, i.e., the lateral offset distance between sidewalls of the sacrificial material layers 42 and the insulating layers 32, can be in a range from 4 nm to 60 nm, such as from 8 nm to 30 nm, although lesser and greater lateral recess distances may also be employed.

Referring to FIG. 13B, an isotropic recess etch process can be optionally performed to isotropically recess physically exposed surfaces of the insulating layers 32 and the insulating cap layer 70. For example, if the insulating layers 32 and the insulating cap layer 70 comprises silicon oxide, a wet etch process employing dilute hydrofluoric acid can be performed to isotropically recess the physically exposed surfaces of the insulating layers 32 and the insulating cap layer 70 by an isotropic recess etch distance, which may be in a range from 1 nm to 10 nm, although lesser and greater isotropic recess etch distances may also be employed.

Referring to FIG. 13C, a continuous silicon oxide liner 31C may be optionally deposited by a conformal deposition process such as a chemical vapor deposition process. The thickness of the continuous silicon oxide liner 31C may be in a range from 1 nm to 10 nm, although lesser and greater thicknesses may also be employed. The continuous silicon oxide liner 31C may be formed as a continuous structure without any opening therethrough.

Referring to FIG. 13D, the processing steps of FIG. 5D can be performed to form a vertical stack of dielectric metal oxide portions 41 within each lateral recess at levels of the sacrificial material layers 42. The lateral width, as measured between an inner sidewall and an outer sidewall, of each dielectric metal oxide portion 41 may be in a range from 2 nm to 50 nm, such as from 5 nm to 20 nm, although lesser and greater lateral widths may also be employed. A vertical stack of dielectric metal oxide portions 41 can be formed in the lateral recesses around each memory opening 49. The vertical stack of dielectric metal oxide portions 41 may be sacrificial structures that are subsequently removed, or may be incorporated into a final device structure depending on embodiments. The inner sidewalls of the dielectric metal oxide portions 41 can be vertically coincident with inner cylindrical sidewalls of the continuous silicon oxide liner 31C. Horizontal portions of the continuous silicon oxide liner 31C that are located above the top surface of the insulating cap layer 70 or above the pedestal channel portions 11 can be collaterally etched during a terminal portion of the anisotropic etch process that removes unmasked portions of the dielectric metal oxide material. Each remaining portion of the continuous silicon oxide liner 31C constitutes a tubular silicon oxide liner 31T having a generally tubular configuration and having an undulation in the lateral extent along the vertical direction.

Referring to FIG. 13E, the processing steps of FIG. 5E can be performed to form a vertical stack of insulating material portions 33 on physically exposed surfaces of the insulating layers and to form a continuous insulating material layer 33C on the physically exposed surfaces of the insulating cap layer 70.

In one embodiment, the continuous silicon oxide liner 31C and the vertical stack of insulating material portions 33 may comprise, and/or may consist essentially of, a same insulating material, i.e., a silicon oxide material. The lateral thickness of each insulating material portion 33, as measured between an inner sidewall and an outer sidewall, is less than one half of the thickness of each sacrificial material layer 42 to prevent merging of neighboring insulating material portions 33. In one embodiment, the lateral thickness of each insulating material portion 33 may be in a range from 5% to 45%, such as from 10% to 35% and/or from 15% to 25%, of the thickness of each sacrificial material layer 42. For example, the lateral thickness of each insulating material portion 33 may be in a range from 2 nm to 22 nm, such as from 4 nm to 15 nm, although lesser and greater thicknesses may also be employed. Each insulating material portion 33 may comprise a straight outer sidewall 33OS and a contoured inner sidewall that includes a straight inner sidewall segment 33IS, an upper convex annular surface segment 33UC that adjoins a top periphery of the straight outer sidewall and a top periphery of the straight inner sidewall segment, and a lower convex annular surface segment 33LC that adjoins a bottom periphery of the straight outer sidewall and a bottom periphery of the straight inner sidewall segment.

Referring to FIG. 13F, the processing steps of FIG. 5F can be performed to sequentially deposit a stack of layers including an optional blocking dielectric layer 52, a memory material layer 54, a dielectric material liner 56, and an optional sacrificial cover material layer 601 in the memory openings 49 by a respective conformal deposition process. Each of the blocking dielectric layer 52, the memory material layer 54, the dielectric material liner 56, and the sacrificial cover material layer 601 can be formed with a respective contour in a vertical cross-sectional profile such that the contour of each layer replicates the contour of the inner surface of the previously deposited layer, or in the case of the optional blocking dielectric layer 52, the contour of the physically exposed surfaces of a combination of a vertical stack of dielectric metal oxide portion 41 and a vertical stack of insulating material portions 33. Thus, each of the blocking dielectric layer 52, the memory material layer 54, the dielectric material liner 56, and the sacrificial cover material layer 601 can have a respective laterally-undulating vertical cross-sectional profile that protrudes outward from a vertical axis passing through the geometrical center of the memory opening 49 at levels of the sacrificial material layers 42.

Figure 13H:
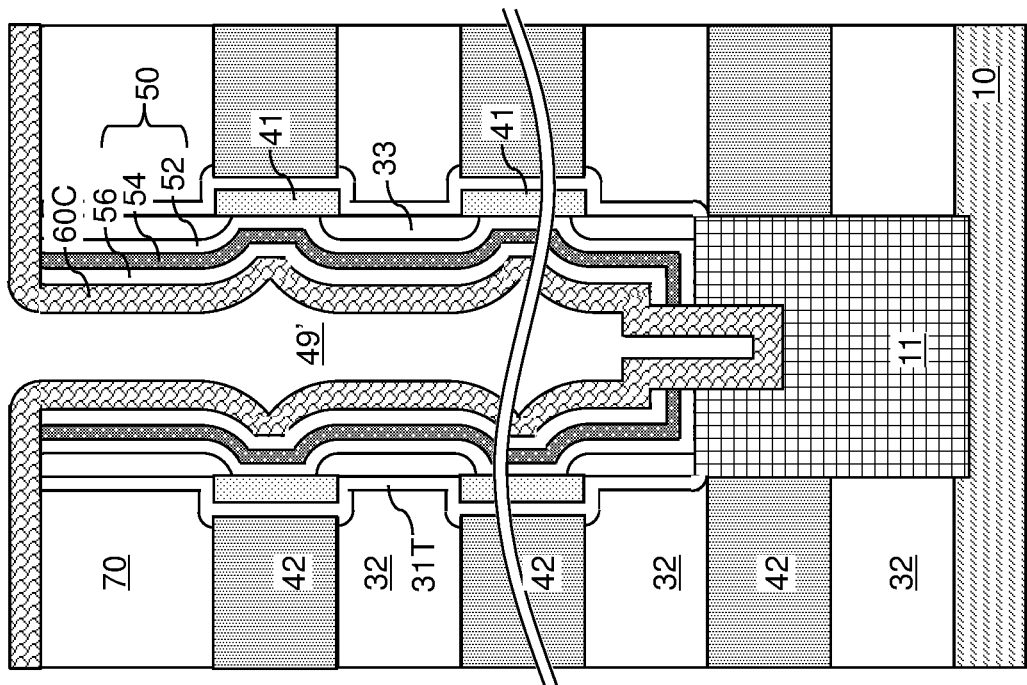
Figure 13G:
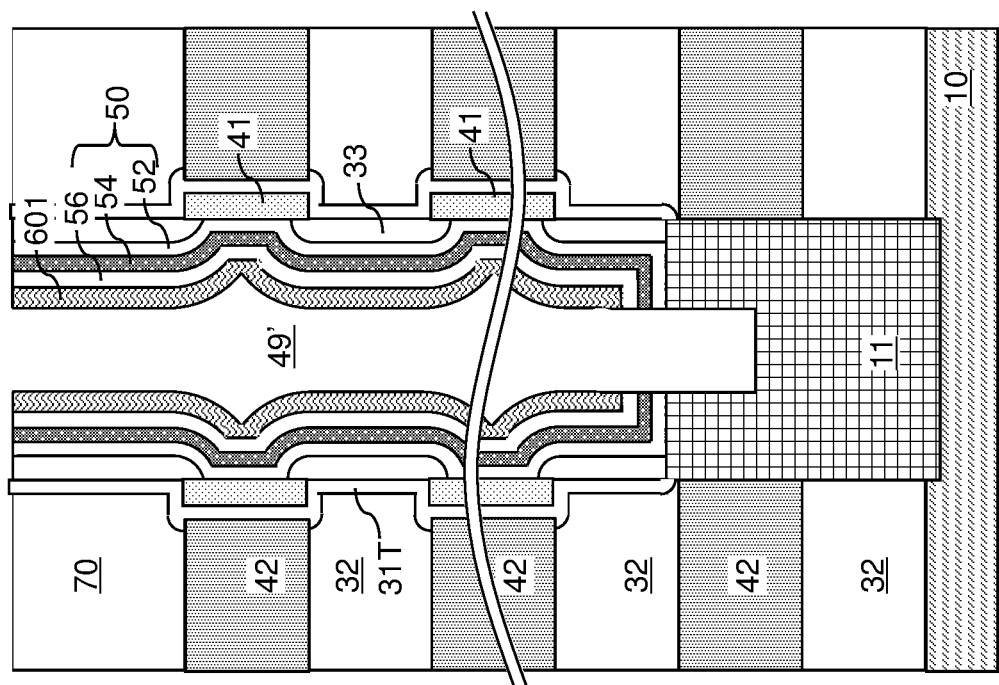

Referring to FIG. 13G, the processing steps of FIG. 5G can be performed to sequentially anisotropically etch the optional sacrificial cover material layer 601, the dielectric material liner 56, the memory material layer 54, the blocking dielectric layer 52, and a horizontally-extending portion of the continuous insulating material layer 33C overlying the insulating cap layer 70 employing at least one anisotropic etch process. The portions of the sacrificial cover material layer 601, the dielectric material liner 56, the memory material layer 54, the blocking dielectric layer 52, and the continuous insulating material layer 33C located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, the blocking dielectric layer 52, and the continuous insulating material layer 33C can be etched by a respective anisotropic etch process employing a respective etch chemistry, which may, or may not, be the same for the various material layers.

The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, layer 601 may be retained in the final device.

Referring to FIG. 13H, the processing steps of FIG. 5H can be performed to deposit a semiconductor channel layer 60C directly on the semiconductor surface of the pedestal channel portion 11 or the semiconductor material layer 10 if the pedestal channel portion 11 is omitted, and directly on the dielectric material liner 56 (or on the sacrificial cover material layer 601 if present).

Figure 13I:
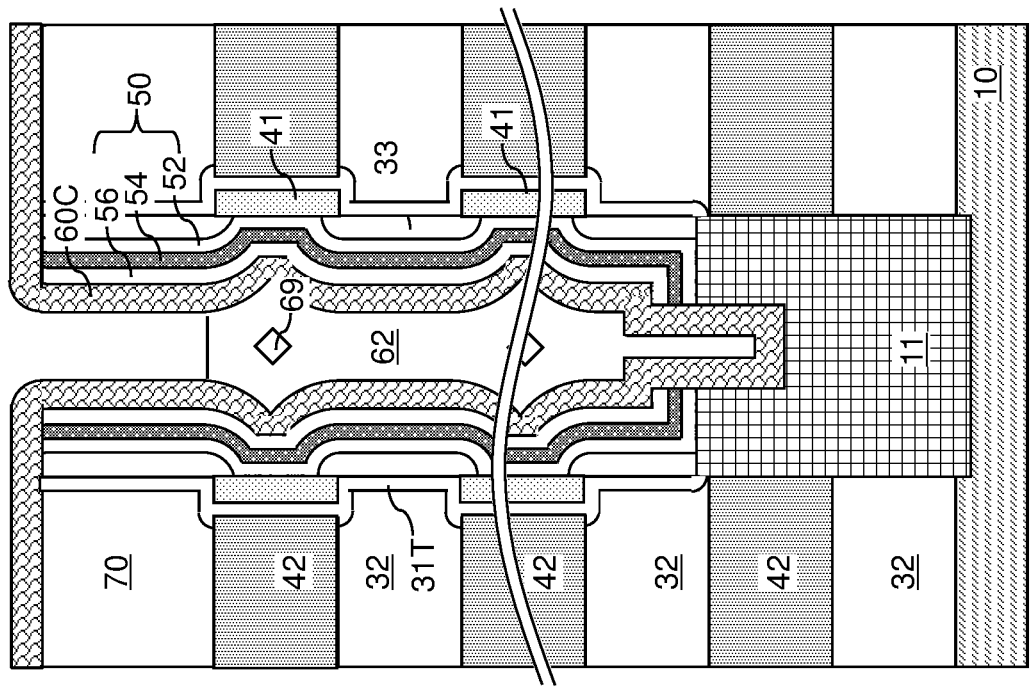

Referring to FIG. 13I, the processing step of FIG. 5I can be performed in case the memory cavity 49' in each memory opening is not completely filled by the semiconductor channel layer 60C. A dielectric core layer 62C can be deposited in the memory cavity 49' to fill any remaining portion of the memory cavity 49' within each memory opening.

Figure 13J:
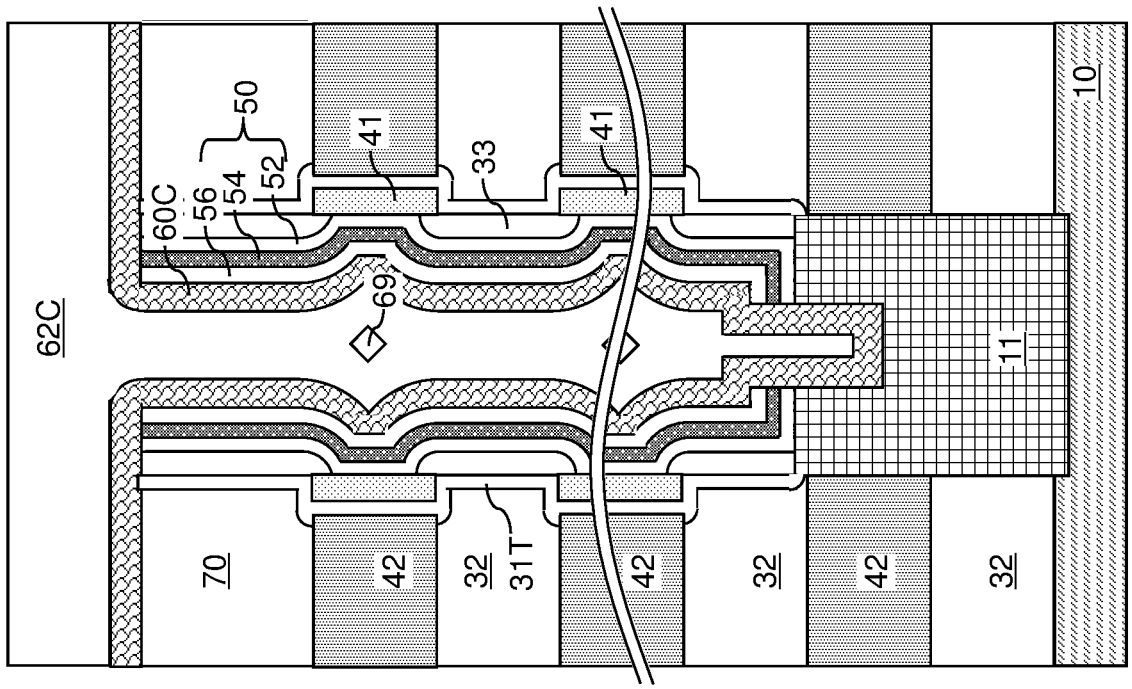

Referring to FIG. 13J, the processing steps of FIG. 5J can be performed to form a dielectric core 62 within each memory opening.

Figure 13K:
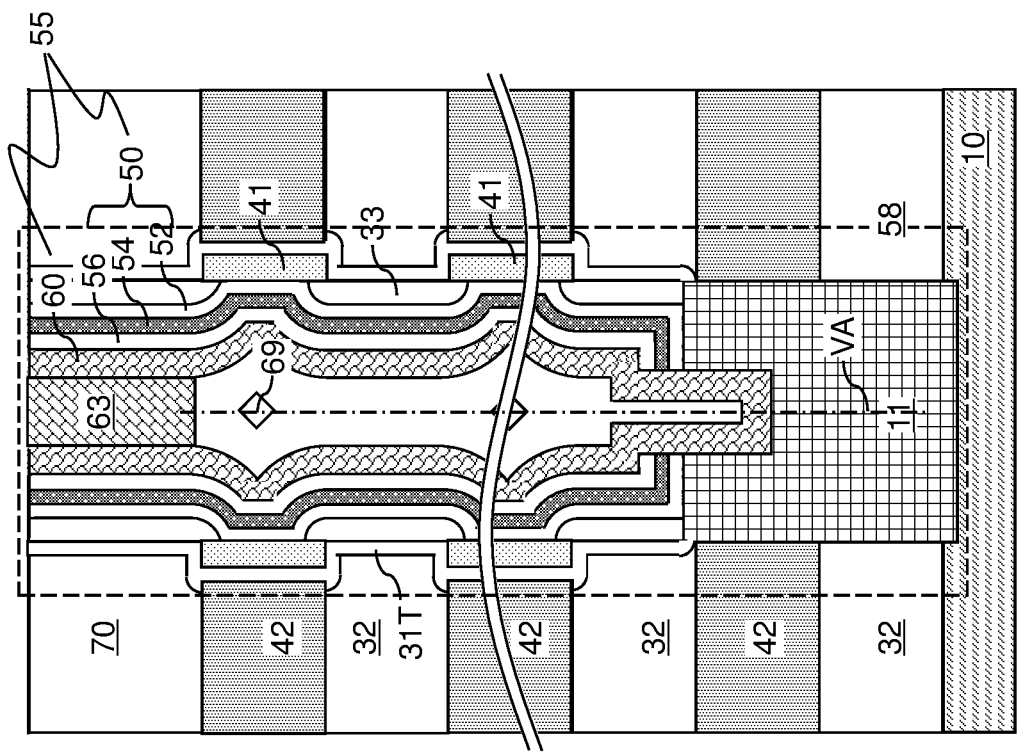

Referring to FIG. 13K, the processing steps of FIG. 5K can be performed to form a drain region 63 and a vertical semiconductor channel 60 within each memory opening.

The dielectric material liner 56 is surrounded by the memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, an optional dielectric material liner 56, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises a tubular silicon oxide liner 31T, a vertical stack of dielectric metal oxide portions 41, a vertical stack of insulating material portions 33, and a memory material layer 54 and a vertical semiconductor channel 60 that are sequentially formed over the vertical stack of insulating material portions 33. A dielectric material liner 56 may laterally surround the vertical semiconductor channel 60. The memory material layer 54 can have a laterally-undulating vertical cross-sectional profile and can laterally surround the dielectric material liner 56. Each insulating material portion 33 within the vertical stack of insulating material portions 33 comprises a respective vertical cylindrical outer sidewall contacting a respective one of the insulating layers 32, and a respective inner sidewall including at least one annular concave surface segment adjoined to a top edge or a bottom edge of the respective vertical cylindrical sidewall.

Each insulating material portion 33 within the vertical stack of insulating material portions 33 comprises a respective vertical cylindrical outer sidewall that is laterally spaced by a uniform distance from a respective one of the insulating layers 32 by a respective tubular silicon oxide liner 31T. Each insulating material portion 33 within the vertical stack of insulating material portions 33 comprises a respective inner sidewall including at least one annular concave surface segment adjoined to a top edge or a bottom edge of the respective vertical cylindrical sidewall.

Figure 14:
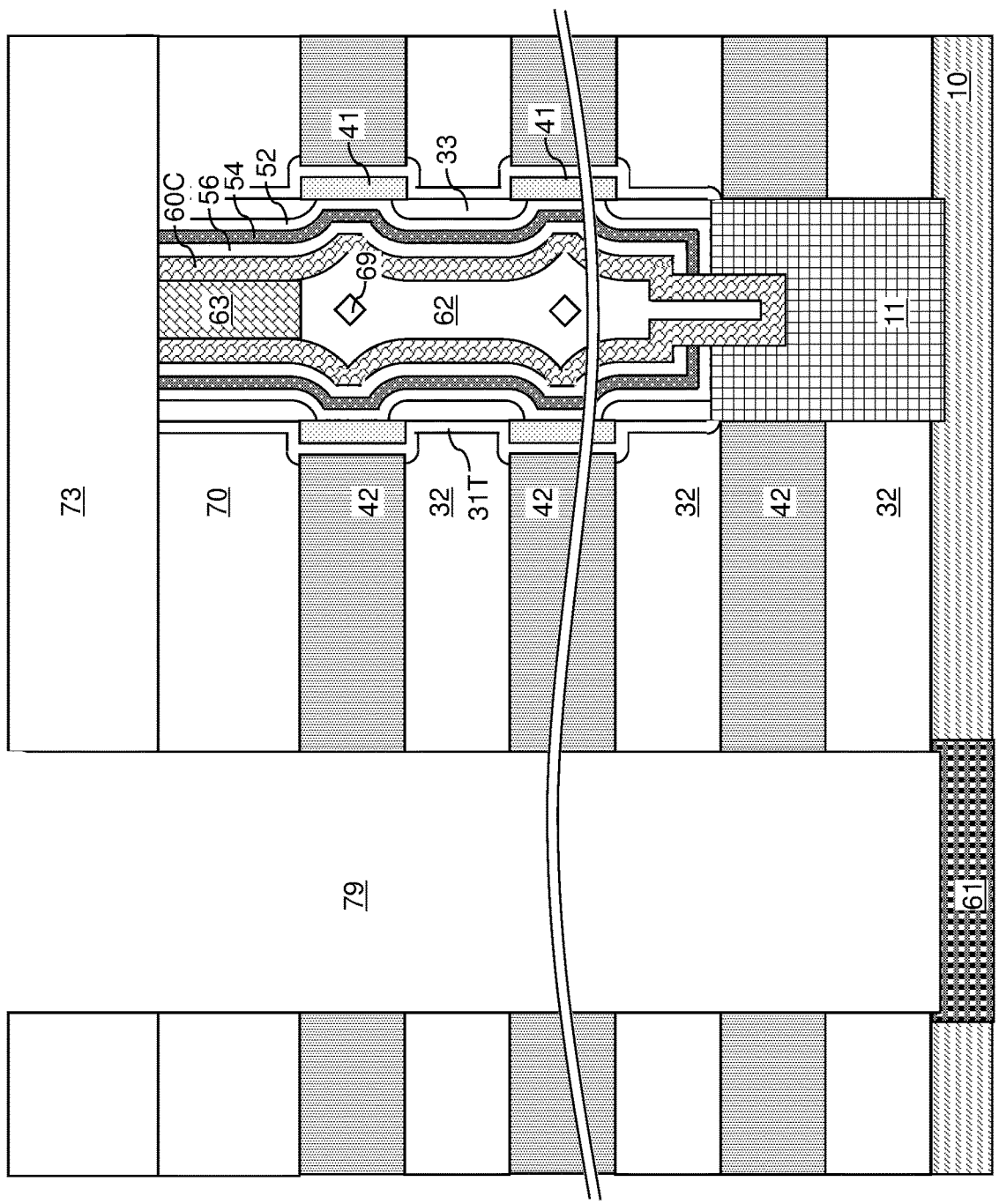
FIG. 14 is a vertical cross-sectional view of a region of the second exemplary structure after formation of backside trenches according to the second embodiment of the present disclosure.

Referring to FIG. 14, the processing steps of FIGS. 7A-7C can be subsequently performed to form backside trenches 79 and source regions 61.

Figure 15:
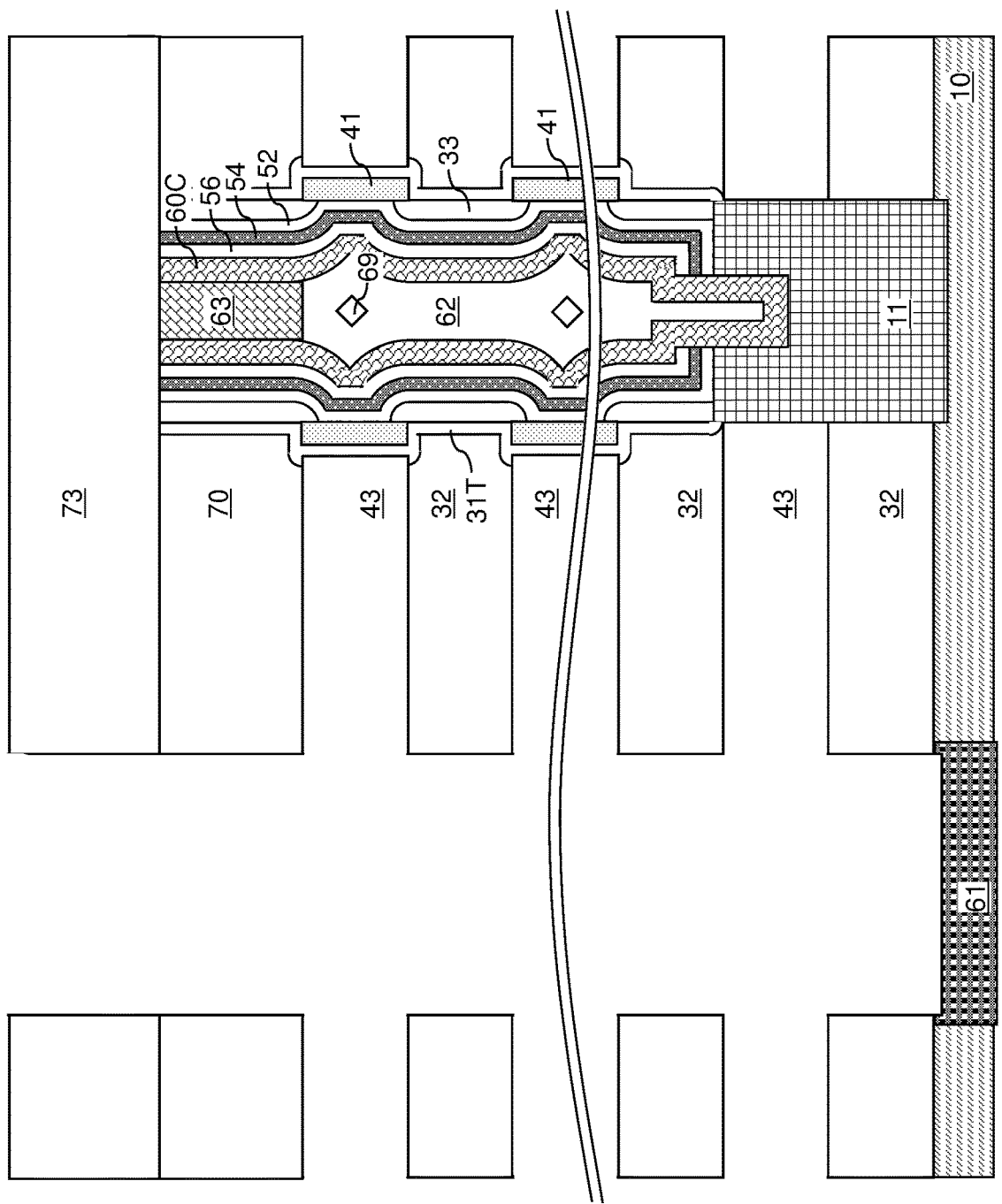
FIG. 15 is a vertical cross-sectional view of a region of the second exemplary structure after formation of backside recesses according to the second embodiment of the present disclosure.

Referring to FIG. 15, the processing steps of FIGS. 8A and 8B can be performed to form backside recesses 43 by removing the sacrificial material layers 42 selective to the insulating layers 32, the insulating cap layer 70, the contact-level dielectric layer 73, the source regions 61, and the tubular silicon oxide liners 31T. For example, if the sacrificial material layers 42 comprise silicon nitride, a wet etch process employing hot phosphoric acid can be performed to remove the sacrificial material layers 42. Surface segments of the outer sidewall of each tubular silicon oxide liner 31T can be physically exposed to the backside recesses 43.

Figure 16:
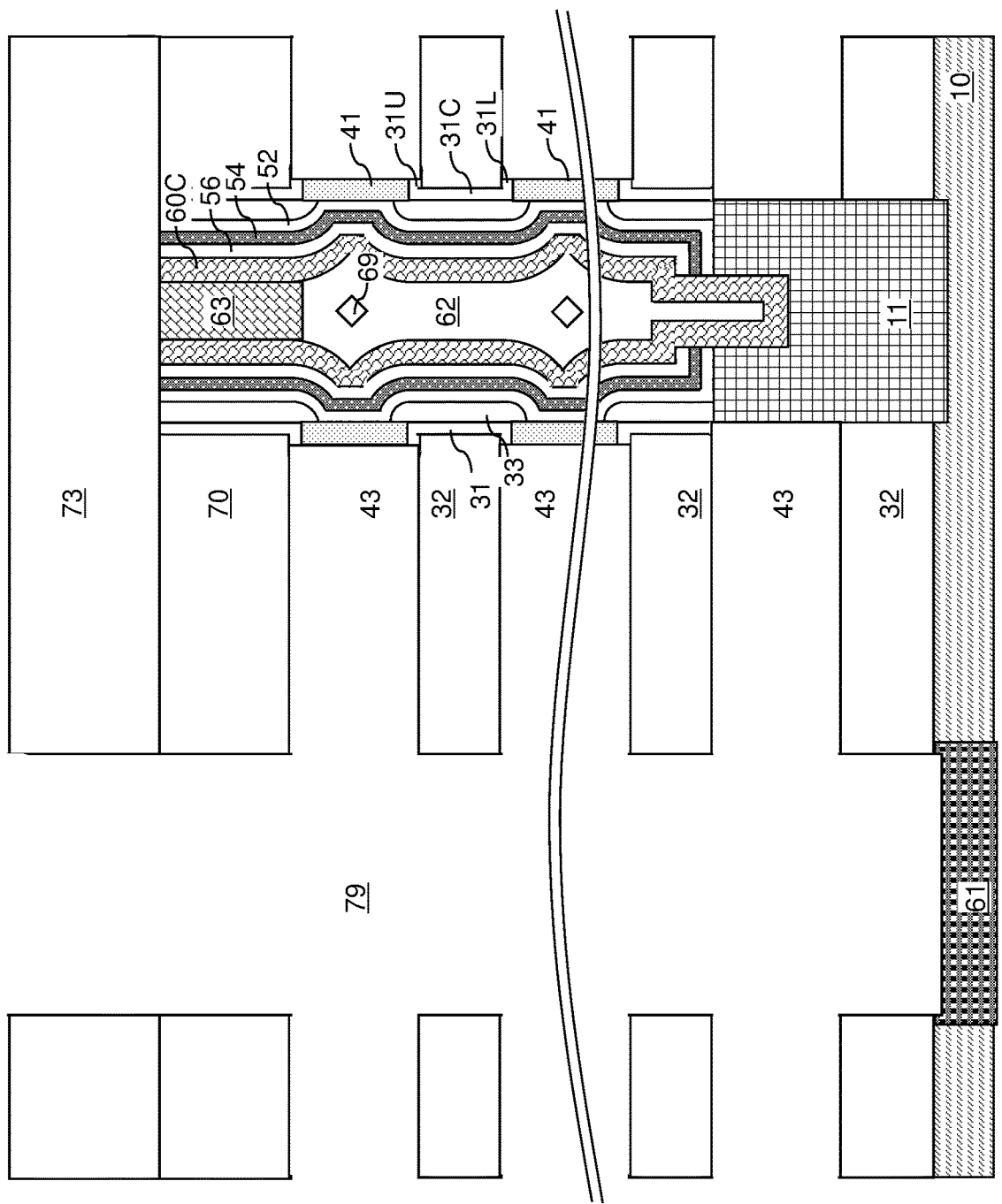
FIG. 16 is a vertical cross-sectional view of a region of the second exemplary structure after dividing each silicon oxide liner into a vertical stack of silicon oxide portions according to the second embodiment of the present disclosure.

Referring to FIG. 16, an isotropic etch process can be performed to remove physically exposed portions of the tubular silicon oxide liners 31T at each level of the backside recesses 43. For example, a wet etch process employing dilute hydrofluoric acid can be performed to remove portions of the tubular silicon oxide liners 31T located at the levels of the backside recesses 43. Each tubular silicon oxide liner 31T is divided into discrete silicon oxide portions 31 located at a level of a respective one of the insulating layers 32 or at the level of the insulating cap layer 70. Surfaces of the insulating layers 32 and the insulating cap layer 70 can be collaterally recessed during the isotropic etch process.

Each silicon oxide portion 31 other than the topmost one and the bottommost one of the silicon oxide portions 31 can have a tubular configuration, and can comprise respective portions 31C, 31U, 31L which respectively contact a cylindrical side surface, an upper annular surface segment, and a lower annular surface segment of a respective one of the insulating layers 32. Further, each silicon oxide portion can contact a portion of a cylindrical outer sidewall of a respective one of the insulating material portions 33. An outer cylindrical sidewall of each dielectric metal oxide portion 41 can be physically exposed to a respective one of the backside recesses 43. The dielectric metal oxide portions 41 can function as a backside blocking dielectric material.

Figure 17:
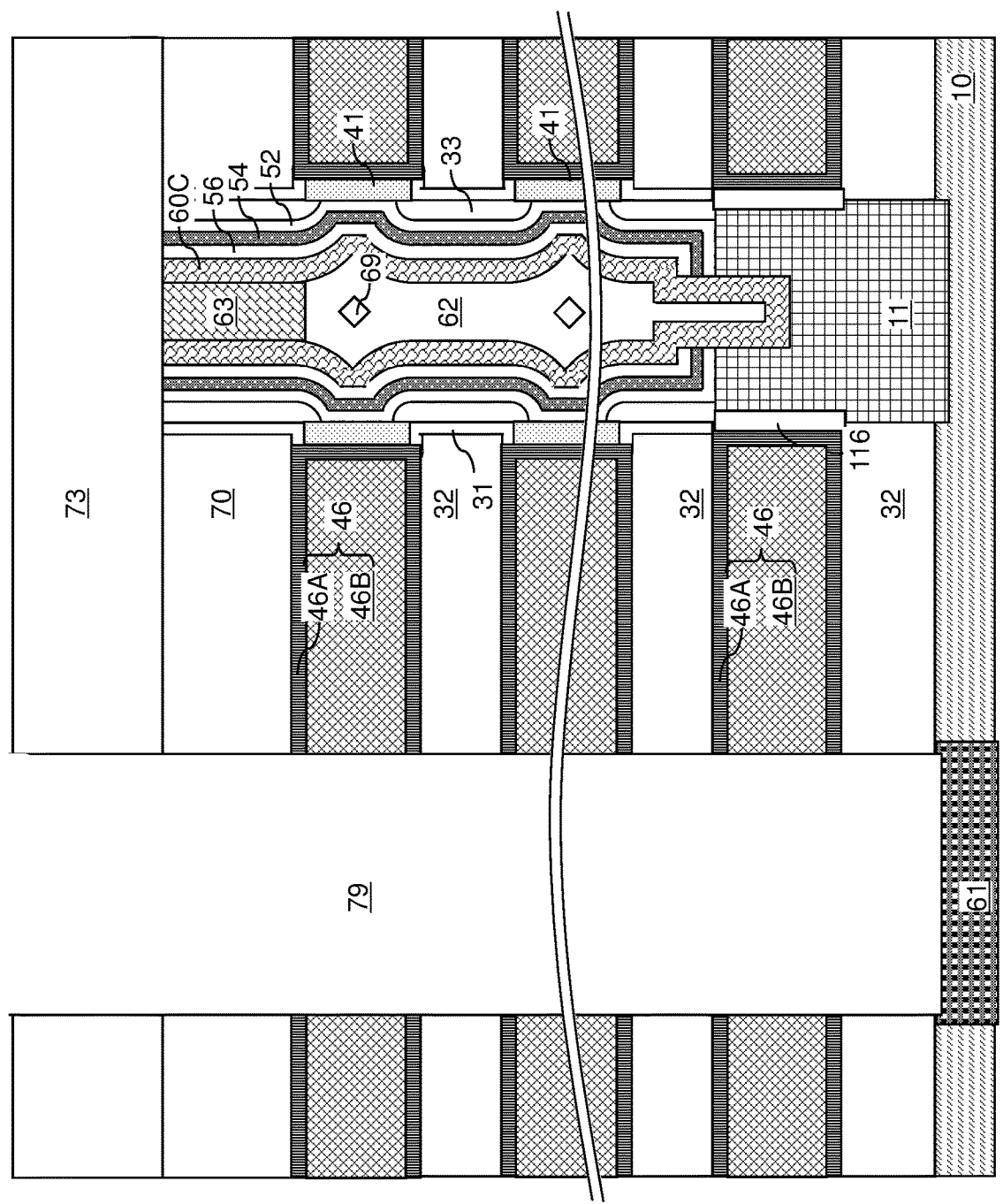
FIG. 17 is a vertical cross-sectional view of a region of the second exemplary structure after formation of electrically conductive layers according to the second embodiment of the present disclosure.

Referring to FIG. 17, an oxidation process can be performed to form tubular dielectric spacers 116 and planar dielectric portions 616. Subsequently, the processing steps of FIGS. 10A and 10B can be performed with omission of the processing step for formation of the backside blocking dielectric layers 44. Thus, the electrically conductive layers 46 can be formed directly on the outer sidewalls of the dielectric metal oxide portions 41 and directly on horizontal surfaces of the insulating layers 32.

Figure 18A:
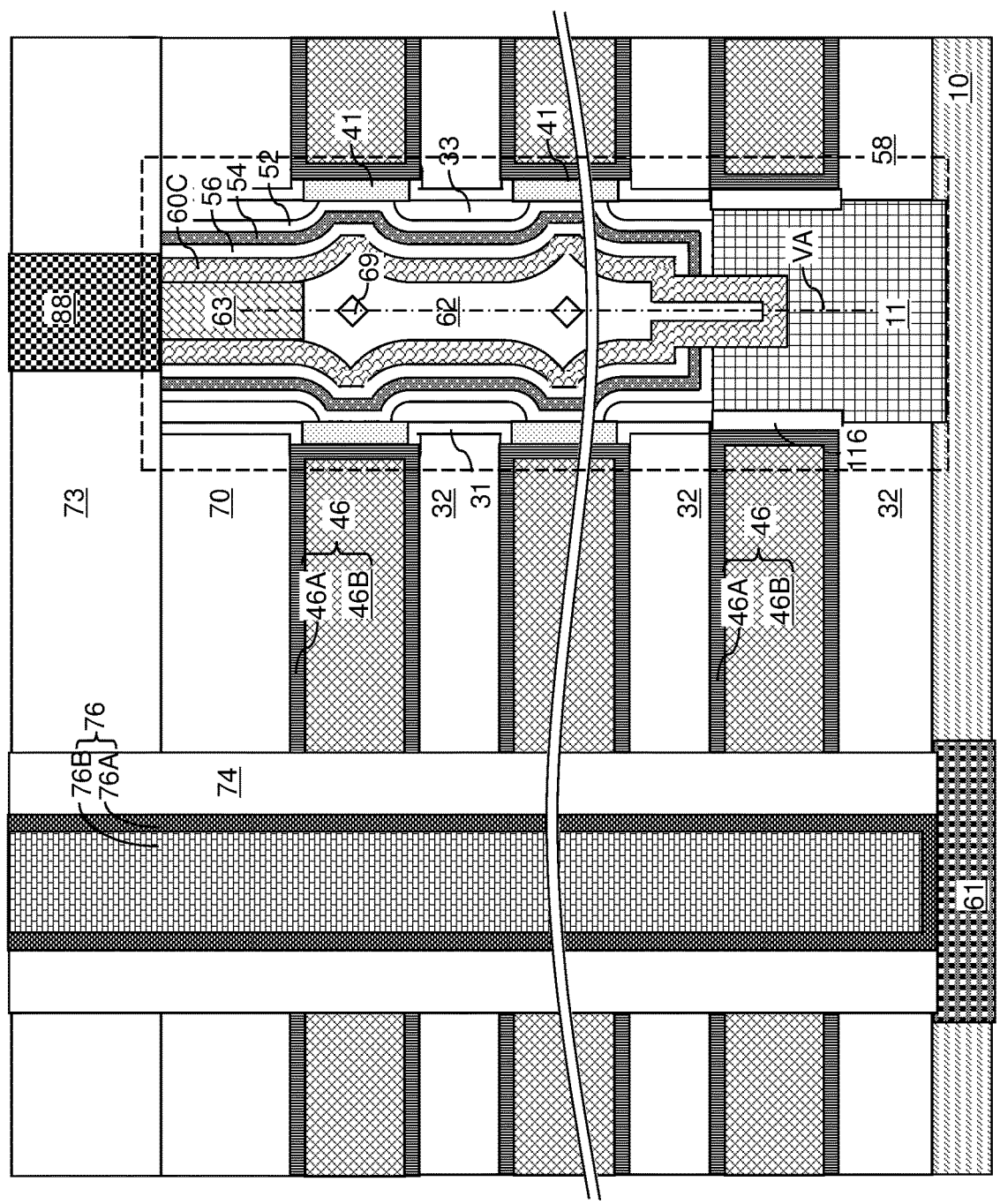
FIG. 18A is a vertical cross-sectional view of a region of the second exemplary structure after formation of backside contact via structures and additional contact via structures according to the second embodiment of the present disclosure.

Referring to FIG. 18A, the processing steps of FIGS. 11, 12A, and 12B can be performed to form insulating spacers 74 and various contact via structures (76, 88, 86, 8P).

Figure 18B:
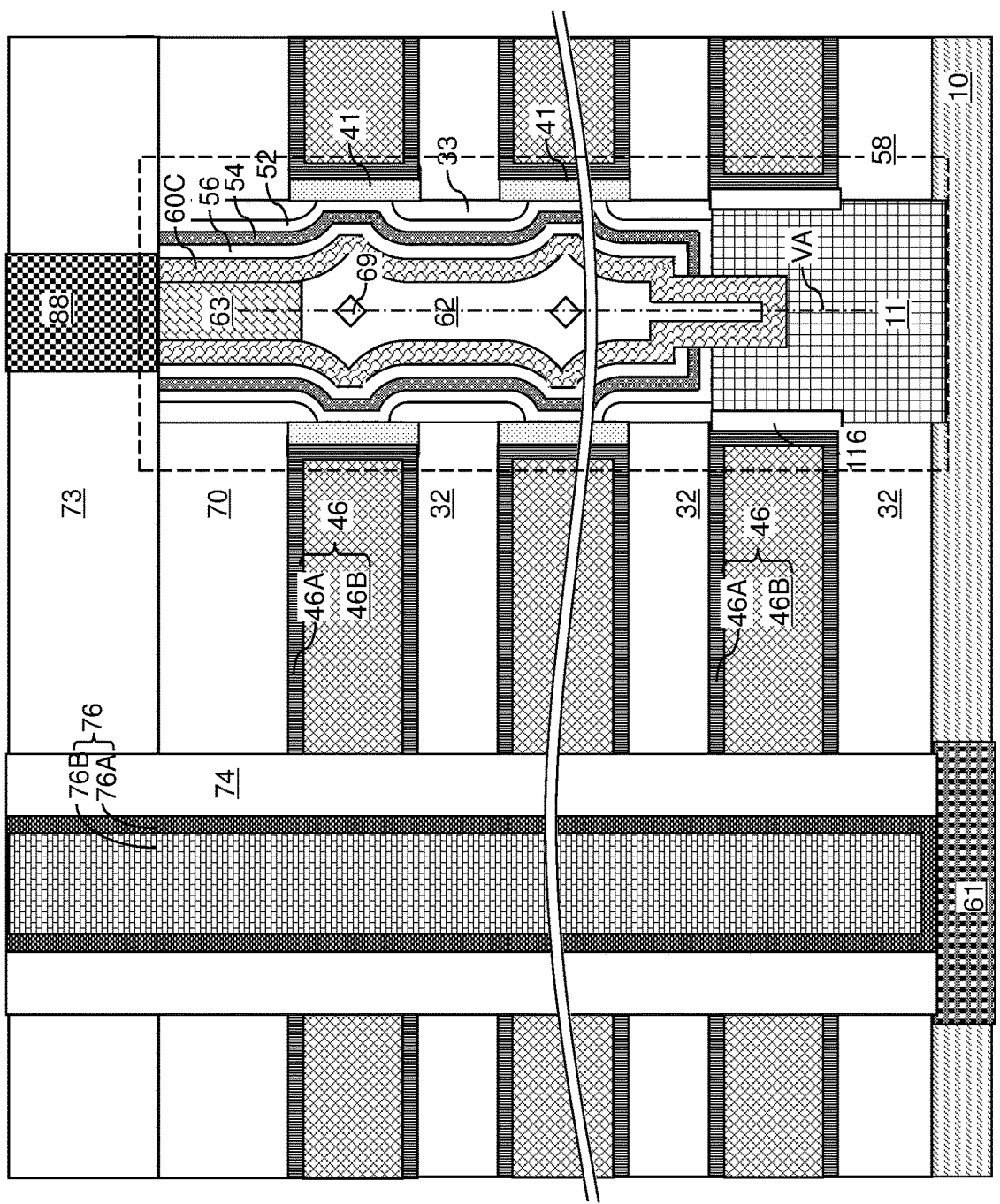
FIG. 18B is a vertical cross-sectional view of a region of an alternative configuration of the second exemplary structure after formation of backside contact via structures and additional contact via structures according to the second embodiment of the present disclosure.

Referring to FIG. 18B, an alternative embodiment of the second exemplary structure can be derived from the second exemplary structure by omitting isotropic recessing of the insulating layers 32 at the processing steps of FIG. 13B and by omitting formation of a continuous silicon oxide liner 31C at the processing steps of FIG. 13C. Alternatively, the alternative embodiment of the second exemplary structure can be derived from the first exemplary structure of FIGS. 8A and 8B by omitting the processing steps of FIGS. 9A and 9B and by omitting formation of the backside blocking dielectric layer 44. The dielectric metal oxide portions 41 can function as a backside blocking dielectric material.

Referring collectively to FIGS. 18A and 18B, portions of the memory material layer 54 located at levels of the sacrificial material layers 42 laterally protrude outward relative to portions of the memory material layer 54 located at levels of the insulating layers 32 from a vertical axis VA passing through a geometrical center of the memory opening fill structure 58, i.e., the center of gravity of a hypothetical object filling the entire volume of the memory opening fill structure 58 and having a uniform density throughout.

In one embodiment, each memory opening fill structure 58 comprises a blocking dielectric layer 52 contacting an entirety of the inner sidewalls of the vertical stack of insulating material portions 33 and contacting an entirety of an outer sidewall of the memory material layer 54. In one embodiment, the memory opening fill structure 58 comprises a vertical stack of backside blocking dielectric portions (comprising the dielectric metal oxide portions 41) located at levels of the electrically conductive layers 46 and contacting segments of an outer sidewall of the blocking dielectric layer 52 that are not in contact with the vertical stack of insulating material portions 33.

In one embodiment, each of the backside blocking dielectric portions (comprising a dielectric metal oxide portion 41) has a shape having a vertical cross-sectional profile of a rectangle and contacts a cylindrical sidewall of a respective one of the electrically conductive layers 46. In one embodiment, the memory opening fill structure 58 comprises a vertical stack of silicon oxide portions 31 contacting an outer sidewall of a respective one of the insulating material portions 33 and contacting a cylindrical sidewall of a respective one of the insulating layers 32 and vertically interlaced with the vertical stack of backside blocking dielectric portions (which is a vertical stack of dielectric metal oxide portions 41) as illustrated in FIG. 18A.

Referring collectively to FIGS. 1-18B, a memory device is provided, which comprises: an alternating stack of insulating layers 32 and electrically conductive layers 46; a memory opening 49 vertically extending through the alternating stack (32, 46), and a memory opening fill structure 58 located in the memory opening 49 and comprising a vertical semiconductor channel 60, a memory material layer 54 having a laterally-undulating vertical cross-sectional profile and laterally surrounding the vertical semiconductor channel 60, and a vertical stack of insulating material portions 33 which protrude from the insulating layers 32 into the memory opening 49.

In one embodiment shown in FIGS. 5E and 13E, each insulating material portion 33 within the vertical stack of insulating material portions 33 comprises a respective vertical cylindrical outer sidewall 33OS contacting or laterally spaced by a uniform distance from a respective one of the insulating layers 32, and a respective inner sidewall including segment 32IS and at least one annular concave surface segment (32UC, 32LC) adjoined to a top edge or a bottom edge of the respective vertical cylindrical outer sidewall 32OS.

In one embodiment, portions of the memory material layer 54 located at levels of the electrically conductive layers 46 laterally protrude outward relative to portions of the memory material layer 54 located at levels of the insulating layers 32 from a vertical axis VA passing through a geometrical center of the memory opening fill structure 58.

In one embodiment, each of the electrically conductive layers 46 is vertically spaced the memory opening fill structure 58 and from an overlying one or an underlying one of the insulating layers 32 by a respective backside blocking dielectric layer 44. One of the backside blocking dielectric layers 44 contacts an upper portion of a cylindrical outer sidewall of one of the insulating material portions 33, a cylindrical segment of an outer sidewall of the blocking dielectric layer 52, and a lower portion of a cylindrical outer sidewall of another of the insulating material portions 33. In one embodiment, the respective vertical cylindrical outer sidewall 33OS of each insulating material portion 33 contacts a cylindrical sidewall of the respective one of the insulating layers 32 and a segment of a cylindrical sidewall of a respective one of the backside blocking dielectric layers 44.

In the second embodiment, the memory opening fill structure 58 further comprises a vertical stack of metal oxide backside blocking dielectric portions 41 located at levels of the electrically conductive layers 46 and contacting segments of an outer sidewall of the blocking dielectric layer 52 that are not in contact with the vertical stack of insulating material portions 33.

According to an aspect of the present disclosure, a third exemplary structure can be provided, which can be the same as the first exemplary structure up to the processing steps of FIG. 5B. Subsequently, modifications are made to the sequence of processing steps for forming memory opening fill structures 58 and the support pillar structures 20.

FIGS. 19A-19M are sequential schematic vertical cross-sectional views of a memory opening within the third exemplary structure during formation of a memory opening fill structure 58 according to a third embodiment of the present disclosure.

Figure 19A:
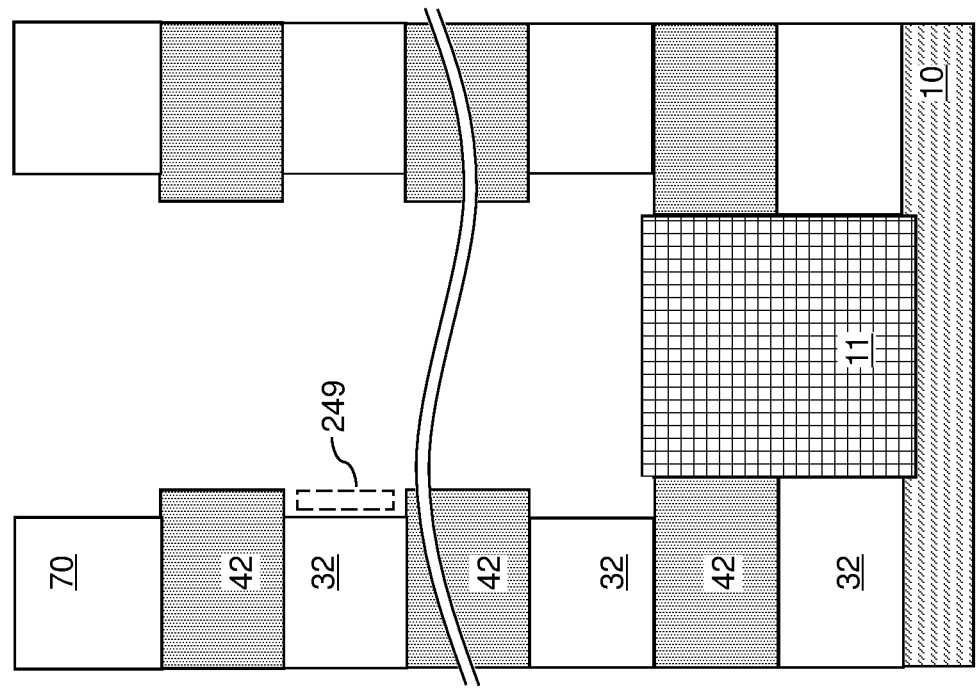

Referring to FIG. 19A, the third exemplary structure can have the same structure as the first exemplary structure of FIG. 5B.

Figure 19B:
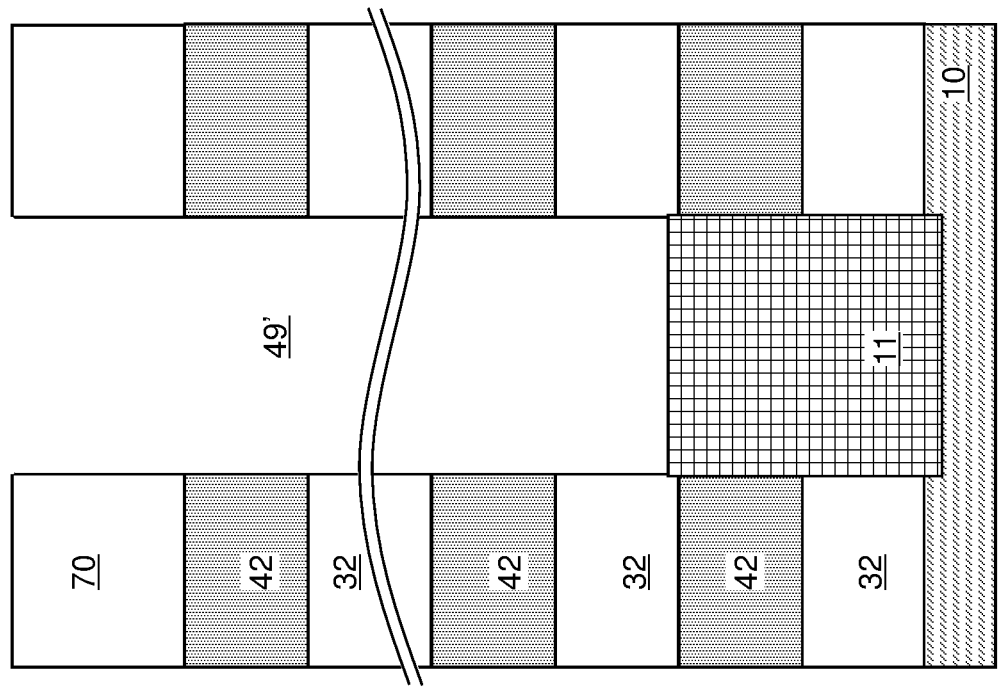

Referring to FIG. 19B, lateral recesses 249 are formed at levels of the insulating layers 32 by laterally recessing the insulating layers 32 selective to the sacrificial material layers 42 around each memory opening 49 employing an isotropic etch process. For example, if the sacrificial material layers comprise silicon nitride and if the insulating layers 32 and the insulating cap layer 70 comprise a silicon oxide material (such as undoped silicate glass), a wet etch process employing dilute hydrofluoric acid may be performed to laterally recess physically exposed surfaces of the insulating layers 32 and the insulating cap layer 70 relative to the physically exposed surfaces of the sacrificial material layers 42. In one embodiment, the lateral recess distance of the isotropic etch process may be in a range from 5 nm to 100 nm, such as from 20 nm to 60 nm, although lesser and greater lateral recess distances may also be employed.

Figure 19D:
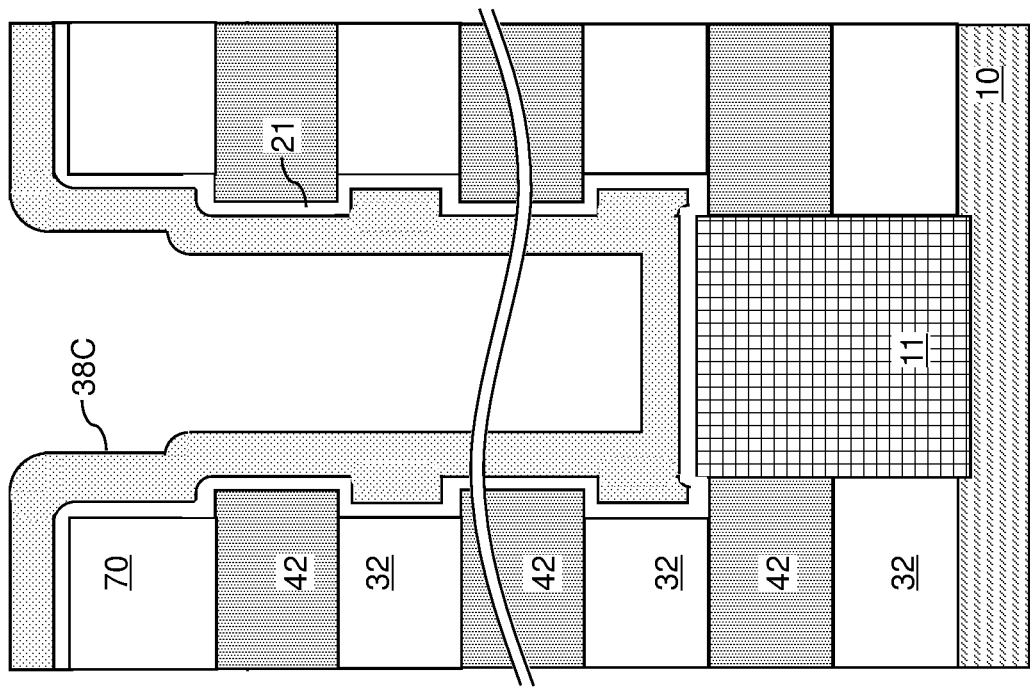
Figure 19C:
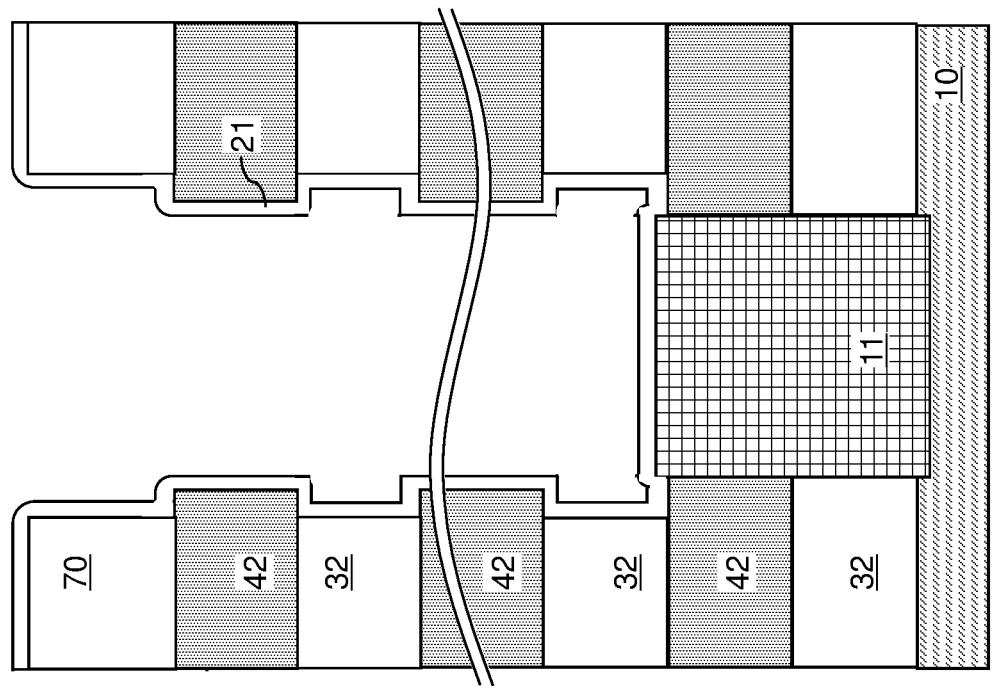

Referring to FIG. 19C, a silicon oxide liner 21 can be formed on physically exposed surfaces of the alternating stack (32, 42) around each memory opening 49. The silicon oxide liner 21 includes a silicon oxide material such as undoped silicate glass or a doped silicate glass, and can be formed by a conformal deposition process such as a chemical vapor deposition process. The thickness of the silicon oxide liner 21 can be in a range from 2 nm to 20 nm, such as from 4 nm to 10 nm, although lesser and greater thicknesses may also be employed.

Referring to FIG. 19D, an outer insulating spacer material layer 38C can be conformally deposited in annular recesses located at levels of the insulating layers 32 around each memory opening. The outer insulating spacer material layer 38C includes an outer insulating spacer material that is different from the material of the silicon oxide liner 21, and allows a selective growth process for another dielectric material (which is referred to as an inner insulating spacer material) from physically exposed surfaces thereof while suppressing growth of the an inner insulating spacer material from the physically exposed surfaces of the silicon oxide liner 21. The outer insulating spacer material layer 38C fills the entirety of volumes of the lateral recesses around each memory opening 49.

In one embodiment, the outer insulating spacer material comprises a first silicon oxycarbide material. As used herein, a silicon oxycarbide material refers to any dielectric material having a material composition of $SiC_{x1}O_{y1}H_{z1}$, in which x1 is in a range from 0.2 to 1, y1 is in a range from 0.4 to 2.0, and z1 is in a range from 0 to 0.5. In one embodiment, the value for 2×1+y1 may be in a range from 0.5 to 1.2, such as from 0.7 to 1.1 and/or from 0.9 to 1.05. In one embodiment, the value for z1 may be zero, or may be a non-zero number greater than 0 and less than 0.5, such as from 0.01 to 0.4 and/or from 0.05 to 0.3. The first silicon oxycarbide material can be deposited by a chemical vapor deposition process or an atomic layer deposition process employing an organosilicon precursor gas containing silicon and carbon and an oxygen source gas. Exemplary organosilicon precursor gases include, but are not limited to, hexamethyldisiloxane (HMDSO), dimethylsilane (DMS), or tetramethylsilane (TMS). Exemplary oxygen source gases include ozone, oxygen gas ($O_2$), or nitrous oxide ($N_2O$). The thickness of a deposited outer insulating spacer material layer 38C over sidewalls of the insulating layers 32 may be greater than one half of the thickness of each sacrificial material layer 42. For example, the thickness of the deposited outer insulating spacer material layer may be in a range from 10 nm to 40 nm, such as from 15 nm to 30 nm, although lesser and greater thicknesses may also be employed.

Figure 19E:
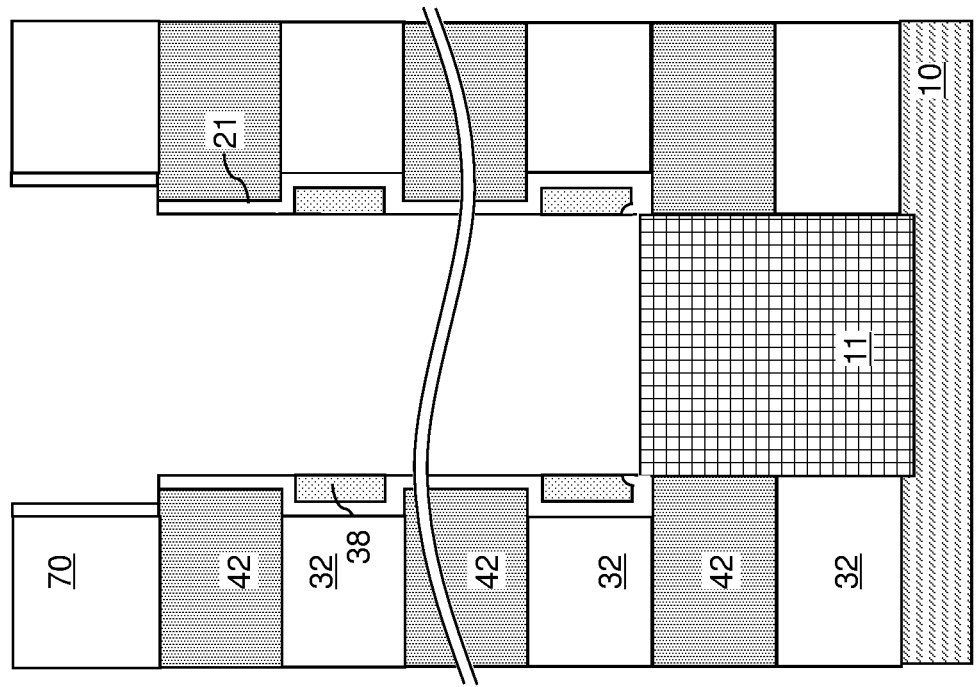

Referring to FIG. 19E, portions of the outer insulating spacer material layer 38C that are located outside the lateral recesses can be removed by performing an etch back process. For example, if the outer insulating spacer material layer 38C includes the first silicon oxycarbide material, an ashing process employing oxygen plasma can be performed to convert surface portions of the outer insulating spacer material layer 38C into a silicon oxide material including carbon at a lesser atomic concentration than the first silicon oxycarbide material. The duration and the plasma intensity of the ashing process can be selected such that the lateral thickness of the portions of the outer insulating spacer material layer 38C that are converted into silicon oxide (with significantly lower atomic concentration of carbon) is about the same as the thickness of the outer insulating spacer material layer 38C over sidewalls of the insulating layers 32.

A wet etch process can be performed to remove portions of the outer insulating spacer material layer 38C having a lower atomic concentration of oxygen atoms than the first silicon oxycarbide material. The wet etch process can employ, for example, dilute hydrofluoric acid and/or phosphoric acid. The duration of the wet etch process can be selected such that the silicon oxide liner 21 is physically exposed at the levels of the sacrificial material layers, while remaining portions of the outer insulating spacer material layer 38C are present within lateral recesses in the silicon oxide liner 21 at the levels of the insulating layers.

In one embodiment, each remaining portion of the outer insulating spacer material layer 38C may have a toroidal configuration. Each remaining toroidal portion of the outer insulating spacer material layer 38C constitutes an outer insulating spacer 38. Generally, a vertical stack of outer insulating spacers 38 can be formed by depositing an outer insulating spacer material in unfilled volumes of the lateral recesses in the silicon oxide liner 21 such that the entirety of the lateral recesses are filled within the outer insulating spacer material, and by etching back portions of the outer insulating spacer material from outside the lateral recesses in the silicon oxide liner 21. The inner sidewalls of the outer insulating spacers 38 may be vertically coincident with inner sidewalls of the silicon oxide liner 21, or may be laterally recessed outward relative to vertical sidewalls containing inner sidewalls of the silicon oxide liner 21. The lateral thickness of each outer insulating spacer 38 may be in a range from 5 nm to 60 nm, such as from 10 nm to 30 nm, although lesser and greater lateral thicknesses may also be employed.

Figure 19F:
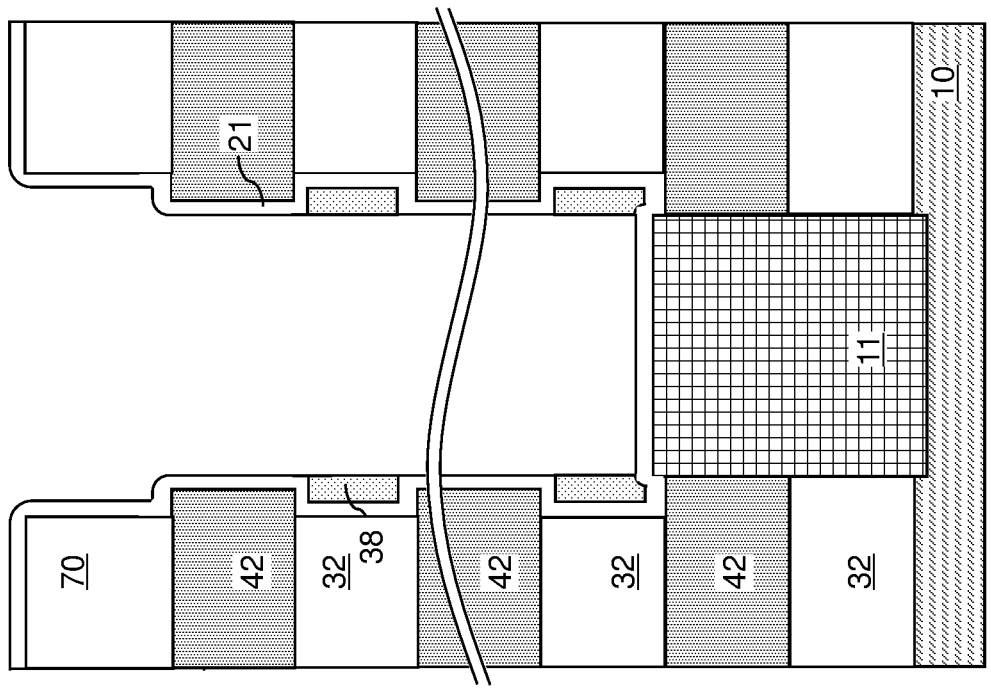
Figure 19H:
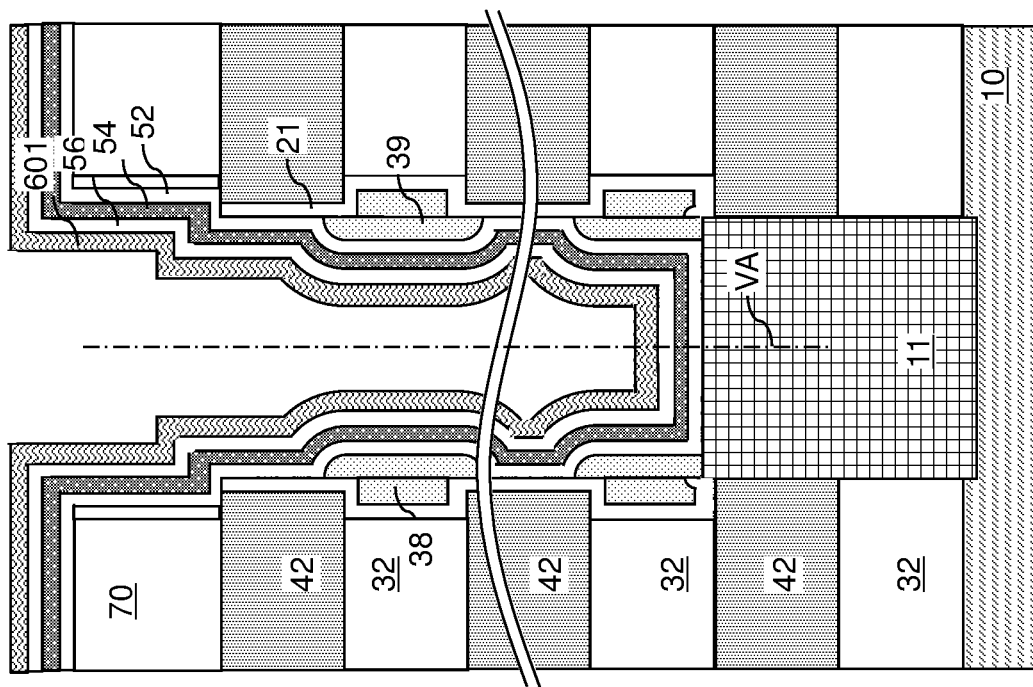

Referring to FIG. 19F, an anisotropic etch process may be optionally performed to remove horizontal portions of the silicon oxide liner 21 that overlie the insulating cap layer 70 or overlies top surfaces of the pedestal channel portions 11.

Figure 19G:
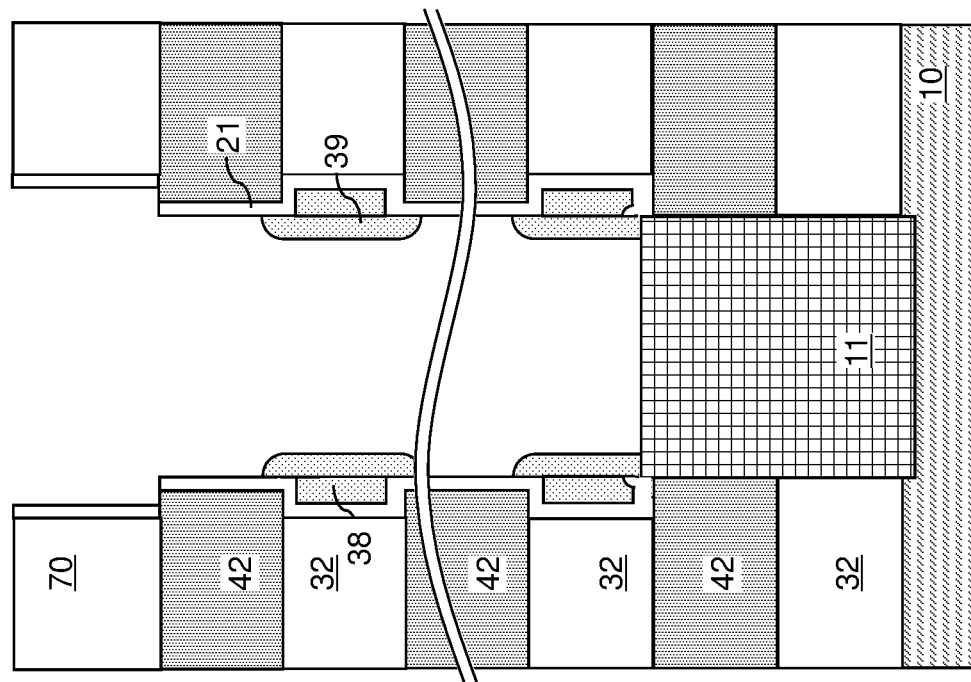

Referring to FIG. 19G, an inner insulating spacer material can be selectively grown from the physically exposed surfaces of the outer insulating spacers 38, while suppressing growth of the inner insulating spacer material from the physically exposed surfaces of the silicon oxide liner 21. Each portion of the inner insulating spacer material that is deposited on a respective one of the outer insulating spacers 38 constitutes an inner insulating spacer 39. Generally, a vertical stack of inner insulating spacers 39 can be formed by selective growing the inner insulating spacer material from physically exposed surfaces of the vertical stack of outer insulating spacers 38 while suppressing growth of the inner insulating spacer material from physically exposed surfaces of the silicon oxide liner 21.

The inner insulating spacer material includes a material selectively grows from the outer insulating spacer material while suppressing growth from the surfaces of the silicon oxide liner 21. For example, the outer insulating spacers 38 comprises a first silicon oxycarbide material, and the inner insulating spacer material comprises a second silicon oxycarbide material, which may have the same material composition as, or may have a material composition different from, the first silicon oxycarbide material.

In one embodiment, the second silicon oxycarbide material may have a material composition of $SiC_{x2}O_{y2}H_{z2}$, in which x2 is in a range from 0.2 to 1, y2 is in a range from 0.4 to 2.0, and z2 is in a range from 0 to 0.5. In one embodiment, the value for 2×2+y2 may be in a range from 0.5 to 1.2, such as from 0.7 to 1.1 and/or from 0.9 to 1.05. In one embodiment, the value for z2 may be zero, or may be a non-zero number greater than 0 and less than 0.5, such as from 0.01 to 0.4 and/or from 0.05 to 0.3. The second silicon oxycarbide material can be deposited by an area-selective deposition (ASD) process, which may be a chemical vapor deposition process or an atomic layer deposition process employing an organosilicon precursor gas containing silicon and carbon and an oxygen source gas. For example, the lateral thickness of the inner insulating spacers 39 is less than one half of the thickness of the sacrificial material layers 42 to prevent merging of vertically neighboring pairs of inner insulating spacers 39. The lateral thickness of the inner insulating spacers 39 may be in a range from 2 nm to 25 nm, such as from 4 nm to 15 nm, although lesser and greater thicknesses may also be employed. A silicon oxycarbide material layer Referring to FIG. 19H, the processing steps of FIG. 5F can be performed to form a stack of layers including an optional blocking dielectric layer 52, a memory material layer 54, a dielectric material liner 56, and an optional sacrificial cover material layer 601 in the memory openings 49. Each of the blocking dielectric layer 52, the memory material layer 54, the dielectric material liner 56, and the sacrificial cover material layer 601 can be formed with a respective contour in a vertical cross-sectional profile such that the contour of each layer replicates the contour of the inner surface of the previously deposited layer, or in the case of the optional blocking dielectric layer 52, the contour of the physically exposed surfaces of a combination of a vertical stack of inner insulating spacers 39 and the silicon oxide liner 21. Thus, each of the blocking dielectric layer 52, the memory material layer 54, the dielectric material liner 56, and the sacrificial cover material layer 601 can have a respective laterally-undulating (e.g., wavy) vertical cross-sectional profile that protrudes outward from a vertical axis passing through the geometrical center of the memory opening 49 at levels of the sacrificial material layers 42, and protrudes inward into the memory opening 49 at levels of the insulating layers 32.

Figure 19J:
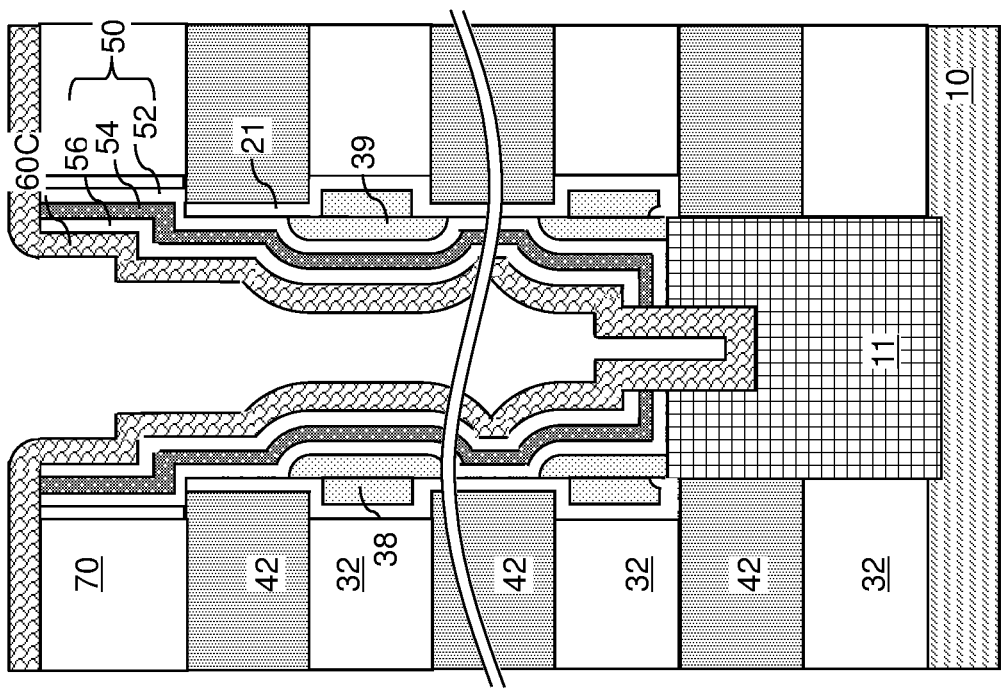
Figure 19I:
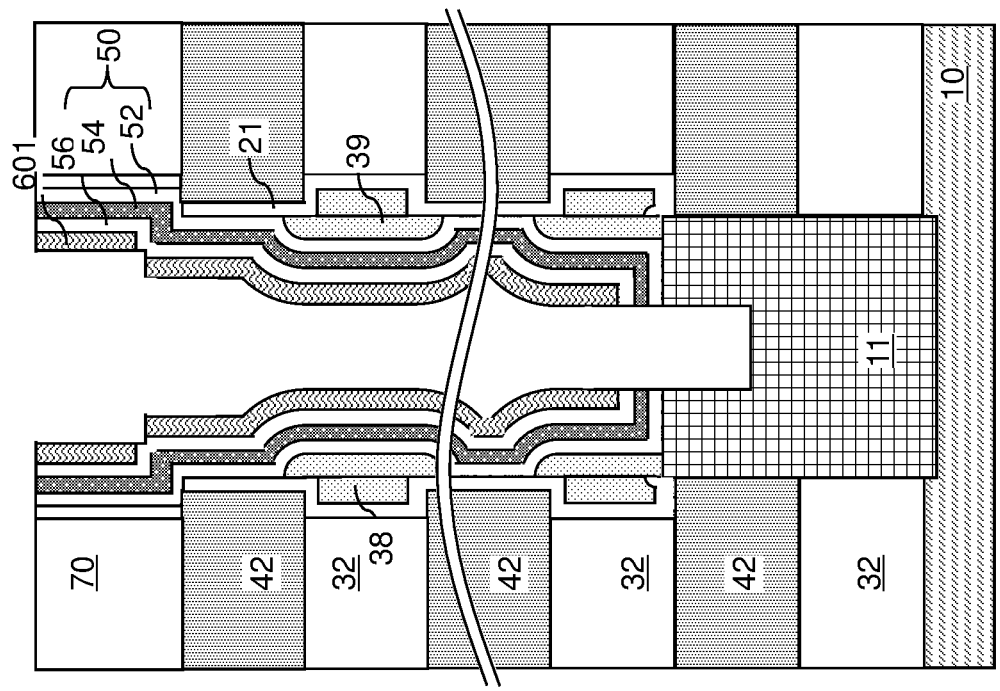

Referring to FIG. 19I, the processing steps of FIG. 5G can be performed to sequentially anisotropically etch the optional sacrificial cover material layer 601, the dielectric material liner 56, the memory material layer 54, and the blocking dielectric layer 52, overlying the insulating cap layer 70 employing at least one anisotropic etch process. The portions of the sacrificial cover material layer 601, the dielectric material liner 56, the memory material layer 54, and the blocking dielectric layer 52, located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52, can be etched by a respective anisotropic etch process employing a respective etch chemistry, which may, or may not, be the same for the various material layers.

Referring to FIG. 19J, the processing steps of FIG. 5H can be performed to form a semiconductor channel layer 60C directly on the semiconductor surface of the pedestal channel portion 11 or the semiconductor material layer 10 if the pedestal channel portion 11 is omitted, and directly on the dielectric material liner 56 (or directly on the sacrificial cover material layer 601 if the sacrificial cover material layer 601 comprises a semiconductor material which is retained in the memory device).

Referring to FIG. 19K, the processing steps of FIG. 5I can be performed in case the memory cavity 49' in each memory opening is not completely filled by the semiconductor channel layer 60C. In this case, a dielectric core layer 62C can be deposited in the memory cavity 49' to fill any remaining portion of the memory cavity 49' within each memory opening.

Referring to FIG. 19L, the processing steps of FIG. 5J can be performed to form a dielectric core 62 with each memory opening.

Figure 19M:
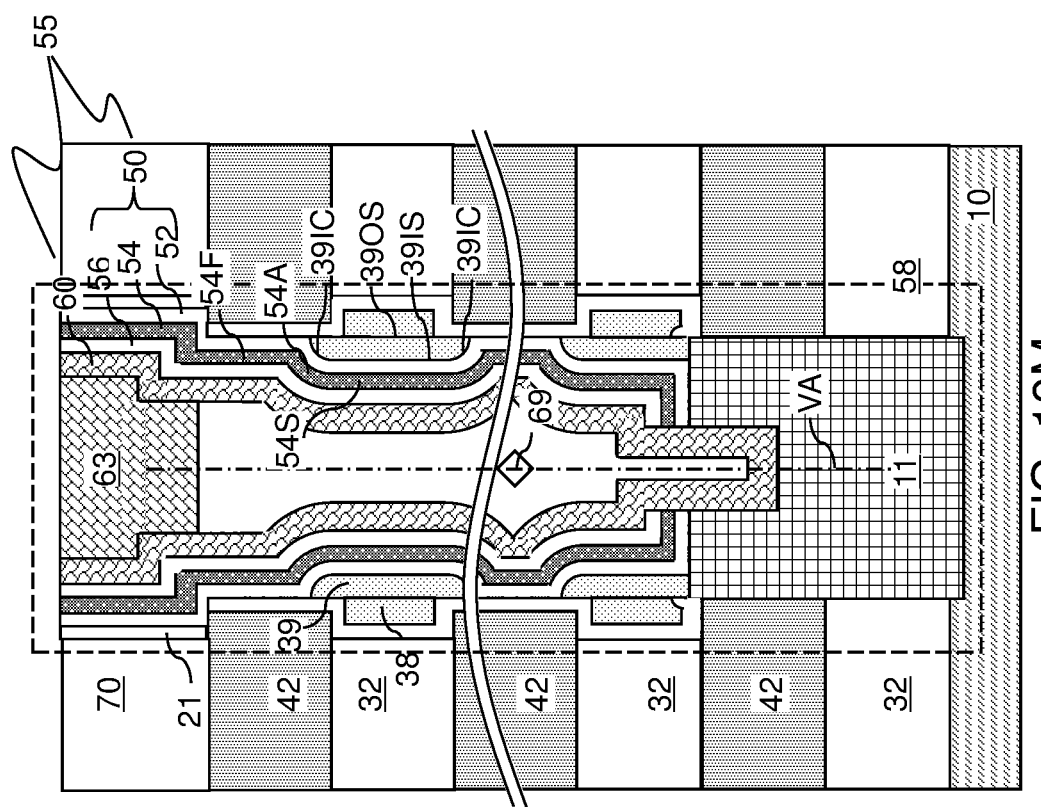

Referring to FIG. 19M, the processing steps of FIG. 5K can be performed to form a drain region 63 and a vertical semiconductor channel 60 within each memory opening.

Generally, memory opening fill structure 58 can be formed in each memory opening 49. The memory opening fill structure 58 comprises a silicon oxide liner 21, a vertical stack of outer insulating spacers 38, a vertical stack of inner insulating spacers 39, and a memory material layer 54 and a vertical semiconductor channel 60 that are sequentially formed over the vertical stack of inner insulating spacers 39. In one embodiment, a dielectric material liner 56 can laterally surround the vertical semiconductor channel 60, and a memory material layer 54 can laterally surround the dielectric material liner 56. The vertical stack of inner insulating spacers 39 can be located at levels of a plurality of insulating layers 32. In one embodiment, a vertical stack of outer insulating spacers 38 is located on a respective one of the inner insulating spacers 39 and each having a lesser vertical extent than the respective one of the inner insulating spacers 39.

In one embodiment, the memory opening fill structure 58 comprises a silicon oxide liner 21 that vertically extends continuously through a plurality of sacrificial material layers 42 and a plurality of insulating layers 32 within the alternating stack (32, 42) and laterally protruding outward from a vertical axis VA passing through a geometrical center of the memory opening fill structure 58 at the levels of the plurality of insulating layers 32 relative to portions of the silicon oxide liner 21 located at levels of the plurality of sacrificial material layers 42.

In one embodiment, the vertical stack of inner insulating spacers 39 and the vertical stack of outer insulating spacers 38 comprise materials different from silicon oxide. In one embodiment, the vertical stack of outer insulating spacers 38 comprises a first silicon oxycarbide material, and the vertical stack of inner insulating spacers 39 comprise a second silicon oxycarbide material.

In one embodiment, the memory opening fill structure 58 comprises a blocking dielectric layer 52 that vertically extends continuously through the plurality of sacrificial material layers 42 and the plurality of insulating layers 32 and laterally protruding inward toward the vertical axis VA passing through the geometrical center of the memory opening fill structure 58 at the levels of the plurality of insulating layers 32 relative to portions of the blocking dielectric layer 52 located at the levels of the plurality of sacrificial material layers 42. In one embodiment, the blocking dielectric layer 52 contacts the silicon oxide liner 21 at the levels of the plurality of sacrificial material layers 42, and is laterally spaced from the silicon oxide liner 21 at the levels of the plurality of insulating layers 32 by a combination of the vertical stack of outer insulating spacers 38 and the vertical stack of inner insulating spacers 39.

In one embodiment, each of the outer insulating spacers 38 comprises: an outer cylindrical sidewall that contacts a cylindrical segment of an inner surface of the silicon oxide liner 21, an annular top surface that contacts an annular horizontal segment of the inner surface of the silicon oxide liner 21, an annular bottom surface that contacts another annular horizontal segment of the inner surface of the silicon oxide liner 21, and an inner cylindrical sidewall that contacts an outer sidewall of a respective one of the inner insulating spacers 39.

In one embodiment, each of the inner insulating spacers 39 comprises an outer sidewall that contacts an inner sidewall of a respective one of the outer insulating spacers 38, a first cylindrical segment of an inner surface of the silicon oxide liner 21 that overlies the inner sidewall of the respective one of the outer insulating spacers 38, and a second cylindrical segment of the inner surface of the silicon oxide liner 21 that underlies the inner sidewall of the respective one of the outer insulating spacers 38.

In one embodiment, each outer insulating spacer 38 within the vertical stack of outer insulating spacers 38 has a respective vertical cross-sectional shape of a rectangle. In one embodiment shown in FIG. 19M, each inner insulating spacer 39 within the vertical stack of inner insulating spacers 39 has a respective vertical cross-sectional shape that includes a straight outer sidewall 39OS and a contoured inner sidewall that comprises a straight inner sidewall segment 39IS and at least one convex inner sidewall segment 39IC connecting the straight outer sidewall and the straight inner sidewall segment.

In one embodiment shown in FIG. 19M, each inner insulating spacer 39 within the vertical stack of inner insulating spacers 39 other than a bottommost one of the inner insulating spacers 39 comprises a cylindrical outer sidewall 39OS and a contoured inner sidewall that comprises a cylindrical inner sidewall segment 39IS, an upper annular convex segment 39IC adjoining a top periphery of the cylindrical outer sidewall and a top periphery of the cylindrical inner sidewall segment, and a lower annular convex segment 39IC adjoining a bottom periphery of the cylindrical outer sidewall and a bottom periphery of the cylindrical inner sidewall segment.

In one embodiment shown in FIG. 19M, the memory material layer 54 comprises an outer surface that comprises first cylindrical segments 54F located at levels of a plurality of sacrificial material layers 42, second cylindrical segments 54S located at the levels of the plurality of insulating layers 32, vertically interlaced with the first cylindrical segments, and laterally offset inward toward a vertical axis VA passing through a geometrical center of the memory opening fill structure 58 relative to the first cylindrical segments, and concave annular segments 54A connecting a respective vertically neighboring pair of the first cylindrical segments 54F and the second cylindrical segments 54S.

In one embodiment, the memory opening fill structure 58 comprises a tunneling dielectric layer as the dielectric material liner 56, which is located between the memory material layer 54 and the vertical semiconductor channel 60, and the memory material layer 54 comprises a charge storage layer. In this case, a vertical NAND string can be formed in the memory opening.

Figure 20:
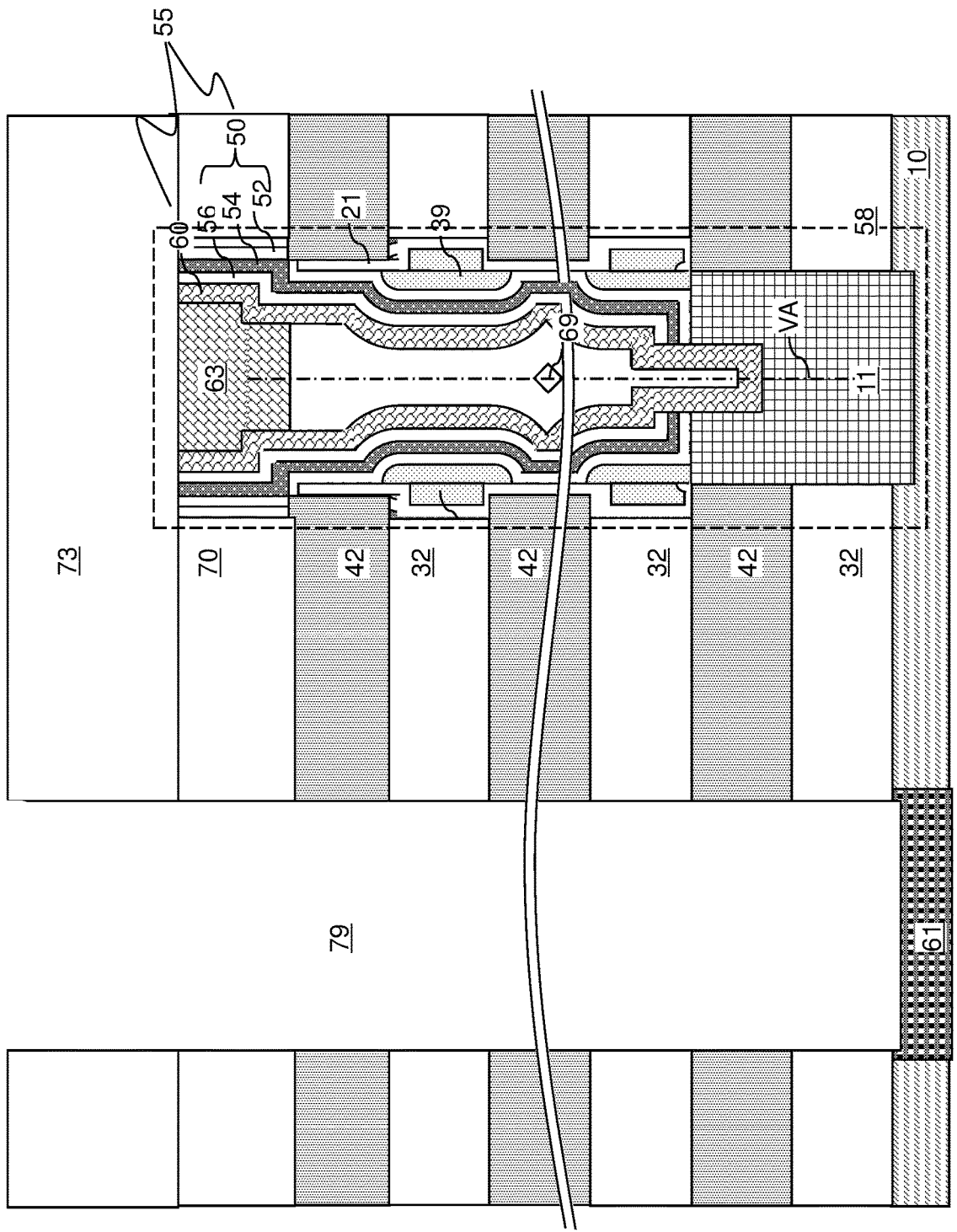
FIG. 20 is a vertical cross-sectional view of a region of the third exemplary structure after formation of backside trenches according to the third embodiment of the present disclosure.

Referring to FIG. 20, the processing steps of FIGS. 7A-7C can be subsequently performed to form backside trenches 79 and source regions 61.

Figure 21:
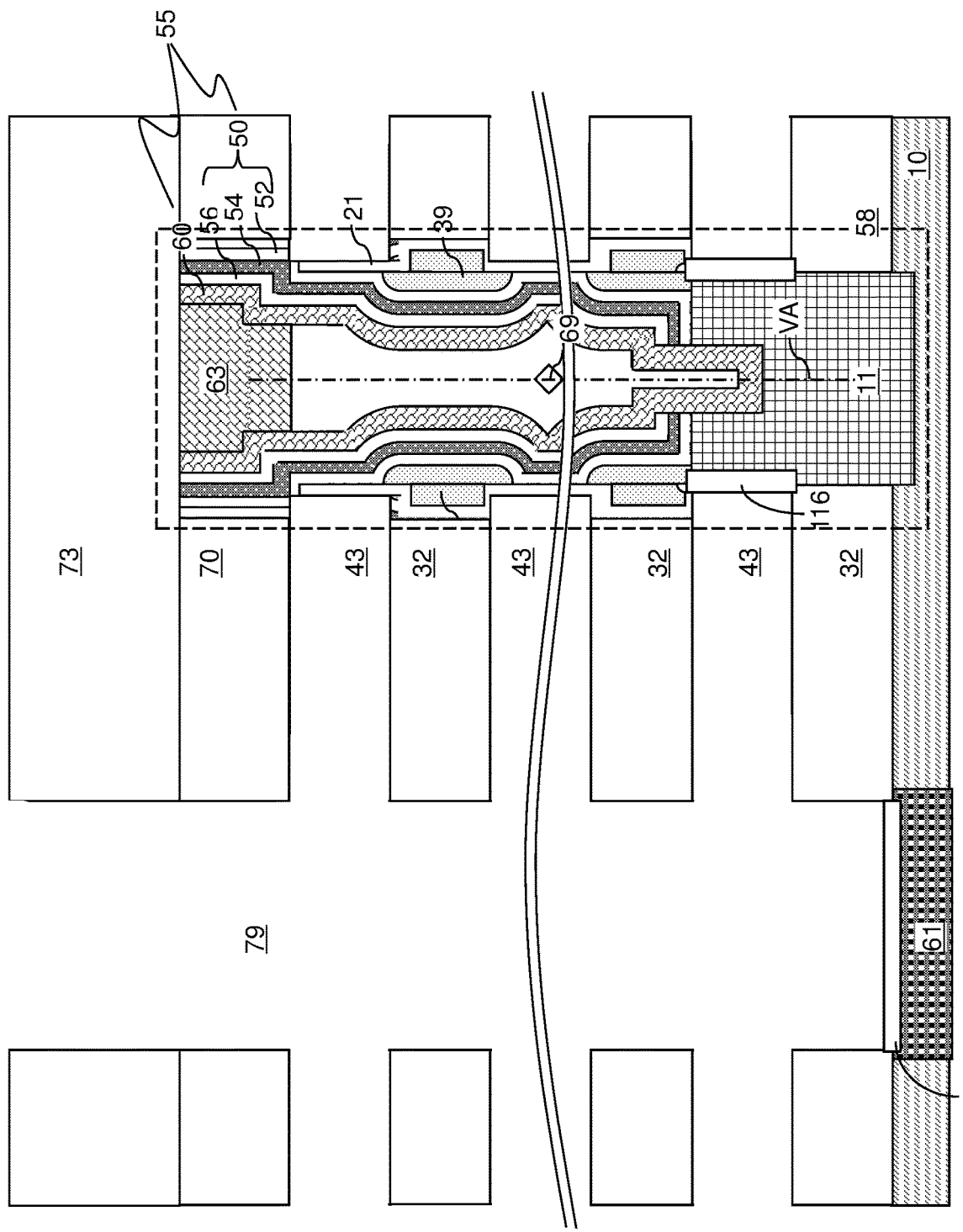
FIG. 21 is a vertical cross-sectional view of a region of the third exemplary structure after formation of backside recesses according to the third embodiment of the present disclosure.

Referring to FIG. 21, the processing steps of FIGS. 8A and 8B can be performed to form backside recesses 43 by removing the sacrificial material layers 42 selective to the insulating layers 32, the insulating cap layer 70, the contact-level dielectric layer 73, the source regions 61, and the silicon oxide liners 21. For example, if the sacrificial material layers 42 comprise silicon nitride, a wet etch process employing hot phosphoric acid can be performed to remove the sacrificial material layers 42. Surface segments of the silicon oxide liners 21 can be physically exposed to the backside recesses 43. An oxidation process can be performed to form tubular dielectric spacers 116 and planar dielectric portions 616.

Figure 22:
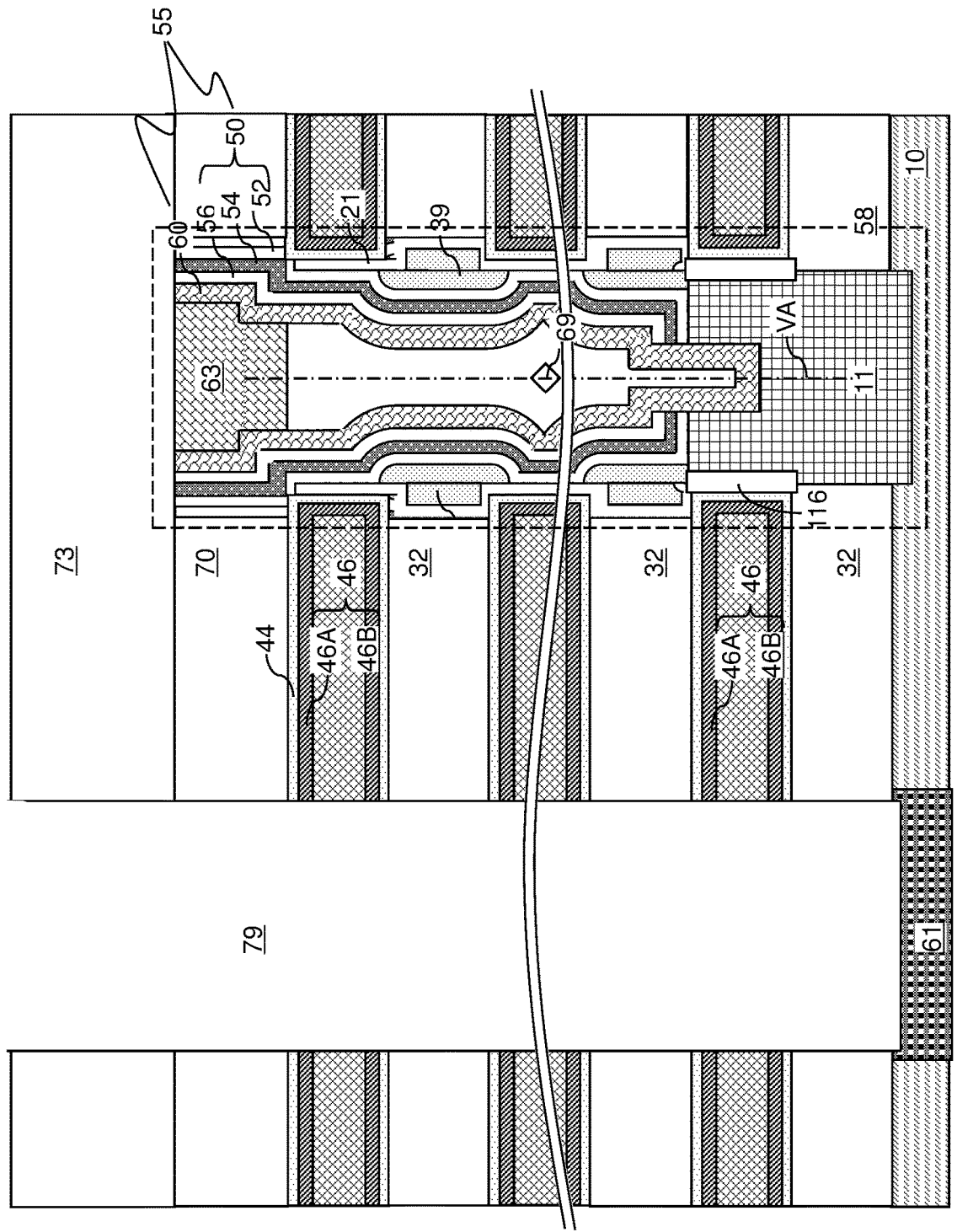
FIG. 22 is a vertical cross-sectional view of a region of the third exemplary structure after formation of electrically conductive layers according to the third embodiment of the present disclosure.

Referring to FIG. 22, the processing steps of FIGS. 10A and 10B can be performed. Optional backside blocking dielectric layers 44 and electrically conductive layers 46 can be formed in the backside recesses 43. The backside blocking dielectric layer 44 (if present) can be formed directly on the outer sidewalls of the silicon oxide liners 21 and directly on horizontal surfaces of the insulating layers 32. Since the sacrificial material layers 42 are not recessed from the memory opening 49 in this embodiment, the electrically conductive layers 46 (e.g., control gate electrodes) have a larger volume due to a longer lateral length and lower resistance. Furthermore, the relatively low dielectric constant of the silicon oxycarbide spacer material decreases neighboring word line interference and capacitive coupling between vertically adjacent word lines/control gate electrodes.

Figure 23:
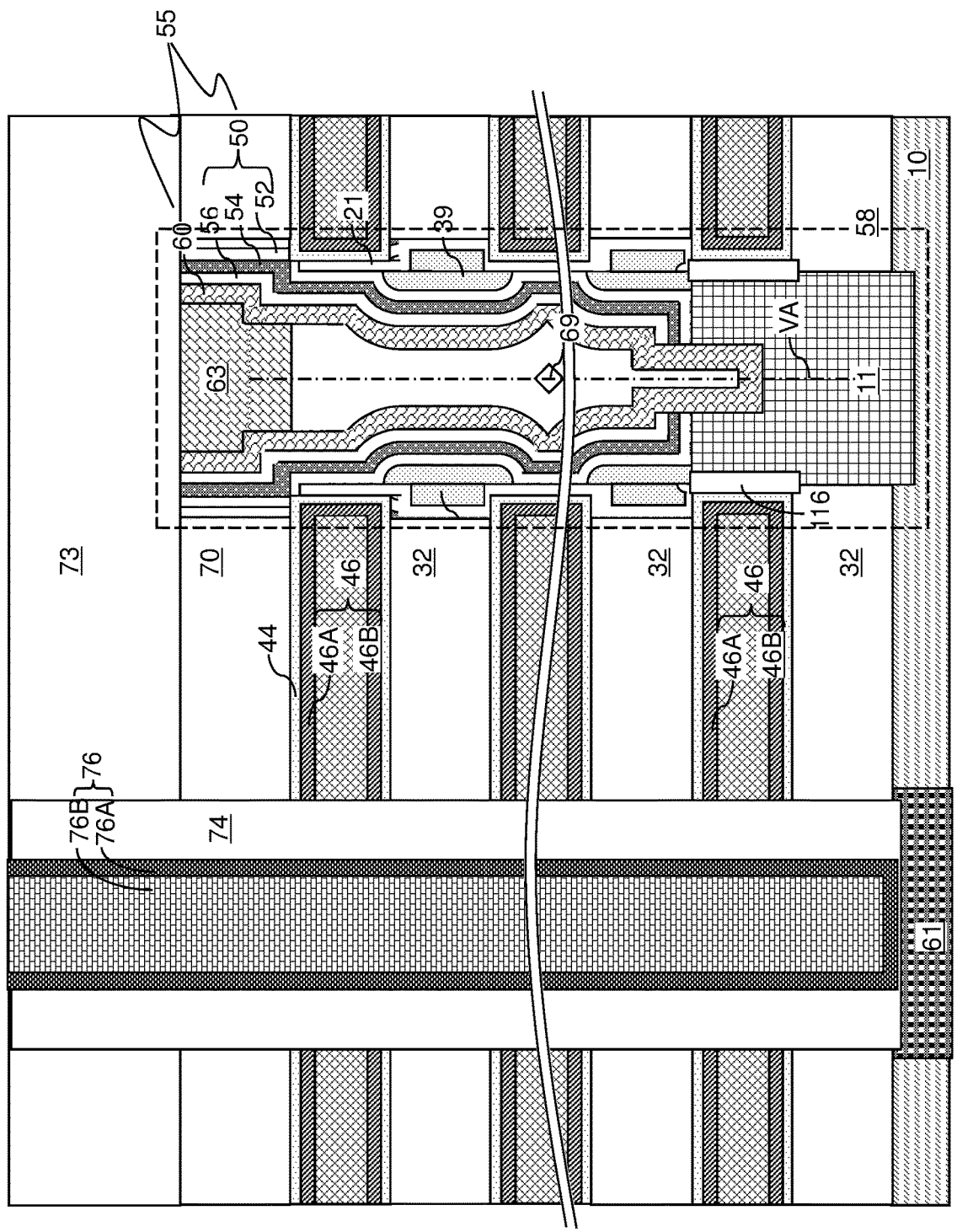
FIG. 23 is a vertical cross-sectional view of a region of the third exemplary structure after formation of backside contact via structures and additional contact via structures according to the third embodiment of the present disclosure.

Referring to FIG. 23, the processing steps of FIGS. 11, 12A, and 12B can be performed to form insulating spacers 74 and various contact via structures (76, 88, 86, 8P).

Referring collective to FIGS. 19A-23 and all figured related to the third exemplary structure, a memory device comprises: an alternating stack of insulating layers 32 and electrically conductive layers 46; a memory opening 49 vertically extending through the alternating stack (32, 46); and memory opening fill structures 58 located in the memory opening 49 and comprising a vertical semiconductor channel 60, a memory material layer 54 laterally surrounding the vertical semiconductor channel 60, a vertical stack of inner insulating spacers 39 located at levels of a plurality of insulating layers 32, and a vertical stack of outer insulating spacers 38 located on a respective one of the inner insulating spacers 39 and having a lesser vertical extent than the respective one of the inner insulating spacers 39.

In one embodiment, the memory opening fill structure 58 further comprises a silicon oxide liner 21 that vertically extends continuously in the memory opening 49 (e.g., through a plurality of electrically conductive layers 46 and a plurality of insulating layers 32 within the alternating stack (32, 46)) and laterally protruding outward from a vertical axis VA passing through a geometrical center of the memory opening fill structure 58 at the levels of the plurality of insulating layers 32 relative to portions of the silicon oxide liner 21 located at levels of the plurality of electrically conductive layers 46.

In one embodiment, the memory opening fill structure 58 further comprises a blocking dielectric layer 52 that vertically extends continuously through the memory opening 40 (e.g., through plurality of electrically conductive layers 46 and the plurality of insulating layers 32) and laterally protruding inward toward the vertical axis VA passing through the geometrical center of the memory opening fill structure 58 at the levels of the plurality of insulating layers 32 relative to portions of the blocking dielectric layer 52 located at the levels of the plurality of electrically conductive layers 46.

In one embodiment, the blocking dielectric layer 52 contacts the silicon oxide liner 21 at the levels of the plurality of electrically conductive layers 46, and is laterally spaced from the silicon oxide liner 21 at the levels of the plurality of insulating layers 32 by a combination of the vertical stack of outer insulating spacers 38 and the vertical stack of inner insulating spacers 39.

In one embodiment, the memory material layer 54 comprises an outer surface that comprises: first cylindrical segments 54F located at levels of a plurality of electrically conductive layers 46; second cylindrical segments MS located at the levels of the plurality of insulating layers 32, vertically interlaced with the first cylindrical segments, and laterally offset inward toward a vertical axis VA passing through a geometrical center of the memory opening fill structure 58 relative to the first cylindrical segments; and concave annular segments 54A connecting a respective vertically neighboring pair of the first cylindrical segments and the second cylindrical segments.

In one embodiment, the memory opening fill structure 58 further comprises a tunneling dielectric layer as the dielectric material liner 56; the memory material layer 54 comprises a charge storage layer; and the memory device comprises a vertical NAND string. In one embodiment, the memory device may comprise a two-dimensional array of vertical NAND strings that includes a three-dimensional array of memory elements (comprising portions of the memory material layers 54 located at levels of the electrically conductive layers 46).

Each of the exemplary structures of the present disclosure can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device. The substrate (9, 10) can comprise a silicon substrate. The vertical NAND memory device can comprise an array of three-dimensional NAND strings over the silicon substrate. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of three-dimensional NAND strings can comprise: a plurality of semiconductor channels (59, 11, 60); and a plurality of charge storage elements (comprising portions of the memory films 50, i.e., portions of the memory material layers 54). Each charge storage element can be located adjacent to a respective one of the plurality of semiconductor channels (59, 11, 60).

The contoured vertical cross-sectional profile of the memory material layers 54 of the embodiment present disclosure allows enhancement of the magnitude of the electrical field at the levels of the memory elements, i.e., at the portions of the memory material layers 54 located at the levels of the electrically conductive layers 46, through geometrical effects. In other words, the magnitude of the electrical field at the levels of the memory elements is increased though the contour in the vertical cross-sectional profile of the memory material layers 54. Furthermore, the configuration also reduces neighboring word line interference. Thus, a three-dimensional memory device employing the geometry of embodiments of the present disclosure can operate at a lower operational voltage than comparable three-dimensional memory devices, and thus, can reduce power consumption, increase the signal-to-noise ratio, and/or increase the reliability and/or operational lifetime of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;
wherein the memory opening fill structure further comprises a silicon oxide liner that vertically extends continuously in the memory opening through the alternating stack and laterally protruding outward from a vertical axis passing through a geometrical center of the memory opening fill structure at the levels of the plurality of insulating layers relative to portions of the silicon oxide liner located at levels of the plurality of electrically conductive layers;
wherein the memory opening fill structure further comprises a blocking dielectric layer that vertically extends continuously through the memory opening and laterally protruding inward toward the vertical axis passing through the geometrical center of the memory opening fill structure at the levels of the plurality of insulating layers relative to portions of the blocking dielectric layer located at the levels of the plurality of electrically conductive layers; and
wherein the blocking dielectric layer contacts the silicon oxide liner at the levels of the plurality of electrically conductive layers, and is laterally spaced from the silicon oxide liner at the levels of the plurality of insulating layers by a combination of the vertical stack of outer insulating spacers and the vertical stack of inner insulating spacers.

2. The memory device of claim 1, wherein:
the memory opening fill structure further comprises a tunneling dielectric layer;
the memory material layer comprises a charge storage layer; and
the memory device comprises a vertical NAND string.

3. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;
wherein the memory opening fill structure further comprises a silicon oxide liner that vertically extends continuously in the memory opening through the alternating stack and laterally protruding outward from a vertical axis passing through a geometrical center of the memory opening fill structure at the levels of the plurality of insulating layers relative to portions of the silicon oxide liner located at levels of the plurality of electrically conductive layers;
wherein each of the outer insulating spacers comprises:
an outer cylindrical sidewall that contacts a cylindrical segment of an inner surface of the silicon oxide liner;
an annular top surface that contacts an annular horizontal segment of the inner surface of the silicon oxide liner;
an annular bottom surface that contacts another annular horizontal segment of the inner surface of the silicon oxide liner; and
an inner cylindrical sidewall that contacts an outer sidewall of a respective one of the inner insulating spacers.

4. The memory device of claim 3, wherein:
the memory opening fill structure further comprises a tunneling dielectric layer;
the memory material layer comprises a charge storage layer; and
the memory device comprises a vertical NAND string.

5. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;
wherein the memory opening fill structure further comprises a silicon oxide liner that vertically extends continuously in the memory opening through the alternating stack and laterally protruding outward from a vertical axis passing through a geometrical center of the memory opening fill structure at the levels of the plurality of insulating layers relative to portions of the silicon oxide liner located at levels of the plurality of electrically conductive layers;
wherein each of the inner insulating spacers comprises an outer sidewall that contacts:
an inner sidewall of a respective one of the outer insulating spacers;
a first cylindrical segment of an inner surface of the silicon oxide liner that overlies the inner sidewall of the respective one of the outer insulating spacers; and a second cylindrical segment of the inner surface of the silicon oxide liner that underlies the inner sidewall of the respective one of the outer insulating spacers.

6. The memory device of claim 5, wherein:
the memory opening fill structure further comprises a tunneling dielectric layer;
the memory material layer comprises a charge storage layer; and
the memory device comprises a vertical NAND string.

7. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;
wherein each inner insulating spacer within the vertical stack of inner insulating spacers has a respective vertical cross-sectional shape that includes a straight outer sidewall and a contoured inner sidewall that comprises a straight inner sidewall segment and at least one convex inner sidewall segment connecting the straight outer sidewall and the straight inner sidewall segment.

8. The memory device of claim 7, wherein:
the memory opening fill structure further comprises a tunneling dielectric layer;
the memory material layer comprises a charge storage layer; and
the memory device comprises a vertical NAND string.

9. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;

wherein each inner insulating spacer within the vertical stack of inner insulating spacers other than a bottommost one of the outer insulating spacers comprises:
a cylindrical outer sidewall; and
a contoured inner sidewall that comprises a cylindrical inner sidewall segment, an upper annular convex segment adjoining a top periphery of the cylindrical outer sidewall and a top periphery of the cylindrical inner sidewall segment, and a lower annular convex segment adjoining a bottom periphery of the cylindrical outer sidewall and a bottom periphery of the cylindrical inner sidewall segment.

10. The memory device of claim 9, wherein:
the memory opening fill structure further comprises a tunneling dielectric layer;
the memory material layer comprises a charge storage layer; and
the memory device comprises a vertical NAND string.

11. A memory device, comprising:
an alternating stack of insulating layers and electrically conductive layers;
a memory opening vertically extending through the alternating stack; and
a memory opening fill structure located in the memory opening and comprising a vertical semiconductor channel, a memory material layer laterally surrounding a vertical semiconductor channel, a vertical stack of inner insulating spacers located at levels of a plurality of insulating layers, and a vertical stack of outer insulating spacers located on a respective one of the inner insulating spacers and each having a lesser vertical extent than the respective one of the inner insulating spacers;
wherein the memory material layer comprises an outer surface that comprises:
first cylindrical segments located at levels of a plurality of electrically conductive layers;
second cylindrical segments located at the levels of the plurality of insulating layers, vertically interlaced with the first cylindrical segments, and laterally offset inward toward a vertical axis passing through a geometrical center of the memory opening fill structure relative to the first cylindrical segments; and
concave annular segments connecting a respective vertically neighboring pair among the first cylindrical segments and the second cylindrical segments.

12. The memory device of claim 11, wherein:
the memory opening fill structure further comprises a tunneling dielectric layer;
the memory material layer comprises a charge storage layer; and
the memory device comprises a vertical NAND string.

* * * * *